US010056609B2

(12) United States Patent
Holme et al.

(10) Patent No.: US 10,056,609 B2
(45) Date of Patent: Aug. 21, 2018

(54) SOLID STATE ENERGY STORAGE DEVICES

(75) Inventors: Timothy P. Holme, Mountain View, CA (US); Rainer Fasching, Mill Valley, CA (US); Joseph Han, Redwood City, CA (US); Weston Arthur Hermann, Palo Alto, CA (US); Friedrich B. Prinz, Woodside, CA (US); Phil Reilly, Portola Valley, CA (US); Jagdeep Singh, Los Gatos, CA (US)

(73) Assignee: QuantumScape Corporation, San Jose, CA (US)

( * ) Notice: Subject to any disclaimer, the term of this patent is extended or adjusted under 35 U.S.C. 154(b) by 577 days.

(21) Appl. No.: 14/238,472

(22) PCT Filed: Jul. 10, 2012

(86) PCT No.: PCT/US2012/046105
§ 371 (c)(1),
(2), (4) Date: May 29, 2014

(87) PCT Pub. No.: WO2013/009772
PCT Pub. Date: Jan. 17, 2013

(65) Prior Publication Data
US 2014/0363740 A1 Dec. 11, 2014

Related U.S. Application Data

(60) Provisional application No. 61/506,592, filed on Jul. 11, 2011.

(51) Int. Cl.
*H01M 4/48* (2010.01)
*H01G 7/06* (2006.01)
(Continued)

(52) U.S. Cl.
CPC ............. *H01M 4/48* (2013.01); *H01G 4/10* (2013.01); *H01G 7/06* (2013.01); *H01L 28/40* (2013.01);
(Continued)

(58) Field of Classification Search
CPC ....................................................... H01M 4/02
See application file for complete search history.

(56) References Cited

U.S. PATENT DOCUMENTS 4,945,449 A 7/1990 Cansell et al.
5,471,364 A 11/1995 Summerfelt et al.
(Continued)

FOREIGN PATENT DOCUMENTS

CA 849697 A 8/1970
WO 2010/048405 A1 4/2010
(Continued)

OTHER PUBLICATIONS

International Search Report and Written Opinion for PCT/2012/046105.
(Continued)

*Primary Examiner* — Barbara L Gilliam
*Assistant Examiner* — Nathanael T Zemui
(74) *Attorney, Agent, or Firm* — Squire Patton Boggs (US) LLP

(57) ABSTRACT

Solid state energy storage systems and devices are provided. A solid state energy storage devices can include an active layer disposed between conductive electrodes, the active layer having one or more quantum confinement species (QCS), such as quantum dots, quantum particles, quantum wells, nanoparticles, nanostructures, nanowires and nanofibers. The solid state energy storage device can have a charge rate of at least about 500 V/s and an energy storage density of at least about 150 Whr/kg.

11 Claims, 32 Drawing Sheets

(51) Int. Cl.
  *H01G 4/10* (2006.01)
  *H01M 4/583* (2010.01)
  *H01L 49/02* (2006.01)

(52) U.S. Cl.
  CPC ........ *H01M 4/583* (2013.01); *H01M 2220/20* (2013.01); *Y02T 10/7022* (2013.01)

(56) References Cited

U.S. PATENT DOCUMENTS

| | | |
|---|---|---|
| 7,091,548 B2 | 8/2006 | Jeong et al. |
| 8,377,586 B2 | 2/2013 | Yazami |
| 2002/0080551 A1 | 6/2002 | Kitagawa et al. |
| 2003/0118897 A1 | 6/2003 | Mino et al. |
| 2005/0161717 A1 | 7/2005 | Nakamura et al. |
| 2007/0222534 A1 | 9/2007 | Hannah |
| 2008/0160712 A1 | 7/2008 | Park |
| 2008/0218940 A1 | 9/2008 | Singh et al. |
| 2008/0277761 A1* | 11/2008 | Mahalingam ........ H01G 4/1272 257/532 |
| 2009/0022445 A1 | 1/2009 | Hochberg et al. |
| 2009/0130457 A1 | 5/2009 | Kim et al. |
| 2010/0027192 A1 | 2/2010 | Perry et al. |
| 2010/0183919 A1* | 7/2010 | Holme .................. B82Y 10/00 429/209 |
| 2010/0279106 A1* | 11/2010 | Yadav .................... B01J 12/005 428/332 |
| 2011/0110015 A1 | 5/2011 | Zhang et al. |
| 2013/0122683 A1 | 5/2013 | Malhotra et al. |
| 2013/0143087 A1 | 6/2013 | Liu et al. |
| 2013/0194716 A1 | 8/2013 | Holme et al. |
| 2014/0363740 A1 | 12/2014 | Holme et al. |

FOREIGN PATENT DOCUMENTS

| | | |
|---|---|---|
| WO | WO2010/048405 | 4/2010 |
| WO | WO2013/009772 | 1/2013 |

OTHER PUBLICATIONS

Office Action dated Apr. 21, 2014 in U.S. Appl. No. 13/749,706, 23 pages.
European Search Report dated May 14, 2013 in EP 13153146, 8 pages.
Chinese Patent Application No. 201310034515.9, Office Action dated Mar. 14, 2013, 3 pages.
Office Action dated Oct. 9, 2014 in U.S. Appl. No. 13/749,706, 20 pages.

* cited by examiner

Surface vs Bulk States

1:1:1

$\frac{Na}{\varepsilon} = 4.08$

1:1:0.5

$\frac{Na}{\varepsilon} = 1.0$

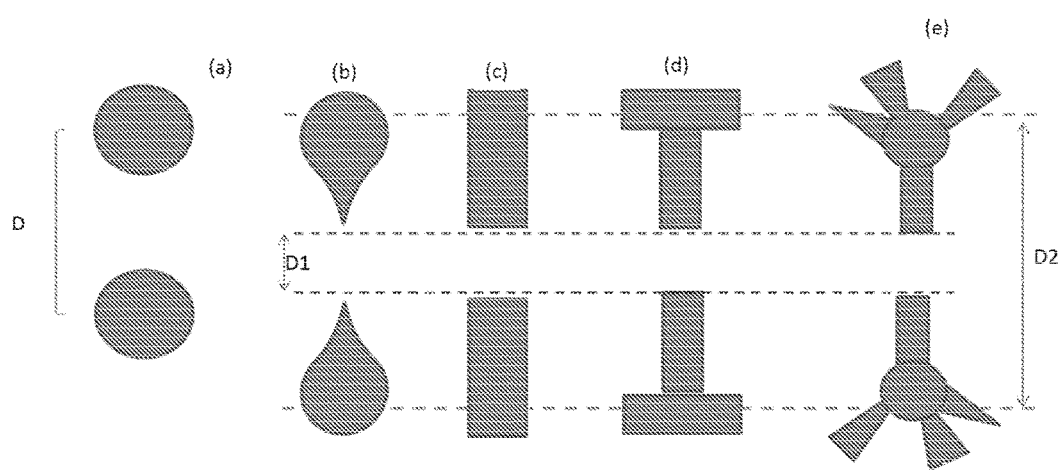
FIG. 23(a-e)

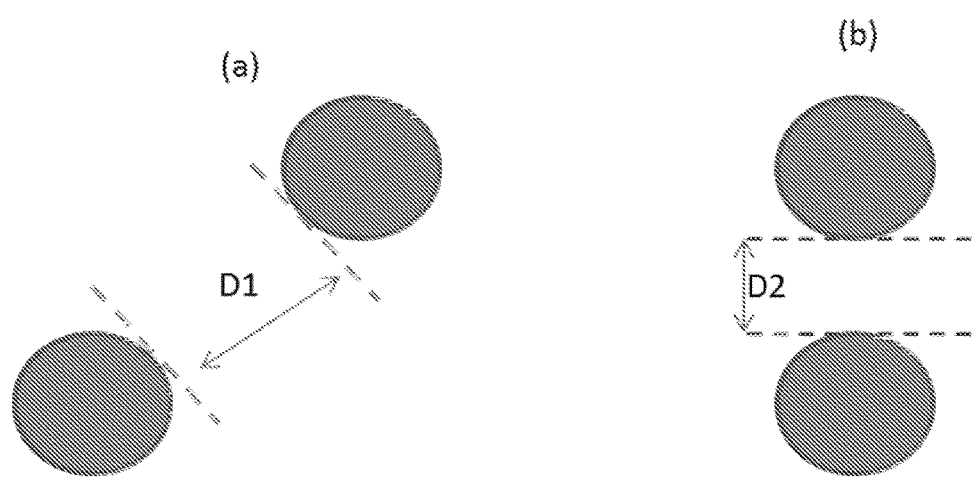
FIG. 24(a-b)

SOLID STATE ENERGY STORAGE DEVICES

CROSS-REFERENCE

This application is a US National Stage of International Application No. PCT/US2012/046105, filed Jul. 10, 2012, designating the United States, and claiming the benefit of U.S. Provisional Application No. 61/506,592, filed Jul. 11, 2011, which application is entirely incorporated herein by reference.

BACKGROUND

Energy storage is a crucial component of a large number and variety of electronic devices, particularly mobile devices and vehicles, such as electric and hybrid gas-electric vehicles (also "hybrid vehicles" herein). Energy storage devices can be based on a variety of physical effects. For example, electric fields can be employed to store energy in capacitors, and chemical reactions (involving ion motion) can be employed to store energy in batteries. However, energy storage in a capacitor can be limited by the geometry of current devices (e.g., 2-D capacitor plates having limited surface areas) and either a low permittivity or low dielectric breakdown voltage, and batteries can have a slow response time due to the relatively slow ion motion inherent in electrochemical reactions.

There are limitations associated with current batteries. For example, current batteries can have low storage densities due to the relatively low voltage (<5V) resulting from the electrochemical reactions of the ions. In addition, the low mobility of ions in current batteries can lead to slow charge and discharge performance. Furthermore, the reliance of existing batteries on ionic transport causes high degradation rates of the batteries. The performance of battery powered devices, such as hybrid or electric vehicles, can be limited by the low energy stored per weight of batteries used in such vehicles.

SUMMARY

An aspect of the invention provides a solid state energy storage device comprising (a) a first conductive electrode and second conductive electrode; and (b) an active layer between the first and second conductive electrodes, the active layer having a permittivity that varies non-linearly with voltage.

In some embodiments, the active layer comprises one or more quantum confinement species (QCS). The one or more QCS can be embedded in the active layer. In some cases, the quantum confinement species (QCS) comprise quantum dots, quantum particles, quantum wells, quantum wires, nanocrystals, nanoparticles, nanostructures, nanowires, nanofibers, bulk material, or any combination thereof.

In some embodiments, the quantum confinement species (QCS) are embedded in a dielectric matrix having high breakdown strength. In some embodiments, the matrix comprises titanium oxide, lithium oxide, lithium fluoride, silicon oxide, silicon nitride, silicon oxynitride, magnesium oxide, praseodymium oxide, aluminum oxide, diamond, hafnium oxide, or any combination thereof.

In some embodiments, the active layer has a first permittivity ($\varepsilon_1$) below a critical voltage ($V_c$) and a second permittivity ($\varepsilon_2$) above the critical voltage. In some cases, the second permittivity ($\varepsilon_2$) is greater than the first permittivity ($\varepsilon_1$).

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix, wherein the breakdown field ($E_{max}$) of the device is at least 0.9 V/nm.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix. In some cases high electrical fields only occur in small regions of the device. The active layer may comprise a material having a high breakdown field ($E_{max}$) in one or more high-field regions of the device, the one or more high-field regions having a field greater than or equal to about 0.5 volts (V)/nanometers (nm).

In some embodiments, the device has a field strength greater than about 1 V/nm only in areas less than about 1 $\mu m^2$. In some embodiments, the device has a field strength greater than about 1 V/nm only in volumes less than about 1 $\mu m^3$.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix, wherein the active layer comprises a material having a high breakdown field (Emax) in one or more high-field regions of the device. The one or more high-field regions have a field greater than or equal to about 0.5 volts (V)/nanometers (nm).

In some embodiments, the high-field regions of the device have field strength greater than about 1 V/nm. In some embodiments, the high-field regions of the device comprise voids. In some embodiments, the high-field regions of the device comprise zeolites, nanotubes, buckyballs, or any combination thereof.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix, wherein the QCS are substantially evenly dispersed in the matrix.

In some embodiments, the QCS and the matrix comprise a substantially crystalline lattice. In some embodiments, the QCS are formed of a doped semiconductor material and the matrix is formed of an undoped semiconductor material.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix, wherein the matrix comprises one or more materials having a permittivity gradient in the region surrounding the QCS.

In some embodiments, the permittivity gradient reduces the amount of Fowler-Nordheim tunneling in the device. In some embodiments, the device further comprises a capping layer between the electrodes and the active layer. In some embodiments, the capping layer has a higher permittivity than the matrix. In some embodiments, the capping layer bandgap and permittivity are chosen to provide a higher or wider barrier to electron tunneling than the matrix.

In some embodiments, the device further comprises an interfacial layer between the QCS and the matrix that does not result in Fermi level pinning at the interfacial layer. In some embodiments, the device further comprises an interfacial layer between the QCS and the matrix that results in Fermi level pinning to increase the barrier height between the QCS and the matrix. In some embodiments, the interface between the QCS and the matrix has been treated to unpin the QCS Fermi level relative to the matrix energy gap. In some embodiments, the interface between the QCS and the matrix has been treated to pin the QCS Fermi level relative to the matrix energy gap so as to increase the effective barrier height between the QCS and the matrix.

In some embodiments, at least one interfacial layer between at least one QCS and at least one matrix layer comprises a dipole that increases the effective barrier height between the QCS and matrix layer. In some embodiments, the capping layer comprises a plurality of material layers having a permittivity that decreases as the distance from the QCS increases.

Another aspect of the invention provides a solid state energy storage device, comprising: (a) a first conductive electrode and second conductive electrode; and (b) a plurality of alternating dielectric layers and conductive layers between the electrodes, wherein the breakdown field ($E_{max}$) of the device is at least 0.9 volts (V)/nanometer (nm). In some embodiments, at least one of the dielectric layers comprises QCS.

Another aspect of the invention provides a solid state energy storage device comprising: (a) a first conductive electrode and a second conductive electrode; and (b) an active layer between the first and second conductive electrodes, the active layer having one or more quantum confinement species (QCS) arranged to at least partially cancel an applied electric field between the electrodes. In some cases, the one or more QCS are arranged to completely cancel an applied electric field between the electrodes.

In some embodiments, the QCS are arranged such that they are electrically coupled together in a positive feedback. In some embodiments, the QCS are arranged such that electrical coupling in the direction of the applied field is much stronger than electrical coupling in the directions perpendicular to the applied field.

Another aspect of the invention provides a solid state energy storage device, comprising: (a) a first conductive electrode and second conductive electrode; and (b) an active layer between the first and second conductive electrodes, the active layer having one or more quantum confinement species (QCS) shaped to have a higher polarizability when compared to a spherical QCS. In some cases, an individual QCS of the one or more QCS has a shape and/or dimension that is configured to effect a polarizability of the individual QCS that is higher than the polarizability of a spherical QCS In some embodiments, the QCS are elongated in the direction of the applied field. In some embodiments, the QCS have the shape of a tear drop, nanowire, rectangle, "T", tetrapod, or any combination thereof.

Another aspect of the invention provides a solid state energy storage device, comprising: (a) a first conductive electrode and second conductive electrode; and (b) an active layer between the first and second conductive electrodes, the active layer having one or more quantum confinement species (QCS) arranged in the active layer to increase charge separation without suppressing tunneling.

In some embodiments, at least three QCS are arranged in a cascade. In some embodiments, the QCS are off-set relative to each other. In some embodiments, a conductive layer is disposed between at least two of the QCS.

Another aspect of the invention provides a solid state energy storage device, comprising: (a) a first conductive electrode and second conductive electrode; and (b) an active layer between the first and second conductive electrodes, the active layer having one or more quantum confinement species (QCS) embedded in a matrix. In some cases, the matrix has a low permittivity in low electric fields and high permittivity in high electric fields. In some situations, the matrix has a first permittivity under an applied electric field below a critical electric field ($V_c$) and a second permittivity under an applied electric field above $V_c$, wherein the first permittivity is lower than the second permittivity.

In some embodiments, the matrix material is antiferroelectric or capable of being antiferroelectric. In some embodiments, the matrix material comprises $PbZrO_3$.

Another aspect of the invention provides a solid state energy storage device, comprising (a) a first conductive electrode and second conductive electrode; and (b) an active layer between the first and second conductive electrodes, the active layer having one or more quantum confinement species (QCS) embedded in a matrix. The matrix may further include inclusions which have a permanent dipole moment. In some cases, the active layer comprises a matrix having one or more quantum confinement species (QCS) and one or more inclusions therein, wherein the one or more inclusions each has a permanent dipole moment.

In some embodiments, the inclusions comprise ferroelectric material. In some embodiments, the QCS comprise barium titanate, lead titanate, bismuth titanate, strontium bismuth tantalate, barium strontium titanate, zirconium titanate, lead zirconium titanate, or combinations thereof.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix. The matrix may comprise a material having a high electron effective mass. In some cases, the matrix comprises a material having an electron effective mass greater than about 0.01 times the free electron mass.

In some embodiments, the electron effective mass is greater than 0.1 times the free electron mass. In some embodiments, the active layer comprises hafnia.

Another aspect of the invention provides a method for forming a solid state energy storage device, comprising providing a first conductive electrode and second conductive electrode, and an active layer between the first and second conductive electrodes, the active layer having one or more quantum confinement species (QCS) embedded in a matrix, wherein the matrix is annealed in an oxidizing environment.

Another aspect of the invention provides a solid state energy storage device, comprising: (a) a first conductive electrode and second conductive electrode; and (b) an active layer between the first and second conductive electrodes, the active layer having one or more quantum confinement species (QCS) in a matrix, wherein the active layer comprises an interfacial dipole.

Another aspect of the invention provides a solid state energy storage device, comprising: (a) a first electrode and a second electrode; (b) an active layer between the first and second electrodes, the active layer having one or more quantum confinement species (QCS); (c) a tunnel barrier layer between the active layer and the first electrode or the second electrode; and (d) one or more intermediate layers between the tunnel barrier layer and the first electrode or the second electrode, wherein the permittivity of the tunnel barrier layer is lower than the permittivity of an individual intermediate layer of the one or more intermediate layers, and wherein the breakdown voltage of the tunnel barrier layer is higher than the breakdown voltage of the individual intermediate layer.

In some embodiments, the device comprises at least two repeat units, where each repeat unit comprises at least one active layer, at least one tunnel barrier layer and at least one intermediate layer.

Another aspect of the invention provides a solid state energy storage device, comprising a first electrode and a second electrode and an active layer between the first and second electrodes, the active layer having one or more quantum confinement species (QCS) therein. The device further includes a plurality of intermediate layers between the active layer and the first electrode or second electrode. Leading from the first or second electrode to the active layer, the intermediate layers are ordered in order of increasing permittivity and decreasing breakdown voltage.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings and figures (also "FIG." and "FIGS." herein), of which:

FIG. 23(a-e) shows several pairs of QDs separated by a distance D1 where (b-e) increase charge separation to a distance D2 while not overly suppressing tunneling.

DETAILED DESCRIPTION

Figure 1:
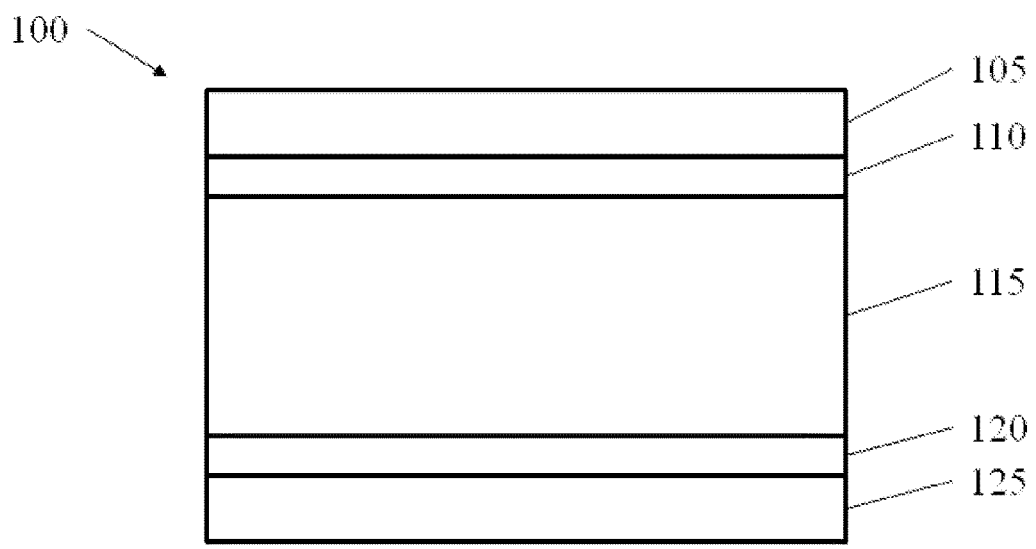
FIG. 1 schematically illustrates an energy storage device comprising an active layer having quantum confinement species (QCS), in accordance with an embodiment of the invention.

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention.

The term "vehicle," as used herein, generally refers to any electric device configured to move, or cause an object to be moved, from one point to another. In an embodiment, a vehicle can include an electric device configured to transport objects from one point to another. In another embodiment, a vehicle can include a car, bus, motorcycle, motorized bicycle, scooter, boat, plane or robot. In another embodiment, a vehicle can include an electric vehicle. In another embodiment, a vehicle can include a hybrid gas-electric vehicle (also "hybrid vehicle" herein).

The term "active layer," as used herein, generally refers to any material configured to retain charge (electrons or electron holes), or having materials or species configured to retain or redistribute charge among the species. An active layer can include one or more quantum confinement species (QCS), such as quantum dots (QD), quantum particles, quantum wells, quantum wires, nanocrystals, nanoparticles, nanostructures, nanowires, nanofibers, or bulk material. United States Patent Publication No. 2010/0183919, which is entirely incorporated herein by reference, describes exemplary QCS. An active layer can be formed of a material that permits the flow of charge under predetermined voltage conditions. An active layer can include a semiconducting material, such as a p-type or n-type semiconducting material, or a metallic material. P-type semiconducting materials can include Group IV (e.g., Si, Ge) or Group III-V (e.g., GaAs) semiconductors that are chemically doped ("doped") p-type, such as, e.g., with the aid of boron (B) or aluminum (Al). N-type semiconducting materials can include Group IV (e.g., Si, Ge) or Group III-V (e.g., GaAs) semiconductors that are chemically doped ("doped") n-type, such as, e.g., with the aid of phosphorous (P) or arsenic (As). Semiconducting materials may also include low bandgap semiconductors having doped or undoped InAs, InSb, PbSe, PbS, or PbTe, low bandgap or conducting oxides, such as $YBa_2Cu_3O_7$, and $RuO_2$, or larger bandgap semiconducting oxides, such as $TiO_2$, iron oxides, and ZnO.

The disclosure provides energy storage devices having rapid charge and discharge characteristics. In some embodiments, energy storage devices are solid state energy storage devices. An energy storage device of the disclosure may have an energy storage capacity up to and exceeding that of current electrochemical batteries (e.g., lithium ion battery, nickel cadmium battery), and having a charge rate and discharge rate up to and exceeding that of current energy storage devices. As compared to current batteries, such energy storage devices can have various advantages, such as higher energy densities, higher power densities, lifetimes, safety and efficiency.

In some embodiments, an energy storage device comprises an active layer that comprises one or more quantum confinement species (QCS). The quantum confinement species (QCS) are embedded in a material matrix having high breakdown strength. The material matrix may be a dielectric matrix. Exemplary matrix materials include, without limitation, titanium oxide, lithium oxide, lithium fluoride, silicon oxide, silicon nitride, silicon oxynitride, magnesium oxide, praseodymium oxide, aluminum oxide, diamond, hafnium oxide, or variants or combination thereof.

The QCS may comprise quantum dots (QD), quantum particles, quantum wells, quantum wires, nanocrystals, nanoparticles, nanostructures, nanowires, nanofibers, bulk material, or any combination thereof. In some instances, the quantum confinement species (QCS) are non-metallic.

The QCS have any suitable diameter. Use of the term diameter does not necessarily imply that the QCS are spherical. In some instances, the QCS are non-spherical. In some embodiments, an individual QCS has a diameter of about 1, about 2, about 3, about 4, about 5, about 6, about 7, about 8, about 10, about 20, about 30, about 40, about 50, about 60, about 80, or about 100 nanometers. In some embodiments, the QCS have a diameter of at least about 1, at least about 2, at least about 3, at least about 4, at least about 5, at least about 6, at least about 7, at least about 8, at least about 10, at least about 20, at least about 30, at least about 40, at least about 50, at least about 60, at least about 80, or at least about 100 nanometers. In some embodiments, the QCS have a diameter of at most about 1, at most about 2, at most about 3, at most about 4, at most about 5, at most about 6, at most about 7, at most about 8, at most about 10, at most about 20, at most about 30, at most about 40, at most about 50, at most about 60, at most about 80, or at most about 100 nanometers.

In some embodiments, the application of an electric field across an active layer can result in the formation of electron-hole pairs. The electron-hole pairs can be Bose-Einstein condensates having weakly interacting bosons or excitons. In an embodiment, the electron holes pairs can be in the QCS or at an interface of the QCS in the active layer.

In an embodiment, a battery is provided for use with a transportation vehicle, such as a car, bus, motorcycle, motorized bicycle, scooter, boat, plane, robot, or charging station. In an embodiment, a battery is provided for use with an electric vehicle. In another embodiment, a battery is provided for use with a hybrid-electric vehicle. In another embodiment, a battery is provided for use with a vehicle employing a fuel cell. In another embodiment, a battery is provided for use with an aircraft. In another embodiment, a battery is provided for use with a boat. In an embodiment, the battery is provided for use in electric grid applications such as high frequency regulation, peak load shifting, and storage of electricity generated by renewable energy devices such as wind turbines, solar thermal generators, or photovoltaics. In an embodiment, a battery is provided for use with portable electronic devices such as laptops, notebooks, tablets, music players, DVD players, mobile phones, etc.

Solid State Energy Storage Systems and Devices

In one aspect of the invention, a solid state energy storage device comprises an active layer disposed in-between a first conductive electrode and a second conductive electrode. The active layer is configured to redistribute charge (electrons or electron holes) upon the application of electric potential across the first electrode and second electrode. In an embodiment, the solid state energy storage device further includes a barrier layer between the active layer and the first or second conductive electrode. In another embodiment, the solid state energy storage device further includes a barrier layer between the active layer and each of the first and second conductive electrodes.

In an embodiment, the barrier layer is for blocking the flow of charge. In another embodiment, the barrier layer is for blocking the flow of charge from a conductive electrode and to and from the active layer. In another embodiment, the barrier layer is for impeding the flow of charge. In another embodiment, the barrier layer is for impeding the flow of charge from a conductive electrode and to and from the active layer.

In an embodiment, the barrier layer partially blocks the flow of charge to and from a conductive electrode. In another embodiment, the barrier layer blocks the flow of charge to and from the active layer. In another embodiment, the barrier is disposed between the active layer and a conductive electrode, and the barrier layer blocks the flow of charge between the active layer and the conductive electrode. In another embodiment, a barrier is disposed between the active layer and each of the first and second conductive electrodes, and the barrier layers block the flow of charge between the active layer and the first and second conductive electrodes. In another embodiment, the barrier layer impedes the flow of charge to and from the active layer. In another embodiment, the barrier is disposed between the active layer and a conductive electrode, and the barrier layer impedes the flow of charge between the active layer and the conductive electrode. In another embodiment, a barrier is disposed between the active layer and each of the first and second conductive electrodes, and the barrier layers impede the flow of charge between the active layer and the first and second conductive electrodes.

In an embodiment, a solid state energy storage device comprises a first conductive electrode and second conductive electrode and an active layer between the first and second conductive electrodes. The active layer can include one or more quantum confinement species (QCS). The active layer can be formed of a material that permits the flow of charge through the active layer under predetermined voltage conditions. In an embodiment, the active layer can be formed of a semiconducting or conducting material.

In an embodiment, a solid state energy device comprises one or more quantum confinement structures (QCS) embedded in an active layer or disposed on the surface of the active layer and enclosed by conductive electrodes, such as two or more metal electrodes. In an embodiment, when the electrodes are charged, at least some of the charge can be transferred to the QCS. Further, the electrode charge induces polarization in the active layer and the QCS, including charge transfer between at least two QCS.

In some embodiments, a solid state energy storage device comprises a material layer (or active layer) having quantum confinement species (QCS), the material layer disposed between conductive electrodes. In an embodiment, the solid state energy storage device further comprises a barrier layer disposed between the active layer and a conductive electrode. In an embodiment, the barrier layer can be formed of a low permittivity ($\varepsilon$) material having a high breakdown voltage ($E_{bd}$) and high electrical resistivity. In an embodiment, the active material layer can be formed of a high effective permittivity material having low $E_{bd}$.

In some embodiments, one or both electrodes may be nanostructured to increase the surface area and therefore the energy and power density. In an embodiment, one or both electrodes can include nanostructures disposed on one or more surfaces of the one or more electrodes. In another embodiment, one or both electrodes can include grooves or ridges. In another embodiment, one or both electrodes can be corrugated.

In an embodiment, the barrier material layer can be formed of a material having a permittivity between about 1 and 1000, or between about 1.5 and 500, or between about 2 and 30. In another embodiment, the barrier layer can have a bandgap (or "band gap") of at least about 3 electron volt ("eV"), 4 eV, or 5 eV, or 6 eV, or 7 eV. In another embodiment, the barrier layer can have a resistivity greater than about $1 \times 10^{11}$ $\Omega$cm, or greater than about $5 \times 10^{12}$ $\Omega$cm, or greater than about $1 \times 10^{14}$ $\Omega$cm. In another embodiment, the barrier layer can have a breakdown voltage between about 0.1 Volts ("V")/nanometers ("nm") and 4 V/nm, or between about 0.2V/nm and 2.0V/nm.

In some embodiments, an energy storage device comprises an active layer having one or more QCS. In an embodiment, the active layer can have an effective permittivity between about 10 and $10^6$, or between about 50 and $10^5$, or between about 100 and $10^4$. In another embodiment, the active layer can have an intrinsic bandgap between about 0 eV and 5 eV. In another embodiment, the active layer can have an intrinsic breakdown voltage between about $1 \times 10^{-6}$V/nm and 10 V/nm, or between about $1 \times 10^{-5}$V/nm and 5 V/nm, or between about $1 \times 10^{-4}$V/nm and 2 V/nm. In an embodiment, the one or more QCS can have an electron affinity greater than that of the material comprising the active layer.

In an embodiment, an energy storage device is provided comprising an active layer having one or more QCS, the active layer having an effective dielectric permittivity ($\varepsilon$) of at least about 100, or 200, or 300, or 400, or 500, or 600, or 700, or 800, or 900, or 1000, or 2000, or 3000, or 4000, or 5000, or 6000, or 7000, or 8000, or 9000, or 10,000, or 15,000, or 20,000. In another embodiment, the active layer can have a conductivity between about $10^{-7}$ Siemens ("S")/cm and 1000 S/cm. In another embodiment, the active layer can have a bandgap of at least about 0.25 eV, or 1 eV, or 1.5 eV, or 2 eV, or 2.5 eV, or 3 eV. In another embodiment, the active layer can have a bandgap of about 1 eV, or 1.1 eV, or 1.2 eV, or 1.3 eV, or 1.4 eV, or 1.5 eV, or 1.6 eV, or 1.7 eV, or 1.8 eV, or 1.9 eV, or 2 eV, or 2.1 eV, or 2.2 eV, or 2.3 eV, or 2.4 eV, or 2.5 eV, or 2.6 eV, or 2.7 eV, or 2.8 eV, or 2.9 eV, or 3 eV, or 3.1 eV, or 3.2 eV, or 3.3 eV, or 3.4 eV, or 3.5 eV, or 3.6 eV, or 3.7 eV, or 3.8 eV, or 3.9 eV, or 4 eV, or 4.1 eV, or 4.2 eV, or 4.3 eV, or 4.4 eV, or 4.5 eV, or 4.6 eV, or 4.7 eV, or 4.8 eV, or 4.9 eV, or 5 eV. In another embodiment, the active layer can have a bandgap of at least about 1 eV, or 1.1 eV, or 1.2 eV, or 1.3 eV, or 1.4 eV, or 1.5 eV, or 1.6 eV, or 1.7 eV, or 1.8 eV, or 1.9 eV, or 2 eV, or 2.1 eV, or 2.2 eV, or 2.3 eV, or 2.4 eV, or 2.5 eV, or 2.6 eV, or 2.7 eV, or 2.8 eV, or 2.9 eV, or 3 eV, or 3.1 eV, or 3.2 eV, or 3.3 eV, or 3.4 eV, or 3.5 eV, or 3.6 eV, or 3.7 eV, or 3.8 eV, or 3.9 eV, or 4 eV, or 4.1 eV, or 4.2 eV, or 4.3 eV, or 4.4 eV, or 4.5 eV, or 4.6 eV, or 4.7 eV, or 4.8 eV, or 4.9 eV, or 5 eV. In another embodiment, the active layer can have a bandgap less than about 1 eV, or less than about 1.5 eV, or less than about 2 eV, or less than about 2.5 eV, or less than about 3 eV, or less than about 3.5 eV, or less than about 4 eV, or less than about 4.5 eV, or less than about 5 eV.

In some embodiments, a solid state energy storage device comprises an active layer having quantum confinement species (QCS). In an embodiment, the active layer has a QCS areal density of at least about $10^{-8}$ QCS/nm$^2$, or $10^{-7}$ QCS/nm$^2$, or $10^{-6}$ QCS/nm$^2$, or $10^{-5}$ QCS/nm$^2$, or $10^{-4}$ QCS/nm$^2$ or $10^{-2}$ QCS/nm$^2$.

In an embodiment, an energy storage device is provided having a high power density, energy density, and extended lifetime (as compared to current energy storage devices). In another embodiment, a non-electrochemical energy storage device is provided that has at least one quantum confinement species embedded in an active layer disposed in-between conductive electrodes. Charge can tunnel from an electrode, through an active layer and into the QCS, or between QCS, when an electrical field is applied across the electrodes.

In an embodiment, due to constraints imposed by the density of states, electrons transferred into an acceptor QCS can occupy higher energy levels as more electrons reside in the QCS. This filling of high energy levels can represent stored energy that can be released when the energy storage device discharges. The electrons in high energy levels can tunnel back into another QCS or into the electrode and release their energy. In an embodiment, this energy, due to high energy level occupation, is not electrostatic since it is not due to charge displacement. As such, this energy may not manifest itself in an increased permittivity of the material, and may not result in dielectric breakdown. In such a case, additional energy can be stored in an energy storage device of the same size and weight, resulting in a device having higher performance.

In an embodiment, QCS-containing solid state energy storage devices can have various applications, such as grid energy storage, portable electronics, and automotive or transportation uses, including vehicles.

In an embodiment, solid state energy storage devices are provided having an active layer and one or more electrodes, wherein the electrodes are nanostructured to increase interfacial area. In another embodiment, solid state energy storage devices are provided for non-electrostatic energy storage via electrons.

In another aspect of the invention, an energy storage device is configured to store electrons with the aid of one or more quantum confinement species (QCS), as opposed to ions, providing for small and light devices with high storage capacities. Furthermore, electron transport allows for fast charge and discharge and long lifetime (high cycle life).

In some embodiments, a non-electrochemical energy storage device is provided, comprising an active layer having a quantum confinement species (QCS), wherein the active layer permits the flow of charge through the active layer and to and from the QCS, and a plurality of conductive electrodes enclosing the active layer. In an embodiment, the non-electrochemical energy storage device is a substantially non-electrochemical energy storage device. In another embodiment, the non-electrochemical energy storage device is a capacitor. In another embodiment, the non-electrochemical energy storage device is a battery. In another embodiment, the active layer is formed of a non-dielectric (or non-insulating) material. In another embodiment, the active layer is formed of a conductive material. In another embodiment, the active layer is formed of a semiconducting material or a metallic material. In another embodiment, the non-electrochemical battery lacks a liquid (or liquid phase) electrolyte. In an embodiment, the non-electrochemical energy storage device has an effective average permittivity ($\varepsilon$) of at least about 500 and an energy storage density of at least about 150 Whr/kg.

In an embodiment, the non-electrochemical energy storage device has an effective permittivity ($\varepsilon$) of at least about 100, or 200, or 300, or 400, or 500. In another embodiment, the non-electrochemical energy storage device has and an energy storage density of at least about 100 Whr/kg, or 150 Whr/kg, or 200 Whr/kg, or 250 Whr/kg, or 300 Whr/kg, or 350 Whr/kg, or 400 Whr/kg, or 450 Whr/kg, or 500 Whr/kg.

In an embodiment, the non-electrochemical energy storage device has an effective dielectric permittivity ($\varepsilon$) of at least about 100, or 200, or 300, or 400, or 500, or 600, or 700, or 800, or 900, or 1000, or 2000, or 3000, or 4000, or 5000, or 6000, or 7000, or 8000, or 9000, or 10,000, or 15,000, or 20,000. In another embodiment, the non-electrochemical battery has a charge rate of at least about 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s. In another embodiment, the substantially non-electrochemical battery has a discharge rate of at least about 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s. In another embodiment, the non-electrochemical battery has an energy storage density of at least about 150 Whr/kg.

In an embodiment, QCS are charged (i.e., charge is transferred to the QCS) with the aid of a charging device, such as one or more charging circuits or charging stations (see below). The charging device can be in electrical contact with the electrodes. In such fashion, charge can be transferred to the QCS. In some embodiments, during charging, charge is transferred to the electrodes and subsequently to the QCS. In an embodiment, charge is transferred from the electrodes and to the QCS through the active layer. In another embodiment, the charging device does not contact the electrodes, but charges the device inductively.

In an embodiment, when the electrodes are disconnected from the one or more charging circuits, at least some of the charge remains in the QCS and can be stored for later discharge. By applying an appropriate resistive load across the electrodes, the QCS can be discharged, which causes current to flow.

In an embodiment, a battery can include one or more solid state energy storage devices. In another embodiment, a battery can include 1 or more, or 2 or more, or 3 or more, or 4 or more, or 5 or more, or 10 or more, or 15 or more, or 20 or more, or 30 or more, or 40 or more, or 50 or more, or 100 or more, or 500 or more, or 1,000 or more, or 5,000 or more, or 10,000 or more, or 50,000 or more solid state energy storage devices. In another embodiment, a battery can include a plurality of solid state energy storage devices, wherein at least some of the solid state energy storage devices are connected in parallel. In another embodiment, a battery can include a plurality of solid state energy storage devices, wherein at least some of the solid state energy storage devices are connected in series.

In an embodiment, an energy storage device having QCS disposed in-between electrodes is charged with the aid of a charging device (or charging station, see below). In another embodiment, when the electrodes are disconnected from the charging device, the fraction (shown as a percentage) of charge remaining in the QCS is about 5% or more, or 10% or more, or 15% or more, or 20% or more, or 25% or more, or 30% or more, or 35% or more, or 40% or more, or 45% or more, or 50% or more, or 55% or more, or 60% or more, or 65% or more, or 70% or more, or 75% or more, or 80% or more, or 85% or more, or 90% or more, or 91% or more, or 92% or more, or 93% or more, or 94% or more, or 95% or more, or 96% or more, or 97% or more, or 98% or more, or 99% or more. In another embodiment, the fraction of charge remaining in the QCS is about 50%, or 60%, or 70%, or 80%, or 90%, or 100%.

In an embodiment, quantum confinement structures (QCS) can include one or more species selected from quantum dots, quantum particles, quantum wells, nanoparticles, nanostructures, nanowires and nanofibers. In an embodiment, QCS can include quantum dots. In another embodiment, QCS can include quantum particles. In another embodiment, QCS can include quantum wells. In another embodiment, QCS can include nanoparticles. In another embodiment, QCS can include nanostructures. In another embodiment, QCS can include nanowires. In another embodiment, QCS can include nanofibers.

In an embodiment, solid state devices have improved degradation properties over current (or existing) energy storage devices, enabling the solid state devices to have lifetimes in excess of current energy storage devices. In an embodiment, energy storage is via electrons in the bulk, as opposed to surface charges (e.g., capacitors) or ions (e.g., batteries).

In an embodiment, the charge and discharge rates and storage capacities of the devices are tunable. Charge and discharge rates can depend on the gaps between QCS and the dielectric constant (or conductivity) of the active material. The charge and discharge rates can be altered by changing the distances between QCS, the bandgap of the active layer, the offset between electron affinities of the active layer and the QCS, the dielectric constant of the active layer, or any combination thereof. Charge and discharge rates can further depend upon the electron affinity of the active layer and of the QCS. One skilled in the art will be able to perform the necessary tunneling calculations for a given arrangement of QCS and energy levels of QCS and active layer material to determine charge and discharge rates.

In an embodiment, an energy storage device has QCS of varying sizes. In an embodiment, large QCS are placed near one electrode and smaller QCS are placed near an opposing electrode. In another embodiment, charge can be stored in the larger QCS. The gradient in the size distribution can allow polarization of the QCS, even when the cell is under zero applied voltage, i.e., a larger QCS is polarized due to its proximity to a smaller QCS. When the device is charged, the excess charge is preferentially contained in the larger dot (or larger QCS), thereby increasing the stored charge. The gradient in Fermi levels between the QCS provides a driving force for discharge of electrons through the QCS to the electrode. In another embodiment, an array of smaller QCS is arranged around a larger QCS. Alternatively, a smaller QCS can be surrounded by an array of larger QCS. It is noted that the QCS can have a wide range of sizes. In another embodiment, the larger QCS can be replaced by a nanowire or a quantum well, and/or the smaller QCS can be as small as an individual atom.

In an embodiment, an arrangement of QCS can be made of different materials. Additionally, a first QCS can be made from a material with a greater work function than a second QCS. Electron transfer results from the Fermi level difference between materials in proximity to one another, so a greater polarization can be achieved with a greater difference in Fermi level.

In another embodiment, an energy storage device can include multiple repeating units connected to each other, such as by stacking the units on top of each other. Each of the units is capable of storing an amount of charge by itself. Since the voltage of these units stacked in series is additive, and the energy density scales with the square of the voltage, a much higher energy density can be achieved with such devices.

In another embodiment, energy storage device can include multiple repeating units connected to each other, such as by stacking the units side-by-side and connected electrically in parallel. As such, the device with multiple repeating units is capable of storing a larger amount of charge.

In an embodiment, improved energy storage can be provided by disposing conductive electrodes on either side of an active layer. In another embodiment, one or more active layers are separated from each other by insulating layers, such as thin insulating layers—e.g., about 1 nanometer ("nm") to 25 nm in thickness—through which tunneling can occur, or by thick (about 10 nm to 700 nm) insulating layers that are highly resistive to electrical current.

In some embodiments, an energy storage device is provided having an active layer comprising one or more QCS in-between conductive electrodes, and a barrier layer comprising an insulating material between a conductive electrode and the active layer. In an embodiment, the insulating layer can have a thickness between about 0.5 nm and 50 nm, or between about 1 nm to 25 nm. In another embodiment, the insulating layer can have a thickness of about 1 nm, or 2 nm, or 3 nm, or 4 nm, or 5 nm, or 6 nm, or 7 nm, or 8 nm, or 9 nm, or 10 nm, or 11 nm, or 12 nm, or 13 nm, or 14 nm, or 15 nm, or 16 nm, or 17 nm, or 18 nm, or 19 nm, or 20 nm, or 21 nm, or 22 nm, or 23 nm, or 24 nm, or 25 nm, or 26 nm, or 27 nm, or 28 nm, or 29 nm, or 30 nm. In another embodiment, the insulating layers can each have a thickness between about 1 nm and 1000 nm, or between about 5 nm and 800 nm, or between about 10 nm and 700 nm. In an embodiment, the insulating layers can each have a thickness between about 0.1 nm and 100 µm, or 1 µm and 50 µm.

In some embodiments, the barrier layer resistivity is above $10^{10}$ Ω-cm and preferably above $10^{14}$ Ω-cm. In some embodiments, the barrier layer bandgap is above 3 eV, above about 5 eV, or above about 8 eV. In some embodiments, the barrier layer breakdown voltage is above 0.8 V/nm, above 1 V/nm, or above 1.5 V/nm.

Some examples of materials useful for the barrier layers include, but are not limited to, $Al_2O_3$, $TiO_2$, Ti-nitride, Ti-oxynitride, carbon (e.g., diamond), ZnO, $ZrO_2$, $HfO_2$, $SiO_2$, $Si_3N_4$, silicon oxynitride, $Y_2O_3$, $BaTiO_3$, SrO, $SrTiO_3$, ZnS, $TiO_2$, other oxides, nitrides, sulfides, selenides, and mixtures or combinations thereof.

In an embodiment, an active layer can include QCS that have different Fermi levels, which can create a chemical potential gradient. Further, the active layer can be quantum-confined, as in quantum wells, nanowires or quantum dots. Such quantum confinement can provide for adjusting the Fermi level(s) of the active layer. In an embodiment, the active layer can be formed of a metallic or semiconductor material. In addition, the active layer and can include one or more QCS embedded in the active layer, the one or more QCS having an electron affinity that is higher than the electron affinity of the barrier layer. In an embodiment, the barrier layer can have a high breakdown voltage. In another embodiment, several active layers can be stacked on top of each other. In another embodiment, an energy storage device can include a plurality of active layers stacked on top of one another, the active layers separated by conductive electrodes. Each energy storage device can include a barrier layer between an active layer and each of the conductive electrodes.

In an embodiment, electron tunneling can create a balancing electric potential gradient such that the electrochemical potential is constant, such as under steady state conditions (or equilibrium). In another embodiment, when a voltage of a certain polarity is applied to the device, it can cancel out the equilibrium chemical potential, which can force (or drive) electrons into the higher Fermi level material (i.e., a charging current flows). When the voltage is removed, some charge can persist in the active layer(s). This is the charged state of the device. When a discharge current is drawn from the device, the voltage of the electrodes is reduced, and the stored charge can flow to the lower Fermi energy material. This is the discharge cycle, and the electron flow from the one or more QCS and through the active layer to the electrodes can contribute current.

In an embodiment, a solid state energy storage device can have an energy storage density (also "energy density" herein) up to and including about 100 Whr/kg, or 150 Whr/kg, or 200 Whr/kg, or 250 Whr/kg, or 300 Whr/kg, or 350 Whr/kg, or 400 Whr/kg, or 450 Whr/kg, or 500 Whr/kg, or 550 Whr/kg, or 600 Whr/kg, or 650 Whr/kg, or 700 Whr/kg, or 750 Whr/kg, or 800 Whr/kg, or 850 Whr/kg, or 900 Whr/kg, or 950 Whr/kg, or 1000 Whr/kg. In another embodiment, a solid state energy storage device can have an energy storage density greater than or equal to about 100 Whr/kg, or 150 Whr/kg, or 200 Whr/kg, or 250 Whr/kg, or 300 Whr/kg, or 350 Whr/kg, or 400 Whr/kg, or 450 Whr/kg, or 500 Whr/kg, or 550 Whr/kg, or 600 Whr/kg, or 650 Whr/kg, or 700 Whr/kg, or 750 Whr/kg, or 800 Whr/kg, or 850 Whr/kg, or 900 Whr/kg, or 950 Whr/kg, or 1000 Whr/kg. In another embodiment, a solid state energy storage device can have an energy storage density of at least about 100 Whr/kg, or 150 Whr/kg, or 200 Whr/kg, or 250 Whr/kg, or 300 Whr/kg, or 350 Whr/kg, or 400 Whr/kg, or 450 Whr/kg, or 500 Whr/kg, or 550 Whr/kg, or 600 Whr/kg, or 650 Whr/kg, or 700 Whr/kg, or 750 Whr/kg, or 800 Whr/kg, or 850 Whr/kg, or 900 Whr/kg, or 950 Whr/kg, or 1000 Whr/kg. In another embodiment, a solid state energy storage device can have an energy storage density of at least about 150 Whr/Kg. In another embodiment, a solid state energy storage device can have an energy storage density of at least about 100 Whr/kg, or 150 Whr/kg, or 200 Whr/kg, or 250 Whr/kg, or 300 Whr/kg, or 500 Whr/kg, or 1000 Whr/kg.

In an embodiment, a solid state energy storage device can have a power storage density (also "power density" herein) up to and including about $1\times10^2$ W/kg, $2\times10^2$ W/kg, or $3\times10^2$ W/kg, or $4\times10^2$ W/kg, or $5\times10^2$ W/kg, or $6\times10^2$ W/kg, or $7\times10^2$ W/kg, or $8\times10^2$ W/kg, or $9\times10^2$ W/kg, $1\times10^3$ W/kg, or $2\times10^3$ W/kg, or $3\times10^3$ W/kg, or $4\times10^3$ W/kg, or $5\times10^3$ W/kg, or $6\times10^3$ W/kg, or $7\times10^3$ W/kg, or $8\times10^3$ W/kg, or $9\times10^3$ W/kg, or $1\times10^4$ W/kg, or $5\times10^4$ W/kg, or $1\times10^5$ W/kg, or $5\times10^5$ W/kg, or $1\times10^6$ W/kg, or $5\times10^6$ W/kg, or $1\times10^7$ W/kg. In another embodiment, a solid state energy storage device can have a power storage density of at least about $1\times10^2$ W/kg, $2\times10^2$ W/kg, or $3\times10^2$ W/kg, or $4\times10^2$ W/kg, or $5\times10^2$ W/kg, or $6\times10^2$ W/kg, or $7\times10^2$ W/kg, or $8\times10^2$ W/kg, or $9\times10^2$ W/kg, $1\times10^3$ W/kg, or $2\times10^3$ W/kg, or $3\times10^3$ W/kg, or $4\times10^3$ W/kg, or $5\times10^3$ W/kg, or $6\times10^3$ W/kg, or $7\times10^3$ W/kg, or $8\times10^3$ W/kg, or $9\times10^3$ W/kg, or $1\times10^4$ W/kg, or $5\times10^4$ W/kg, or $1\times10^5$ W/kg, or $5\times10^5$ W/kg, or $1\times10^6$ W/kg, or $5\times10^6$ W/kg, or $1\times10^7$ W/kg.

In another embodiment, a solid state energy storage device can have an energy storage density of at least about 150 Whr/kg, or 200 Whr/kg, 250 Whr/kg, 300 Whr/kg, 500 Whr/kg, or 1000 Whr/kg.

In an embodiment, a solid state energy storage device is provided in which the energy storage capacity of the device after about 1,000 charge/discharge cycles, or is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity.

In another embodiment, a solid state energy storage device is provided in which the energy storage capacity of the device after about 2,000 charge/discharge cycles is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity.

In another embodiment, a solid state energy storage device is provided in which the energy storage capacity of the device after about 3,000 charge/discharge cycles is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity.

In another embodiment, a solid state energy storage device is provided in which the energy storage capacity of the device after about 4,000 charge/discharge cycles is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity.

In another embodiment, a solid state energy storage device is provided in which the energy storage capacity of the device after about 5,000 charge/discharge cycles is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity. In another embodiment, a solid state energy storage device is provided in which the energy storage capacity of the device after about 10,000 charge/discharge cycles is at least about 75% of the maximum energy storage capacity, or at least about 80% of the maximum energy storage capacity, or at least about 85% of the maximum energy storage capacity, or at least about 90% of the maximum energy storage capacity, or at least about 95% of the maximum energy storage capacity, or at least about 99% of the maximum energy storage capacity.

In an embodiment, a solid state energy storage device is provided in which energy storage (charge) and discharge involves no ionic charge carriers. In another embodiment, a solid state energy storage device is provided in which energy storage (charge) and discharge is non-electrochemical. In another embodiment, a solid state energy storage device is provided in which energy storage and discharge involves electrode charge separation.

In an embodiment, a solid state energy storage device comprises an active layer having one or more QCS, the solid state energy storage device configured to store energy with the aid of an electric field. In another embodiment, a solid state energy storage device comprises an active layer having one or more QCS, the solid state energy storage device configured to store electrons with the aid of an electric field.

In an embodiment, a solid state energy storage device can behave as a two-terminal device with an effective permittivity ($\varepsilon$) of at least about 100, or at least about 200, or at least about 300, or at least about 400, or at least about 500, or at least about 600, or at least about 700, or at least about 800, or at least about 900, or at least about 1,000, or at least about 5,000, or at least about 10,000, or at least about 15,000, or at least about 20,000, or at least about 25,000, or at least about 30,000, or at least about 35,000, or at least about 40,000, or at least about 50,000, or at least about 100,000, or at least about 500,000. In another embodiment, a solid state energy storage device can act (or behave) as a two-terminal device with an effective permittivity ($\varepsilon$) of at least about 20,000, or 50,000, or 100,000, or 500,000. In another embodiment, a solid state energy storage device can act as a two-terminal device with an effective permittivity ($\varepsilon$) between about 50 and 5,000, or between about 100 and 2,000, or between about 500 and 1000.

In an embodiment, a solid state energy storage device can act (or function) as a two-terminal device with an effective permittivity ($\varepsilon$) of at least about 1,000, or 5,000, or 10,000, or 15,000, or 20,000, or 25,000, or 30,000, or 35,000, or 40,000, or 50,000, or 100,000, and a breakdown field ($E_{bd}$) of at least about 100 kV/mm, or at least about 200 kV/mm, or at least about 300 kV/mm, or at least about 400 kV/mm, or at least about 500 kV/mm, or at least about 600 kV/mm, or at least about 700 kV/mm, or at least about 800 kV/mm, or at least about 900 kV/mm, or at least about 1,000 kV/mm, or at least about 1,100 kV/mm, or at least about 1,200 kV/mm, or at least about 1,300 kV/mm, or at least about 1,400 kV/mm, or at least about 1,500 kV/mm. In another embodiment, a solid state energy storage device can act as a two-terminal device with an effective permittivity ($\varepsilon$) of at least about 1,000 and a breakdown field ($E_{bd}$) of at least about 500 kV/mm, In an embodiment, a solid state energy storage device is provided wherein the shelf degradation of the device, over a period of at least about 10 years, is less than about 30%, or less than about 20% or less than about 15%, or less than about 10%, or less than about 5%, or less than about 4%, or less than about 3%, or less than about 2%, or less than about 1%. In another embodiment, a solid state energy storage device is provided wherein the shelf degradation of the device, over a period of at least about 10 years, is less than about 5%.

In an embodiment, a solid state energy storage device is provided having a discharge rate of at least of at least 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s, and an energy density of at least about 150 Whr/kg, or 200 Whr/kg, or 250 Whr/kg, 300 Whr/kg, 500 Whr/kg, or 1000 Whr/kg. In another embodiment, a solid state energy storage device having one or more quantum confinement species is provided having a discharge rate of at least of at least 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s, and an energy density of at least about 150 Whr/kg, or 200 Whr/kg, or 250 Whr/kg, 300 Whr/kg, 500 Whr/kg, or 1000 Whr/kg.

In an embodiment, a solid state energy storage device is provided having a discharge rate of at least about 10 V/s, or at least about 20 V/s, or at least about 30 V/s, or at least about 40 V/s, or at least about 50 V/s, or at least about 60 V/s, or at least about 70 V/s, or at least about 80 V/s, or at least about 90 V/s, or at least about 100 V/s, or at least about 200 V/s, or at least about 300 V/s, or at least about 400 V/s, or at least about 500 V/s, or at least about 1000 V/s, or at least about 2000 V/s, or at least about 3000 V/s, or at least about 4000 V/s, or at least about 5000 V/s. In another embodiment, a solid state energy storage device is provided having a charge rate of at least about 10 V/s, or at least about 20 V/s, or at least about 30 V/s, or at least about 40 V/s, or at least about 50 V/s, or at least about 60 V/s, or at least about 70 V/s, or at least about 80 V/s, or at least about 90 V/s, or at least about 100 V/s, or at least about 200 V/s, or at least about 300 V/s, or at least about 400 V/s, or at least about 500 V/s, or at least about 1000 V/s, or at least about 2000 V/s, or at least about 3000 V/s, or at least about 4000 V/s, or at least about 5000 V/s.

In an embodiment, a solid state energy storage device having quantum confinement species is provided having a discharge rate of at least about 10 V/s, or at least about 20 V/s, or at least about 30 V/s, or at least about 40 V/s, or at least about 50 V/s, or at least about 60 V/s, or at least about 70 V/s, or at least about 80 V/s, or at least about 90 V/s, or at least about 100 V/s, or at least about 200 V/s, or at least about 300 V/s, or at least about 400 V/s, or at least about 500 V/s, or at least about 1000 V/s, or at least about 2000 V/s, or at least about 3000 V/s, or at least about 4000 V/s, or at least about 5000 V/s. In another embodiment, a solid state energy storage device having quantum confinement species is provided having a charge rate of at least about 10 V/s, or at least about 20 V/s, or at least about 30 V/s, or at least about 40 V/s, or at least about 50 V/s, or at least about 60 V/s, or at least about 70 V/s, or at least about 80 V/s, or at least about 90 V/s, or at least about 100 V/s, or at least about 200 V/s, or at least about 300 V/s, or at least about 400 V/s, or at least about 500 V/s, or at least about 1000 V/s, or at least about 2000 V/s, or at least about 3000 V/s, or at least about 4000 V/s, or at least about 5000 V/s.

In an embodiment, a solid state energy storage device is provided comprising quantum confined species (QCS) selected to provide an energy storage density of at least about 150 Whr/kg. In another embodiment, a solid state energy storage device is provided comprising nanoparticles selected to provide an energy storage density of at least about 150 Whr/kg. In another embodiment, a solid state energy storage device is provided comprising nanowires selected to provide an energy storage density of at least about 150 Whr/kg. In another embodiment, a solid state energy storage device is provided comprising nanofibers selected to provide an energy storage density of at least about 150 Whr/kg. In another embodiment, a solid state energy storage device is provided comprising quantum dots selected to provide an energy storage density of at least about 150 Whr/kg. In another embodiment, a solid state energy storage device is provided comprising quantum particles selected to provide an energy storage density of at least about 150 Whr/kg.

In an embodiment, a solid state energy storage device is provided wherein selection of the quantum confined species (QCS) comprises selection of substrate material, inclusion material, geometry, size and/or periodicity of the QCS. In another embodiment, a solid state energy storage device is provided in which the geometry of the QCS is selected from one or more of a sphere, a cap-shaped structure and a quantum dot. In another embodiment, a solid state energy storage device is provided in which the QCS is selected from one or more of a spherical QCS, a cap-shaped QCS, a tetrapod shape, and a quantum dot. In other embodiments, a QCS can have other shapes, such as cylindrical, and various cross-sectional shapes, such as circular, oval, triangular, box-like, rectangular, pentagonal, hexagonal, heptagonal and octagonal.

In some embodiments, an energy storage device includes at least one barrier layer and at least one active layer between two electrodes of the energy storage device. The at least one active layer can include QCS disposed in the at least one active layer. The QCS can have an electron affinity that is higher than the electron affinity of the at least one active layer material. The barrier layer can have a resistivity of at least about $10^{10}$ ohm-cm and a breakdown voltage of at least about 0.2 V/nm. In an embodiment, the energy storage device can include two barrier layers, one disposed between a top surface of the active layer and a first electrode of the two electrodes and the other disposed between a bottom surface of the active layer and a second electrode of the two electrodes.

In an embodiment, an energy storage device can include a plurality of active layers having a combined thickness between about 0.1 nm and 500 µm, or between about 0.3 nm and 300 µm. In another embodiment, an active layer can have a thickness up to an including about 0.1 nm, or 0.2 nm, or 0.3 nm, or 0.4 nm, or 0.5 nm, or 0.6 nm, or 0.7 nm, or 0.8 nm, or 0.9 nm, or 1 nm, or 10 nm, or 20 nm, or 30 nm, or 40 nm, or 50 nm, or 100 nm, or 200 nm, or 300 nm, or 400 nm, or 500 nm, or 1,000 nm, or 5,000 nm, or 10,000 nm, or 50,000 nm, or 100,000 nm, or 200,000 nm, or 300,000 nm, or 500,000 nm.

In an embodiment, an energy storage device can include a plurality of active layers, with the active layers having the same width (or thickness). In another embodiment, the active layers are of different (or varying) thicknesses.

In an embodiment, conductive electrodes can be formed of a material having a relatively large work function ($\phi_1$). In another embodiment, conductive electrodes can be formed of one or more of Au, Pt, W, Al, Cu, Ag, Ti, Se, Ge, Pd, Ni, Co, Rh, Ir and Os. Size gradient of quantum confined active layers are highly polarizable using high density of state (DOS) materials such as Ni, Pt, Cu, Ag, Au and Ir, to name a few. The current invention provides QCS that are chemically stable in the active material (e.g., the QCS does not oxidize if the active layer includes an oxide).

According to the current invention, examples of materials useful for the QCS can include metals such as Pt, Au, Ni, Ag, W, Ti, Al, Cu, Pd, Cs, Li, Na, K, Y, Sr and Ba. Further examples of materials useful for the QCS can include low bandgap semiconductors such as PbSe, PbS, PbTe, ZnS, CdSe, CdS, ZnSe, Ge, Si, Sn, InAs, InSb and conductive oxides such as $RuO_2$. In some embodiments, the quantum confinement species (QCS) are non-metallic.

In an embodiment, an energy storage device is formed from one or more active layers in-between conductive electrodes of the energy storage device, in addition to and one or more barrier layers between an active layer and a conductive electrode. In another embodiment, a process sequence can involve fabricating the barrier layers and active layers independently and bonding the materials together using wafer bonding methods. As an example, a layer transfer technique can include any of the methods provided by U.S. Pat. No. 7,323,398 to Akatsu ("Method of layer transfer comprising sequential implantations of atomic species"). Alternatively, a hybrid approach can be used in which dielectric barrier material is made in bulk from a melt and the active layers are deposited on top of the barrier material with thin film deposition.

FIG. 1 schematically illustrates a solid state energy storage device 100, in accordance with an embodiment of the invention. The solid state energy storage device 100 includes a first electrode 105, a first barrier layer 110, an active layer 115, a second barrier layer 120 and a second electrode 125. The first and second electrodes 105 and 125 can be formed of an electrically conductive ("conductive") material. The active layer 115 can include one or more quantum confinement species (QCS). The barrier layers 110 and 120 can be formed of an insulating material. In an alternative embodiment, the first barrier layer 110 can be omitted. In another embodiment, the second barrier layer 120 can be omitted. In another embodiment, the first and second barrier layers 110 and 120 can be omitted.

In another aspect of the invention, a solid state energy storage device having a plurality of active layers is provided. In an embodiment, a solid state energy storage device comprises a plurality of metal layers separated by active layers. The solid state energy storage device can include barrier layers between the active layers and the metal layers.

In an embodiment, each of the active layers includes quantum confinement species (QCS), as described herein. In another embodiment, each of the active layers can include a layer of one or more of nanostructured (or nano-structured) materials, nanoparticles, nanofibers, nanowires, quantum dots, quantum wells, or bulk material. In another embodiment, the metal layers can be formed of any metal, metallic or metal-containing material, such as one or more of Au, Pt, W, Al, Cu, Ag, Ti, Se, Ge, Pd, Ni, Co, Rh, Ir and Os. In another embodiment, the metal layers can be formed of a semiconducting material, such as a doped semiconducting material. In another embodiment, the metal layers can be formed of carbon (e.g., diamond, graphite), such as a carbon thin film.

In an embodiment, a solid state energy storage device can include up to an including 10 metal layers, or up to an including 20 metal layers, or up to an including 40 metal layers, or up to an including 80 metal layers, or up to an including 100 metal layers, or up to an including 200 metal layers, or up to and including 300 metal layers, or up to an including 400 metal layers, or up to an including or up to an including 500 metal layers, or up to an including 1000 metal layers, or up to an including 10,000 metal layers. In an embodiment, a solid state energy storage device can include up to an including 10 active layers, or up to an including 20 active layers, or up to an including 40 active layers, or up to an including 80 active layers, or up to an including 100 active layers, or up to an including 200 active layers, or up to and including 300 active layers, or up to an including 400 active layers, or up to an including or up to an including 500 active layers, or up to an including 1000 active layers, or up to an including 10,000 active layers.

In an embodiment, the number of active layers (m) is equal to the number of metal layers (n), i.e., m=n. In another embodiment, the number of active layers is one higher than the number of metal layers, i.e., m=n+1. In another embodiment, the number of active layers is two higher than the number of metal layers, i.e., m=n+2. In another embodiment, the number of active layers is three higher than the number of metal layers, i.e., m=n+3. In another embodiment, the number of active layers is four higher than the number of metal layers, i.e., m=n+4. In another embodiment, the number of active layers is five higher than the number of metal layers, i.e., m=n+5. In another embodiment, m=n, or m=n+1, or m=n+2, or m=n+3, or m=n+4, or m=n+5, or m=n+6, or m=n+7, or m=n+8, or m=n+9, or m=n+10, or m=n+11, or m=n+12, or m=n+13, or m=n+14, or m=n+15, or m=n+16, or m=n+17, or m=n+18, or m=n+19, or m=n+20, or m=n+21, or m=n+22, or m=n+23, or m=n+24, or m=n+25, or m=n+26, or m=n+27, or m=n+28, or m=n+29, or m=n+30. In an embodiment, the metal layers and active layers are disposed one after another or sequentially.

In an embodiment, the thicknesses of the active layers are selected so as to provide for effective charge transfer to electrodes upon discharge of charge-retention species (e.g., QCS) in the active layers. In another embodiment, the thicknesses of the active layers are selected so as to provide for quantum mechanical tunneling between charge-retention species in the active layers, or quantum mechanical tunneling across the active layers.

In an embodiment, each of the active layers can have a thickness between about 0.1 nm and 500 μm, or between about 0.3 nm and 300 μm. In another embodiment, each of the active layers can have a thickness up to and including about 0.1 nm, or 0.2 nm, or 0.3 nm, or 0.4 nm, or 0.5 nm, or 0.6 nm, or 0.7 nm, or 0.8 nm, or 0.9 nm, or 1 nm, or 10 nm, or 20 nm, or 30 nm, or 40 nm, or 50 nm, or 100 nm, or 200 nm, or 300 nm, or 400 nm, or 500 nm, or 1,000 nm, or 5,000 nm, or 10,000 nm, or 50,000 nm, or 100,000 nm, or 200,000 nm, or 300,000 nm, or 500,000 nm. In an embodiment, the active layers are of the same width (or thickness). In another embodiment, a thicker active layer is disposed in-between a plurality of thinner active layers.

In an embodiment, each of the metal layers can have a thickness between about 0.1 nm and 500 μm, or between about 0.3 nm and 300 μm. In another embodiment, each of the metal layers can have a thickness up to an including about 0.1 nm, or 0.2 nm, or 0.3 nm, or 0.4 nm, or 0.5 nm, or 0.6 nm, or 0.7 nm, or 0.8 nm, or 0.9 nm, or 1 nm, or 10 nm, or 20 nm, or 30 nm, or 40 nm, or 50 nm, or 100 nm, or 200 nm, or 300 nm, or 400 nm, or 500 nm, or 1,000 nm, or 5,000 nm, or 10,000 nm, or 50,000 nm, or 100,000 nm, or 200,000 nm, or 300,000 nm, or 500,000 nm. In an embodiment, the metal layers are of the same width (or thickness). In another embodiment, the metal layers have varying thicknesses.

In another aspect, a system for providing power to an electrical device is provided. The system comprises a battery comprising a solid state energy storage device, the solid state energy storage device comprising one or more quantum confinement species (QCS) and one or more layers of active material (also "active layers" herein), wherein the one or more QCS are incorporated within the one or more layers of active material. In an embodiment, the active material transports charge to and from the QCS. In another embodiment, the active material is formed of a non-dielectric material. In another embodiment, the active material is formed of a semiconducting material. In another embodiment, the active material is formed of a metallic or metal-containing material. The solid state energy storage device can further comprise a first conductive electrode disposed on a top surface of the at least one layer of active material and a second conductive electrode disposed on a bottom surface of the at least one layer of active material, wherein the first electrode and second electrode are configured to aid in the transfer of charge to the one or more QCS. In an embodiment, the system includes a circuit (e.g., electrical circuit) in electrical communication with the battery, the circuit configured to provide an electric potential across the first electrode and second electrode of the solid state energy storage device. In another embodiment, when the circuit provides an electric (or electrical) potential across the first electrode and second electrode, the one or more QCS discharge their stored charge. In another embodiment, when the circuit provides a resistance across the first and second electrode, the one or more QCS discharge their stored charge. In another embodiment, the circuit is configured to charge (i.e., provide charge to) the one or more QCS by applying a potential (also "electrical potential" herein) across the first and second electrodes.

In an embodiment, the system is configured for use with a vehicle (e.g., car, motorcycle, scooter), an electronics device (e.g., telephone, computer, camera), a power grid, a home, other electronics devices (e.g., troop gear, weaponry, flashlights) and devices configured to harness or convert energy (e.g., photovoltaic modules, wind turbines, geothermal sources, solar collectors).

Methods for Increasing the Amount of Energy Stored in Solid State Energy Storage Devices An exemplary device described herein comprises two conducting electrodes with a dielectric material disposed between the electrodes. In a method for use the device is charged up to a voltage difference, V, between the electrodes and in this state the electrodes can carry equal and opposite charges of Q, where Q is equal to the capacitance of the device multiplied by the voltage.

In an example of the devices described herein, the dielectric comprises a matrix material having one or more QCS embedded therein. The embedded QCS may be quantum dot (QD) pairs, quantum dot cascades, quantum wells and other structures as described herein. Specific examples of the embedded species and examples of the overall architecture of the dielectric are described.

The devices described herein may be fabricated in a number of ways, for example using sputtering, evaporation, physical vapor deposition (PVD), atomic layer deposition (ALD) or chemical vapor deposition (CVD). In one method of making the devices, the devices are fabricated by sputtering using an Endura 5500, 200 mm supplied by Applied Materials. Quantum dots may be fabricated in a number of ways including by sputtering methods including, without limitation, methods as described in "High density platinum nanocrystals for non-volatile memory applications", Dufourcq et al, APPLIED PHYSICS LETTERS 92, 073102 2008, and "Self-assembly of Ni nanocrystals on $HfO_2$ and N-assisted Ni confinement for nonvolatile memory application", Tan et al, APPLIED PHYSICS LETTERS 86, 013107 (2005), both of which are hereby incorporated by reference in their entirety.

In some embodiments, devices are designed to increase energy density (or other device characteristics like recharging rate) while maintaining device characteristics allowing for use in energy storage applications such as electric vehicles. Such increase in energy density may be implemented through a variety of approaches described herein, which may be employed alone or in combination.

Figure 2:
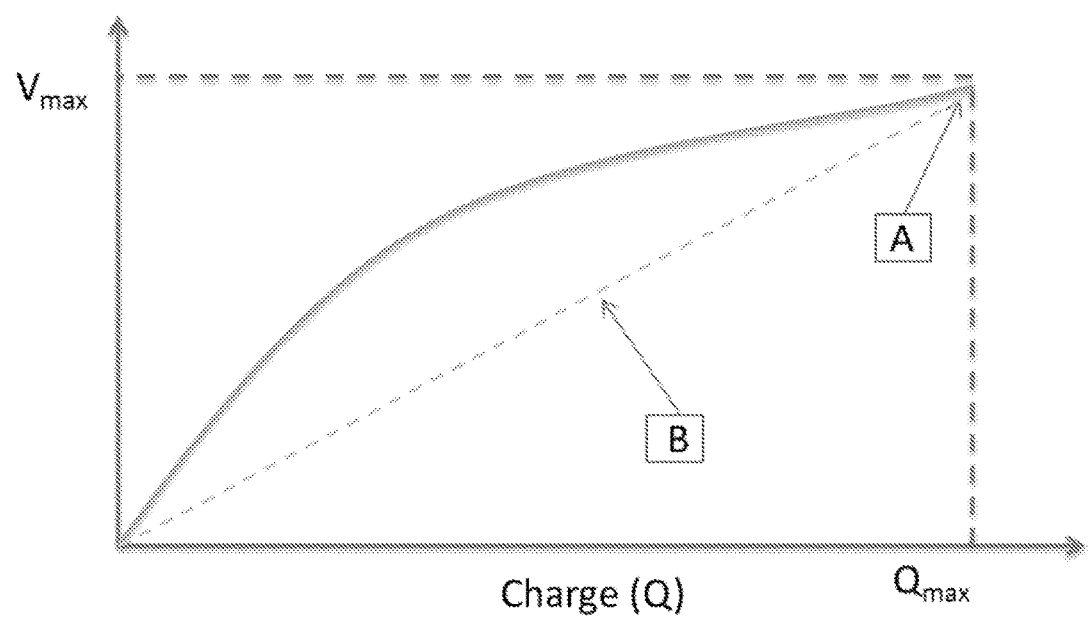
FIG. 2 schematically illustrates a Q-V plot for a standard material (B) and a material having a permittivity that varies with voltage (A).

With reference to FIG. 2, the total energy stored in an exemplary device can depend on, for example, (a) the maximum attainable voltage across the device electrodes, $V_{max}$, (b) the charge stored on the device electrodes at this voltage, $Q_{max}$ and/or (c) the form of the Q-V curve for the device.

Generally, the energy total stored in the device, E, is given by Equation (1):

$$E = \int_0^{Q_{max}} V(Q) dQ \qquad (1)$$

Without limitation, the energy stored in devices (and energy density) may be increased in at least the following three ways:

Increase breakdown voltage: $V_{max}$ can be limited by the maximum voltage that can be sustained by a device, i.e., the breakdown voltage, $V_{bd}$. Devices designed to increase $V_{bd}$ can allow increased breakdown voltage, $V_{max}$.

Increase ε of Dielectric Material: $Q_{max}$ can be equal to $C_2 * V_{max}$, where $C_2$ is the capacitance of the device when it is in the Q-V state denoted by "A" in FIG. 2. The capacitance of the device at A is given by $C_2$=Area of electrodes times permittivity, $\varepsilon_2$ of the dielectric material in state A divided by the distance between the electrodes. In some embodiments, $C_2$ can be increased by increasing $\varepsilon_2$ and/or by increasing the area and/or decreasing the thickness of the device. Changing geometric parameters of area and thickness may not change the energy density of the device, therefore described herein are devices that include dielectric material with increased permittivity.

Increase Area Under the Q-V curve: Generally the energy stored in a device equals the area under the Q-V curve in a plot such as that shown in FIG. 2. For most materials the capacitance does not depend on Q (i.e., V(Q)=Q/C as indicated by dotted line "B" in FIG. 2) and the energy stored in the device is given by Equation (2):

$$E=\tfrac{1}{2}C*V_{max}^2 \qquad (2)$$

If C is dependent on Q the form of the curve in FIG. 2 may allow an increased stored energy up to $C*V_{max}^2$, which is two times the stored energy for most materials.

Figure 3:
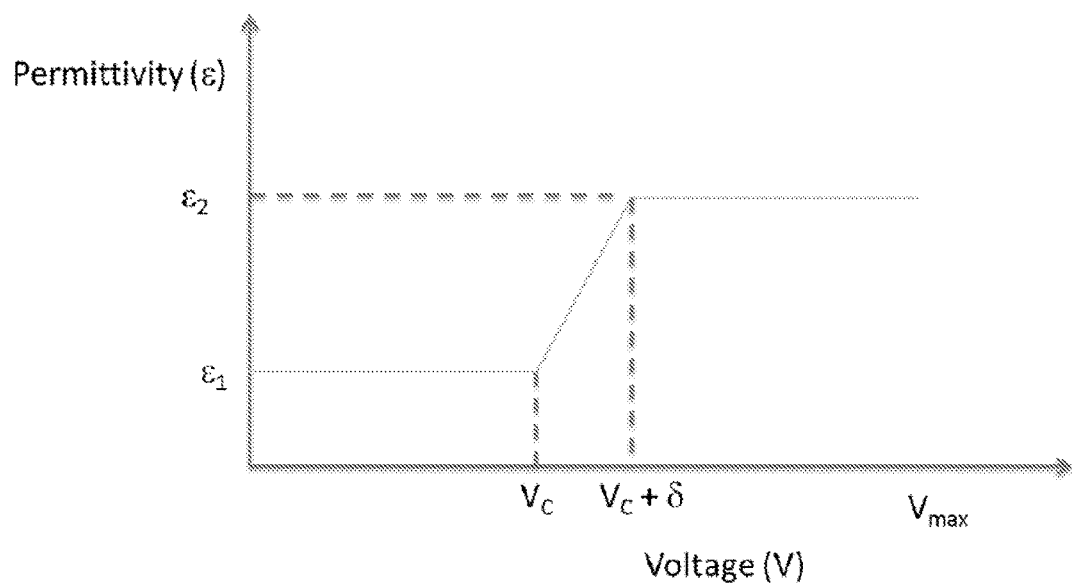
FIG. 3 schematically illustrates a plot of permittivity versus voltage for a material having a first permittivity ($\varepsilon_1$) below a critical voltage ($V_c$) and a second permittivity ($\varepsilon_2$) above a critical voltage.

Increase Energy Density by Increasing Area Under the Q-V Curve:

The area under the Q-V curve may be increased by including a dielectric material with non-linear dependence of permittivity on V. In some embodiments, a solid state energy storage device comprises: (a) a first conductive electrode and second conductive electrode; and (b) an active layer between the first and second conductive electrodes, the active layer having a permittivity that varies non-linearly with voltage. FIG. 3 shows one example of a non-linearity that can be used. In FIG. 3, $\varepsilon_1$ is the permittivity below a critical voltage, $V_c$ and $\varepsilon_2$ is the permittivity above the critical voltage. The dielectric material may have a permittivity that increases with increasing voltage. Such increase need not be a monotonic increase as shown in FIG. 3. The increase can be sigmoidal, a step change or follow any increasing path. The increase can be continuous or discontinuous (i.e., having an infinite slope any point along the curve shown in FIG. 3).

In some instances, the active layer has a first permittivity ($\varepsilon_1$) below a critical voltage ($V_c$) and a second permittivity ($\varepsilon_2$) above the critical voltage. In general, the second permittivity ($\varepsilon_2$) is greater than the first permittivity ($\varepsilon_1$).

The first permittivity ($\varepsilon_1$) may be any suitable value. In some embodiments, the first permittivity ($\varepsilon_1$) is about 1, about 2, about 4, about 6, about 8, about 10, about 12, about 14, about 16, about 18, about 20, about 25, about 30, about 35, or about 40. In some embodiments, the first permittivity ($\varepsilon_1$) is less than about 1, less than about 2, less than about 4, less than about 6, less than about 8, less than about 10, less than about 12, less than about 14, less than about 16, less than about 18, less than about 20, less than about 25, less than about 30, less than about 35, or less than about 40.

The first second permittivity ($\varepsilon_2$) may be any suitable value. In some embodiments, the second permittivity ($\varepsilon_2$) about 20, about 25, about 30, about 35, about 40, about 45, about 50, about 55, about 60, about 70, about 80, about 100, about 120, or about 150. In some embodiments, the second permittivity ($\varepsilon_2$) at least about 20, at least about 25, at least about 30, at least about 35, at least about 40, at least about 45, at least about 50, at least about 55, at least about 60, at least about 70, at least about 80, at least about 100, at least about 120, or at least about 150.

In an example, the active layer may comprise one or more quantum confinement species (QCS) where electrons tunnel to or from an individual QCS above critical voltage $V_c$. There is a substantially low likelihood of electron tunneling to or from the QCS below V, (e.g., 0.1%, 0.01%, 0.001%, 0.0001%, and the like). The critical voltage can be any suitable voltage. In some embodiments, the $V_c$ is within about 50%, about 20%, about 10%, about 5%, or about 1% of the breakdown voltage ($V_{max}$).

In some embodiments, the device further comprises one or more intermediate layers between the active layer and at least one of the first and second conductive electrodes. In some cases, the one or more intermediate layers comprise a plurality of intermediate layers. In some instances, from an individual electrode to the active layer, the plurality of intermediate layers is distributed in order of increasing permittivity and/or in order of decreasing band gap. The intermediate layers may comprise silicon oxide.

The non-linearity shown in FIG. 3 may be achieved by using different architectures for the dielectric material, including, without limitation, tunneling QD pairs and tunneling QD cascades, i.e., QCS arranged with a size, composition and/or Fermi level gradient. In some embodiments, below $V_c$ there is little or no tunneling and the permittivity of the material, $\varepsilon_1$, is given by the permittivity of the matrix and the isolated, neutral QCS. Above $V_c$ there can be tunneling and the permittivity of the material, $\varepsilon_2$, is given by the permittivity of the matrix and the charged QCS pairs embedded in the matrix. Such permittivity may be a combined permittivity of the matrix and the charged QCS. In some embodiments, the transition from the first permittivity ($\varepsilon_1$) to the second permittivity ($\varepsilon_2$) is sharp (i.e., has a high slope).

Figure 4:
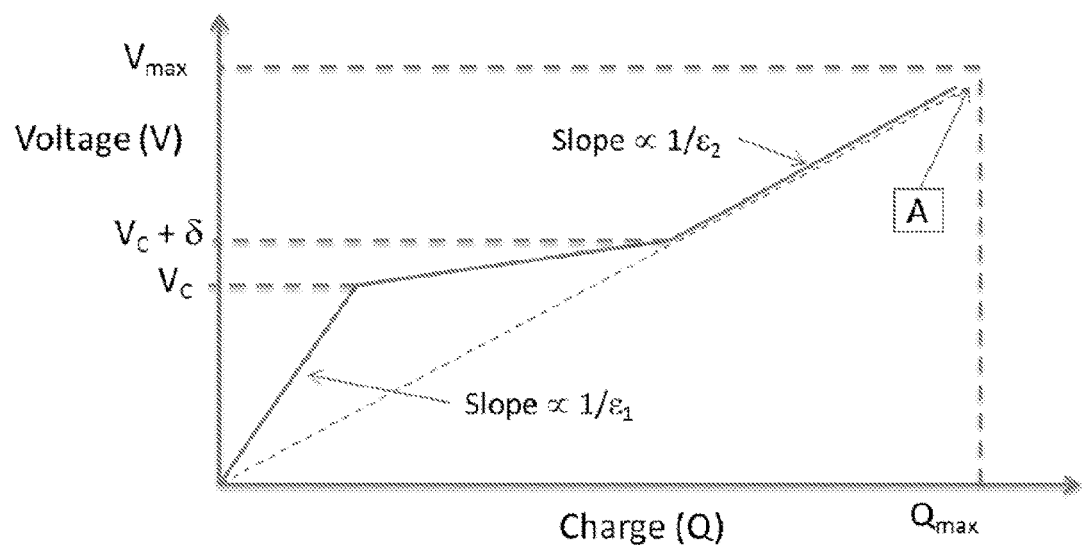
FIG. 4 schematically illustrates a Q-V plot for a material having a first permittivity ($\varepsilon_1$) below a critical voltage ($V_c$) and a second permittivity ($\varepsilon_2$) above a critical voltage.

With the non-linear permittivity shown in FIG. 3 the Q-V curve is given by FIG. 4. The area under the curve may be increased by (i) decreasing $\varepsilon_1$, i.e., minimizing the permittivity in the non-tunneling state, (ii) decreasing $\delta$, i.e., having very sharp transition between non-tunneling and fully tunneling states, (iii) increasing $\varepsilon_2$, i.e. maximizing the permittivity in the tunneling state and (iv) increasing $V_c$, in which case the Q-V curve is given in FIG. 5.

Devices having a dielectric material with one or more of the following characteristics can increase the energy density of the device: (a) low permittivity in the non-tunneling regime; (b) a transition to the tunneling regime at a voltage close to the maximum voltage; and (c) a sharp transition from the non-tunneling to the tunneling regime.

The area under the curve may be increased by having a low $\varepsilon_1$ and a high $\varepsilon_2$. An example of the devices described herein comprises a low k dielectric matrix and embedded QCS that do not contribute too much to the permittivity of the material when they are in their non-tunneling state. In some embodiments, k is about 1, about 2, about 4, about 8, or about 10. In some embodiments, k is less than about 2, less than about 4, less than about 8, or less than about 10. Some examples of the devices may provide a low $\varepsilon_1$ for the dielectric material. In an example of the devices described herein, the dielectric material comprises a low k dielectric matrix and embedded QCS with a low permittivity in the non-tunneling state. In some embodiments, the embedded QCS are non-metallic.

In some instances, when the QCS are in their tunneled state, long-range, cooperative coupling of the charged QCS may lead to enhancements of the permittivity of the composite dielectric material. Such cooperative enhancements are generally referred to as Clausius-Mossotti ("C-M") enhancements, the C-M effect, C-M coupling or such like phrases. For the Clausius-Mossotti enhancements to $\varepsilon_2$ it may be useful to have as strong as possible coupling between the charges, dipoles, etc. of the embedded QCS in the direction of the applied electric field. Higher permittivity matrix materials may reduce the coupling between the embedded species and therefore depress the C-M effect. A low permittivity dielectric matrix material may increase the C-M effect.

In some cases, C-M coupling helps make any tunneling transition sharp since the onset of tunneling may increase the dipole in any species which has tunneled, which may enhance the local field in adjacent species, which may increase the likelihood of tunneling in these species.

In some cases, the active layer comprises one or more quantum confinement species (QCS) embedded in a low permittivity matrix. In some cases, at least two QCS form an electrical dipole. The QCS may be arranged in any suitable way, but in some instances they are arranged so as to tunnel charge between each other and/or achieve Clausius-Mossotti (C-M) coupling. The QCS may undergo Clausius-Mossotti (C-M) coupling. Clausius-Mossotti (C-M) coupling may at least partially increase the second permittivity ($\varepsilon_2$).

Figure 6:
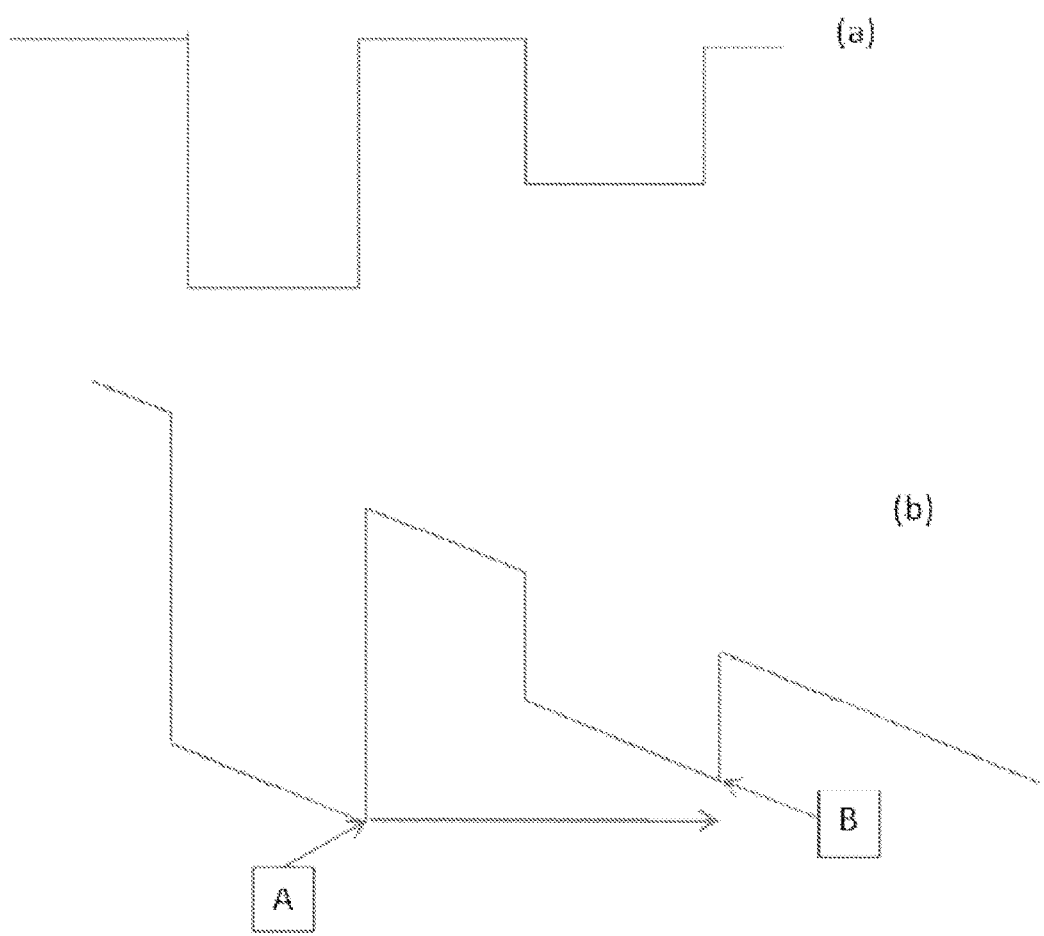
FIG. 6 schematically illustrates the Fermi level diagram for a QCS pair that may be used to provide a tunneling threshold effect.

The onset of tunneling in the QCS may be controlled in various ways including, without limitation, controlling the spacing apart of the tunneling species, the matrix material between the tunneling species and the relative densities of states and Fermi levels between the tunneling species. For example FIG. 6 shows the Fermi level diagram for a QCS pair that may be used to provide a tunneling threshold effect. FIG. 6(a) shows the zero field Fermi levels and FIG. 6(b) shows the Fermi levels with an applied field. Tunneling may not occur until the bottom of the electron donating QD Fermi level (indication "A") is at approximately the same energy with the bottom electron accepting QD Fermi level (indication "B").

Figure 5:
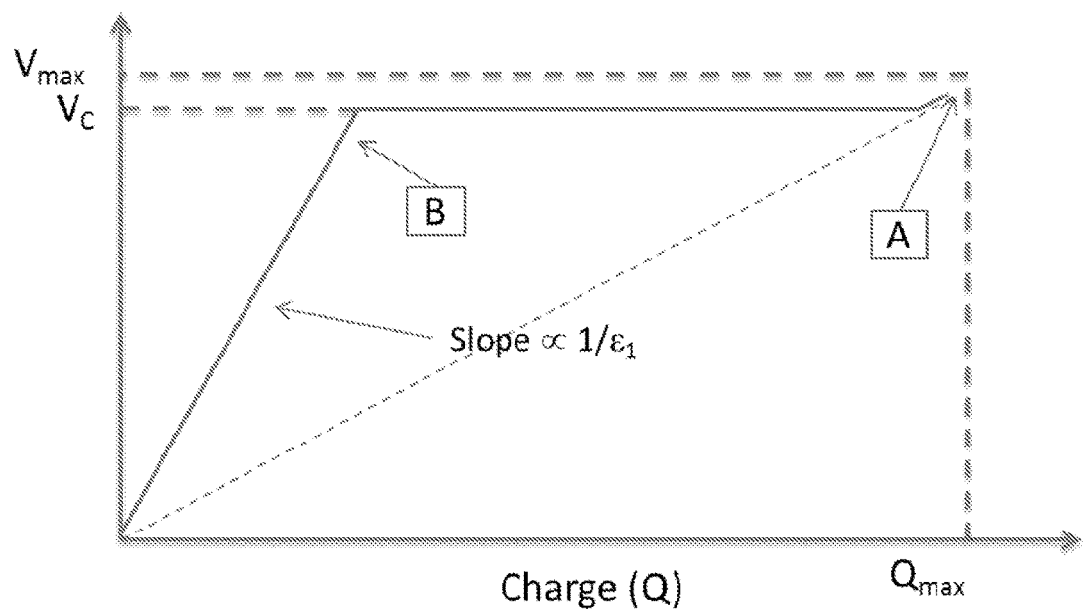
FIG. 5 schematically illustrates a Q-V plot for a material having a first permittivity ($\varepsilon_1$) below a critical voltage ($V_c$) and a second permittivity ($\varepsilon_2$) above a critical voltage and a $V_c$ near $V_{max}$.

For a device with a Q-V curve as shown in FIG. 5, discharge of the device may occur primarily at a constant voltage, with only discharge of the final charge being at a declining voltage proportional to $Q/\varepsilon_1$. This contains benefits from an application or system point of view in that a constant operating voltage may be desirable.

Increasing Energy Density by Increasing Breakdown Voltage

An aspect provides a solid state energy storage device comprising (a) a first conductive electrode and second conductive electrode; and (b) an active layer between the first and second conductive electrodes, the active layer having one or more quantum confinement species (QCS) embedded in a matrix, wherein the breakdown field ($E_{max}$) of the device is high.

The breakdown field ($E_{max}$) of the device can be any suitably high value. In some embodiments, the breakdown field ($E_{max}$) of the device is about 0.1, about 0.2, about 0.3, about 0.4, about 0.5, about 0.6, about 0.7, about 0.8, about 0.9, about 1, about 2, about 4, about 6, about 8, or about 10 V/nm. In some embodiments, the breakdown field ($E_{max}$) of the device is at least about 0.1, at least about 0.2, at least about 0.3, at least about 0.4, at least about 0.5, at least about 0.6, at least about 0.7, at least about 0.8, at least about 0.9, at least about 1, at least about 2, at least about 4, at least about 6, at least about 8, or at least about 10 V/nm.

The active layer may comprise a high breakdown material such as titanium oxide, lithium oxide, lithium fluoride, silicon oxide, silicon nitride, silicon oxynitride, magnesium oxide, praseodymium oxide, aluminum oxide, diamond, hafnium oxide, or any combination thereof. In some cases, the active layer comprises few defects, impurities, voids, inclusions, substitutional defects, stacking faults, lattice strain mismatches, or any combination thereof. In some instances, the active layer has a permittivity that varies non-linearly with voltage.

In general, the energy stored in a device, E, may be determined by $E=a*C*V_{max}^2$, where a is ½ in the standard (Q=CV) case and a maximum of 1.0 if all of the area under the Q-V curve in FIG. 5 can be accessed. The volumetric energy density (p) may be written in terms of the field, $E_{max}$, and the average permittivity from E=0 to $E_{max}$, $\varepsilon_2$ according to Equation (3):

$$\rho = a*\varepsilon_2*E_{max}^2 \qquad (3)$$

Increasing the breakdown field that a device can tolerate may therefore make a quadratic contribution to the energy density.

In general, there are two mechanisms for breakdown of a material being (a) intrinsic breakdown and (b) extrinsic breakdown.

As used herein, intrinsic breakdown is when the high applied electric field causes electrons to be stripped from atoms in the perfect lattice and either migrate through the lattice resulting in a leakage current (soft breakdown) or collide with lattice atoms causing irreversible structural changes in the lattice and leading to an avalanche of current carrying electrons, heating and local structural changes (hard breakdown).

As used herein, extrinsic breakdown is when defects in the lattice act as centers for electron stripping and give rise to soft and/or hard breakdown. This mechanism generally has some dependence on the density of defects in the material.

Figure 7:
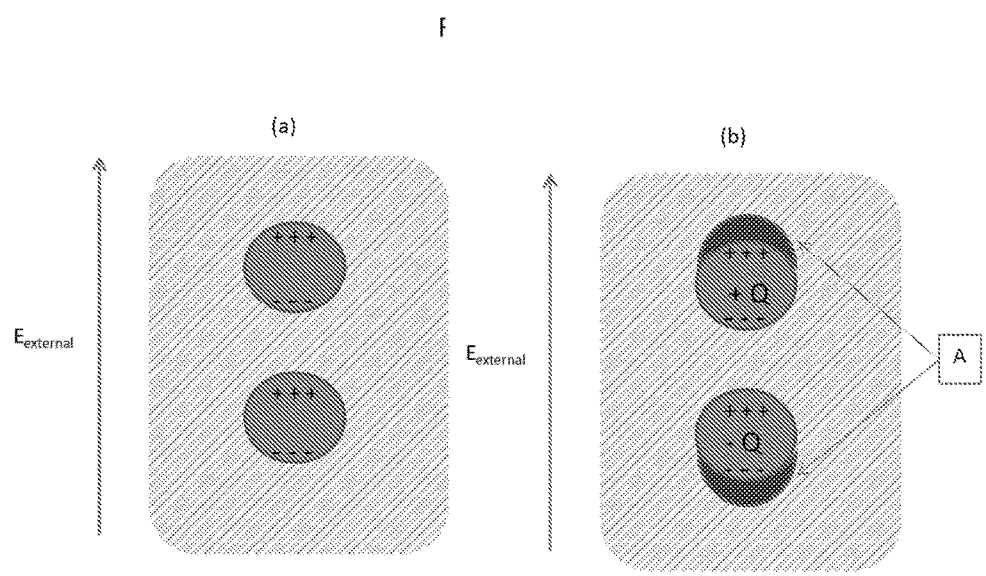
FIG. 7 schematically illustrates a QD pair in a state with an applied voltage less than the critical tunneling voltage (state A) and above the critical tunneling voltage (state B).

FIG. 7(a) shows a QD pair in a state with an applied voltage less than the critical tunneling voltage, e.g., state A in FIG. 5, and FIG. 7(b) shows a QD pair in a state with an applied voltage greater than the critical tunneling voltage. In the pre-tunneling state (FIG. 7(a)) the QDs are polarized by the applied field but no charges have transferred and the QDs are neutral. There are only small local fields in this situation. In the tunneled state (FIG. 7(b)) the QDs are polarized by the applied field and are also charged with equal and opposite charges Q. In this situation there may be high fields localized in the regions marked A in FIG. 7(b). The exact spatial extent of the high field regions may depend on the geometry of the QDs, the amount of charge transferred and the composition of the matrix in the high field regions.

In various embodiments, provided are devices having material characteristics that increase the maximum breakdown voltage a device can sustain. The devices may (1) use materials with intrinsically high breakdown strength (2) reduce the number of defects by using pure or nearly pure materials (3) reduce the number of defects in high field regions by concentrating the field in small regions of the material (4) use materials with high breakdown in regions of high field (5) use lattice matching to reduce strains and defects at the interface and/or (6) use graded permittivity in high field regions to minimize space charge, Fowler-Nordheim tunneling and other electrostatic effects and/or (7) provide architectures to localize potential breakdowns.

Use of Intrinsically High Breakdown Materials

In some instances, a high breakdown voltage is achieved for the device at least in part by using materials able to withstand a high breakdown voltage. The intrinsic breakdown values of the dielectric matrix material depend on the composition of the material, and the use of high breakdown materials can help increase the device breakdown voltage. Examples of dielectric matrix materials that may be used in the devices described herein include, without limitation, silica, praseodymium oxide, alumina, diamond, hafnium oxide and combinations thereof. Some suitable matrix materials are described in U.S. Patent Publication No. 2010/0183919, which is entirely incorporated herein by reference.

Figure 10:
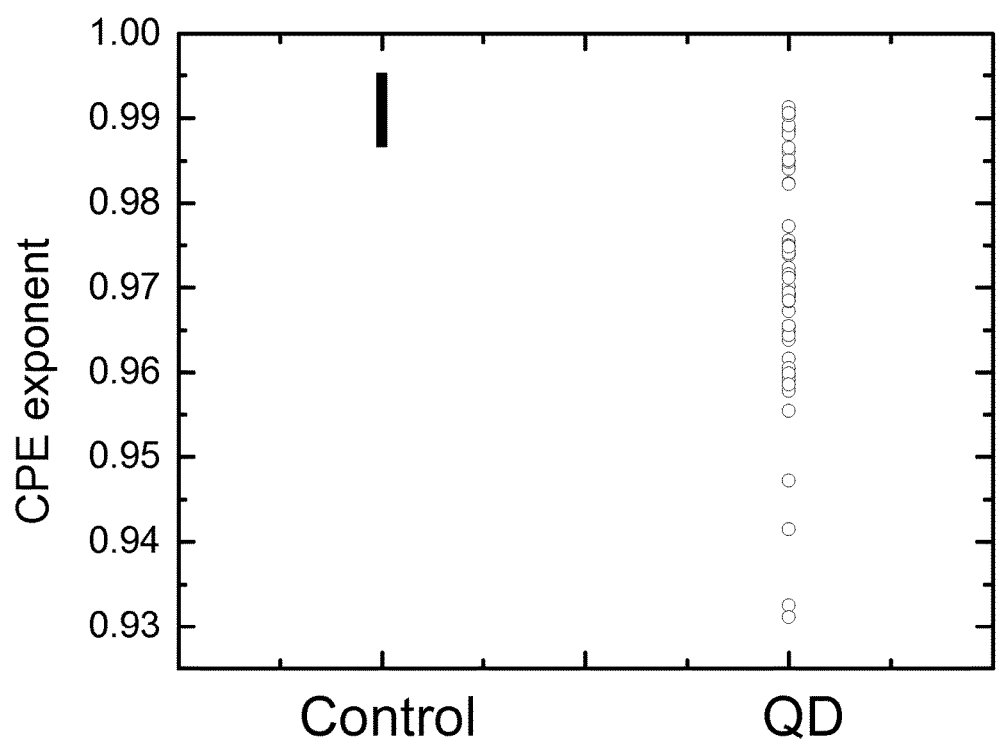
FIG. 10 shows a scatter plot of the exponent p in the equation $Z_{CPE}=(j\omega C)^{-p}$ for a control sample and a sample comprising quantum dots (QD) (p is 1.0 for an ideal capacitor).
Figure 11:
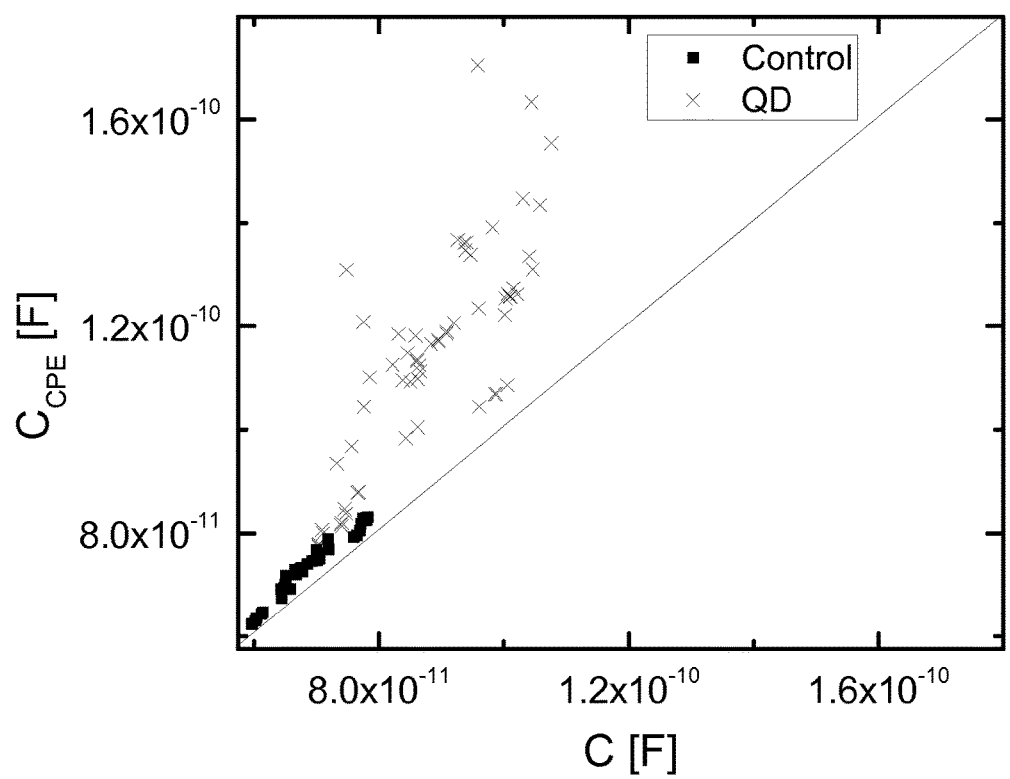
FIG. 11 shows a scatter plot of the sample constant-phase element capacitance versus the fit value of the sample ideal capacitance for a plurality of samples.
Figure 12:
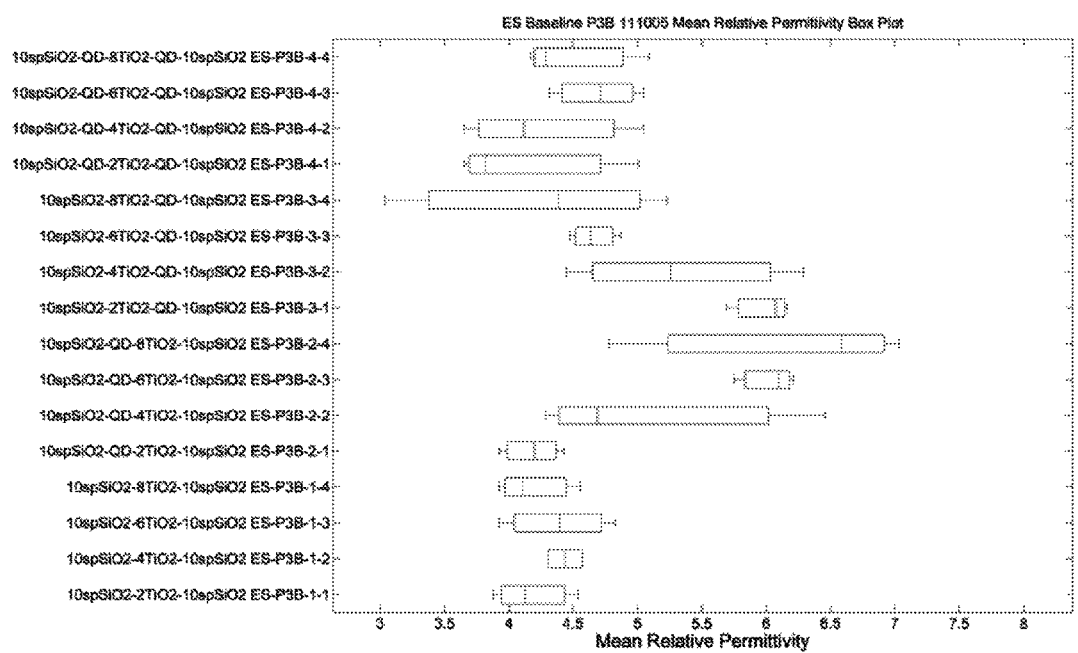
FIG. 12 shows the permittivity of samples including quantum dots versus control samples without quantum dots.
Figure 13:
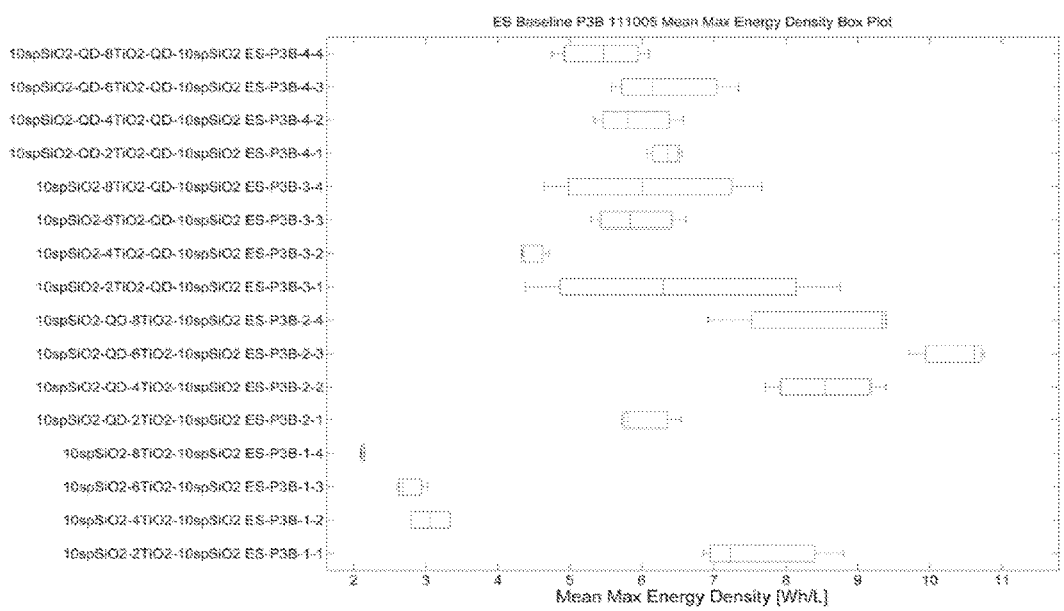
FIG. 13 shows the energy density of samples including quantum dots versus control samples without quantum dots.

The inclusion of QCS (e.g., QD) in a dielectric matrix can allow tunneling and enhance permittivity of the material. As seen in FIGS. 10-13, results for control devices (dielectric films only) and test devices (dielectrics embedded with QCS) show different behavior. FIGS. 10 and 11 show that control devices behave capacitively while devices embedded with QCS have charge transfers at a spread of different rates, which may be an indication of tunneling. FIG. 11 shows further that structures with embedded QCS have larger measured capacitance than a pure capacitor, while control samples are near an ideal capacitor. FIGS. 12 and 13 show relative permittivity and energy density respectively for a number of quantum dot devices, specifically showing that samples with embedded QCS have higher permittivity and energy density than control samples without QCS.

Use of Ultra-Pure Materials

In some instances, a high breakdown voltage is achieved for the device at least in part by using materials having a high purity. Generally, minimizing the number of defects in the dielectric matrix material can increase the breakdown voltage. Some embodiments of the devices described herein comprise a pure or substantially pure dielectric matrix material. In some embodiments, the matrix is highly pure. In some embodiments, the matrix material is at least 99%, at least 99.5%, at least 99.9%, at least 99.99%, at least 99.999%, at least 99.9999%, at least 99.99999%, or at least 99.999999% pure. In some embodiments, the matrix material is about 99%, about 99.5%, about 99.9%, about 99.99%, about 99.999%, about 99.9999%, about 99.99999%, or about 99.999999% pure. An impurity may be taken to mean an atomic impurity or a defect in a crystal structure.

Concentrating High Fields in Small Regions of the Material

Figure 8:
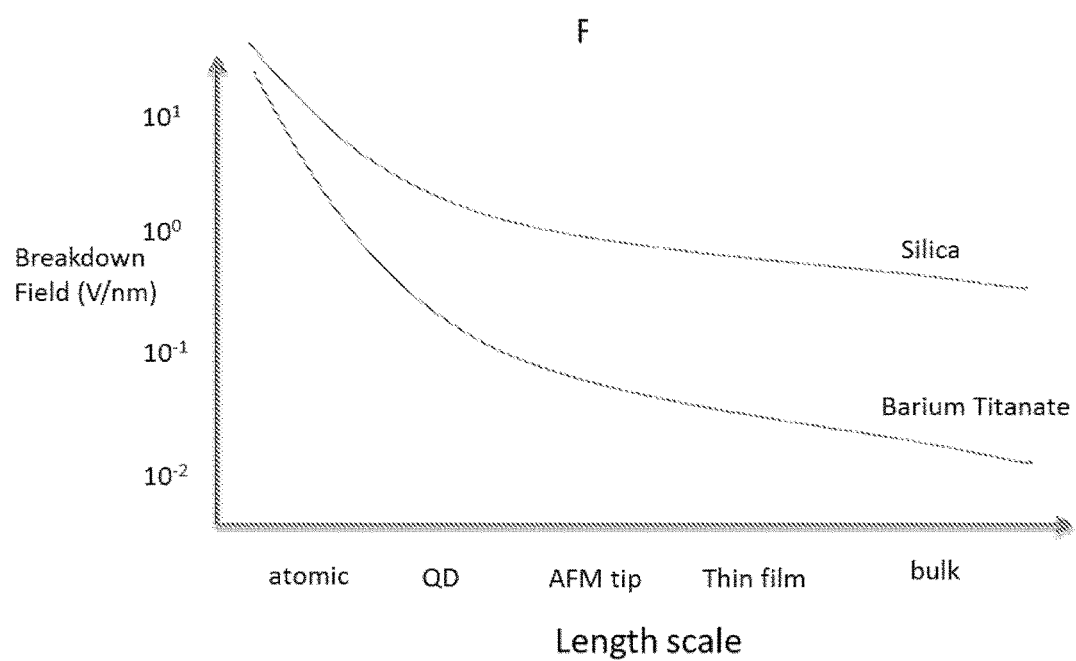
FIG. 8 shows a schematic of breakdown field versus length scale for silica and barium titanate.
Figure 9:
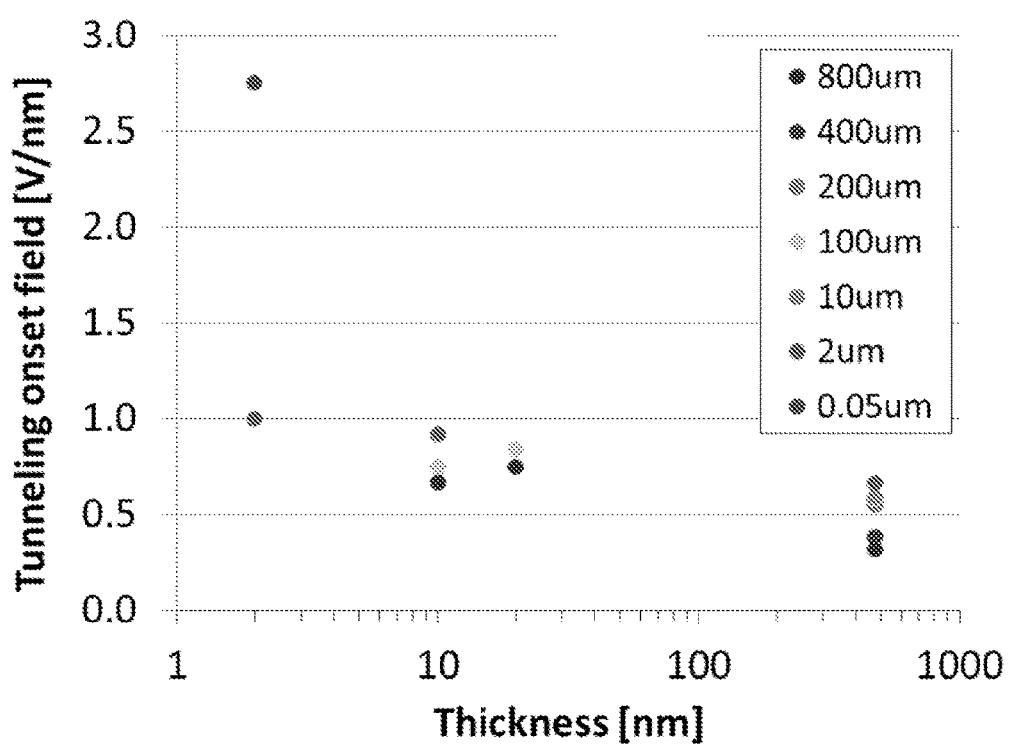
FIG. 9 shows a plot of breakdown field versus length scale for alumina.

In some instances, a high breakdown voltage is achieved for the device at least in part by concentrating high fields in small regions of the material. In general, materials can withstand higher local fields than can be sustained in bulk materials. For example, the curve in FIG. 8 shows sketches of curves of breakdown field versus length-scale for two exemplary materials. In some cases, breakdown field decreases as the absolute number of defects present in the volume of material exposed to the high field decreases. A material such as silica that can withstand about 1 V/nm in the bulk may, therefore, be able to withstand enhanced field at the length-scale of a quantum dot, i.e., the nanometer length-scale. By concentrating high fields in small regions of the material one may therefore be able to increase the breakdown voltage of the devices described herein. FIG. 9 shows data for breakdown field versus length-scale for measurements conducted on thin film $Al_2O_3$. The data is plotted versus film thickness and for characteristic length-scales over which the field is applied.

In an aspect, provided is a solid state energy storage device, comprising: (a) a first conductive electrode and second conductive electrode; and (b) an active layer between the first and second conductive electrodes, the active layer having one or more quantum confinement species (QCS) embedded in a matrix, wherein high electrical fields only occur in small regions of the device.

The small regions of the device can be small areas and/or small volumes of the device. In some instances the small regions are near and/or include the tips of the QCS. The field may be high and/or enhanced in this region. In some embodiments, the small region has an area of about 0.1 square micrometers ($\mu m^2$), about 0.5 $\mu m^2$, about 1 $\mu m^2$, about 5 $\mu m^2$, about 10 $\mu m^2$, about 50 $\mu m^2$, or about 100 $\mu m^2$. In some embodiments, the small region has an area of at most about 0.1 $\mu m^2$, at most about 0.5 $\mu m^2$, at most about 1 $\mu m^2$, at most about 5 $\mu m^2$, at most about 10 $\mu m^2$, at most about 50 $\mu m^2$, or at most about 100 $\mu m^2$. In some embodiments, the small region has a volume of about 0.1 $\mu m^3$, 0.1 $\mu m^3$, about 0.5 $\mu m^3$, about 1 $\mu m^3$, about 5 $\mu m^3$, about 10 $\mu m^3$, about 50 $\mu m^3$, or about 100 $\mu m^3$. In some embodiments, the small region has a volume of at most about 0.1 $\mu m^3$, at most about 0.5 $\mu m^3$, at most about 1 $\mu m^3$, at most about 5 $\mu m^3$, at most about 10 $\mu m^3$, at most about 50 $\mu m^3$, or at most about 100 $\mu m^3$.

The field strength can be above any suitable threshold only in a small region of the device. In some embodiments, the field strength threshold is about 0.1 volts (V)/nanometer (nm), about 0.5 V/nm, about 1 V/nm, about 2 V/nm, about 3 V/nm, about 4 V/nm, about 5 V/nm, or about 10 V/nm. In some embodiments, the field strength threshold is greater than about 0.1 V/nm, greater than about 0.5 greater than about V/nm, greater than about 1 V/nm, greater than about 2 V/nm, greater than about 3 V/nm, greater than about 4 V/nm, greater than about 5 V/nm, or greater than about 10 V/nm.

In some embodiments, the device has a field strength greater than about 1 V/nm only in areas less than about 1 $\mu m^2$, the device has a field strength greater than about 1 V/nm only in volumes less than about 1 $\mu m^3$, the device has a field strength greater than about 2 V/nm only in areas less than about 100 $nm^2$, and/or the device has a field strength greater than about 2 V/nm only in volumes less than about 1000 $nm^3$.

In some cases, the QCS have a diameter less than about 20 nm. The matrix can comprise a high breakdown material such as titanium oxide, lithium oxide, lithium fluoride, silicon oxide, silicon nitride, silicon oxynitride, magnesium oxide, praseodymium oxide, aluminum oxide, diamond, hafnium oxide, or any combination thereof. In some cases, the QCS are shaped so as to have a high separation of the tunneled charges and a low distance between QCS.

Figure 14:
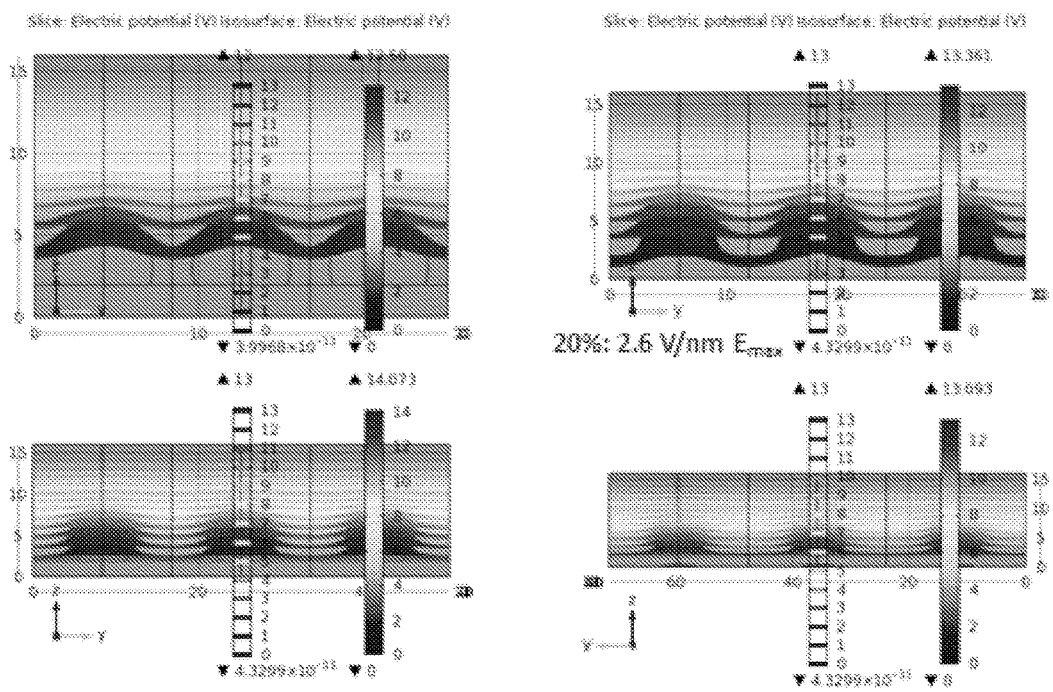
FIG. 14 shows isopotential surfaces for layers of quantum dots as a function of areal density.

FIG. 14 shows modeling results demonstrating the iso-potential surfaces for layers of quantum dots as a function of areal density of the quantum dots. As the areal coverage of QDs increases from 5% (a level at which only a small fraction of the overall device volume is exposed to high fields, and therefore contributes significantly to energy storage) to 40%, there is a transition from behavior similar to isolated QDs to behavior similar to planar quantum wells (QW). Fields similar to that produced by a QW are effectively established once the QDs reach an areal density of 20%. This illustrates an embodiment of exposing a high fraction of the volume to high fields while isolating breakdown regions to the nanoscale where breakdown tolerance is high.

Figure 15:
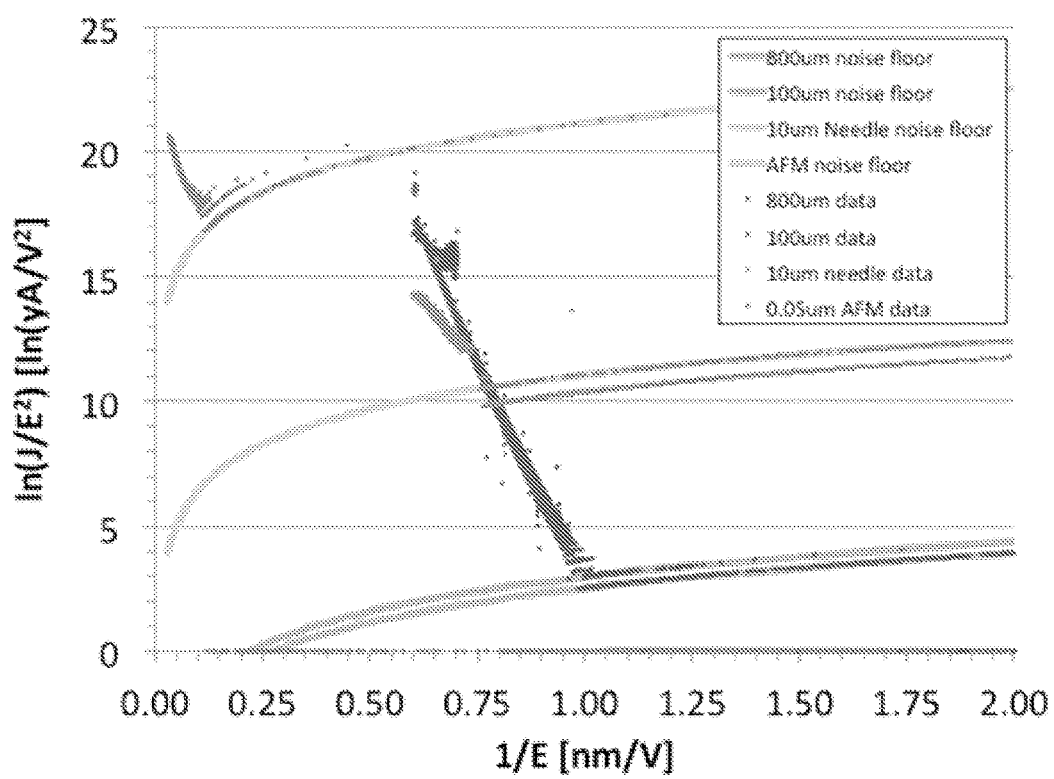
FIG. 15 shows current-voltage data on breakdown tolerance of $SiO_2$ on different size scales, plotted to show a Fowler-Nordheim tunneling dependence.

FIG. 15 shows exemplary data of nanoscale breakdown field tolerance. Calculations show that hard breakdown in $SiO_2$ can onset at fields as high as 80 V/nm if the material is crystalline and defect-free. Calculations show an onset of soft breakdown at fields of 20 V/nm for electron tunneling in $SiO_2$. A relationship was developed predicting that higher breakdown voltages could be sustained at the nanoscale versus the bulk scale. Experimental results as shown in FIG. 15 show that the field before onset of Fowler-Nordheim tunneling is higher at smaller probe size.

Use of Materials with Intrinsically High Breakdown in Regions of High Field

In some instances, a high breakdown voltage is achieved for the device at least in part by using materials having a high breakdown voltage in regions of high field. As shown in FIG. 7(b) the areas on highest field are concentrated in regions A. Using materials with intrinsically high breakdown in this region may help suppress overall breakdown. High breakdown materials that may be used include, without limitation, silica, silicon oxynitride, praseodymium oxide, alumina, diamond, and Hafnium oxide. Some suitable matrix materials are described in U.S. Patent Publication No. 2010/0183919, which is entirely incorporated herein by reference.

An aspect of the invention provides a solid state energy storage device comprising: (a) a first conductive electrode and a second conductive electrode; and (b) an active layer between the first and second conductive electrodes, the active layer having one or more quantum confinement species (QCS) embedded in a matrix, wherein the active layer comprises a material having a high breakdown field ($E_{max}$) in one or more high-field regions of the device.

The breakdown field can be any suitably high value. In some embodiments, the high-field regions of the device have field strength of about 0.1 V/nm, about 0.5 V/nm, about 1 V/nm, about 2 V/nm, about 3 V/nm, or about 5 V/nm. In some embodiments, the high-field regions of the device have field strength of at least about 0.1 V/nm, at least about 0.5 V/nm, at least about 1 V/nm, at least about 2 V/nm, at least about 3 V/nm, or at least about 5 V/nm.

In some instances, the material comprises silica, silicon nitride, silicon oxynitride, lithium oxide, magnesium oxide, lithium fluoride, praseodymium oxide, alumina, diamond, hafnium oxide, or any combination thereof.

In addition, including voids in the high breakdown regions may help suppress overall breakdown. This may be achieved, for example using buckyballs, nanotubes or zeolites including any combination thereof.

Use of Lattice Matching

In some instances, a high breakdown voltage is achieved for the device at least in part by matching the lattices of the QCS (e.g., QDs) and surrounding matrix material. In the tunneled state the highest fields generally occur at the interfaces between the charged QDs and the immediately surrounding matrix. If the lattices of the QDs and surrounding matrix are incommensurate this may lead to local deformation strains which may act as weak-spots for initiating breakdown. Matching the lattices of the QD and surrounding matrix material may reduce lattice strain and therefore potentially reduce breakdown. Possible methods of lattice matching include having QDs of doped semiconductor embedded in a matrix of the undoped semiconductor. Other lattice matching methods include using layers intrinsically well matched or depositing stressed layers.

Figure 16:
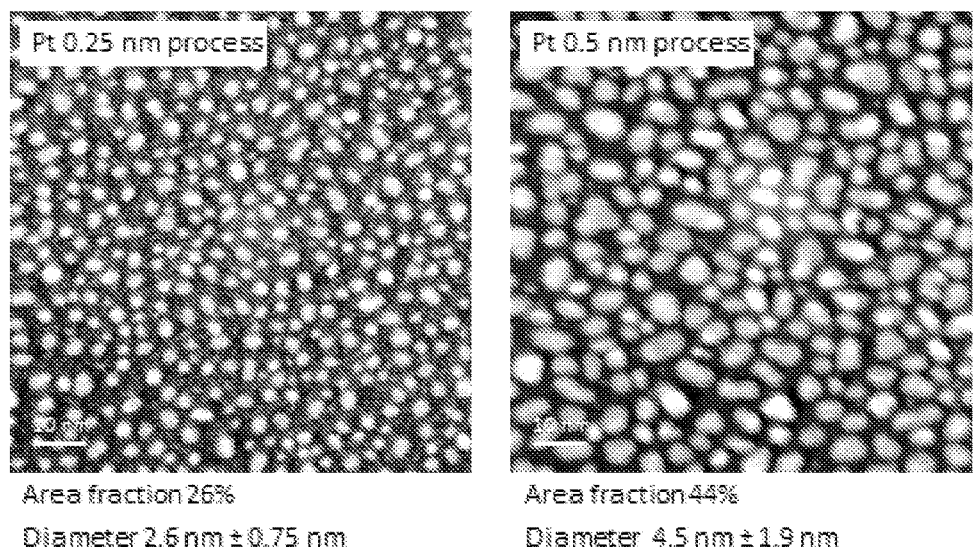
FIG. 16 shows transmission electron micrographs of platinum quantum dots deposited on a silica substrate.
Figure 17:
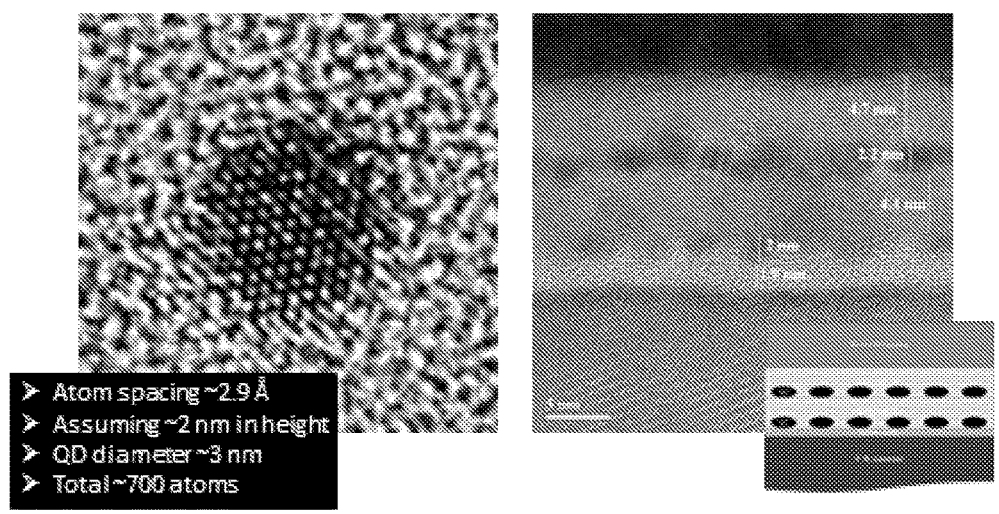
FIG. 17 shows transmission electron micrographs of individual and layers of quantum dots embedded in a titanium dioxide matrix.

The quantum dots (an example of a QCS) can be manufactured in any suitable way. In some instances, the deposition of QCS is controlled with the aid of deposition techniques, such as, for example, physical vapor deposition (e.g., sputtering). FIGS. 16 and 17 show examples of the control of QCS deposition by sputtering of metals on dielectrics. FIG. 16 shows transmission electron microscopy (TEM) micrographs of platinum quantum dots deposited on a silica substrate. FIG. 17 shows TEM micrographs of individual and layers of quantum dots embedded in a titanium dioxide matrix. In some instances, the QCS and matrix have the same crystal structure. In some cases, the QCS and matrix are epitaxially grown. In some embodiments, the active layer QCS form in situ by depositing stressed layers.

In some embodiments, the QCS are substantially evenly dispersed in the matrix. In some cases, the distances between the QCS can be controlled. In some embodiments, the standard deviation of the distances between QCS is at least about 10%, about 5%, about 4%, about 3%, about 2%, about 1%, about 0.5%, about 0.1%, about 0.05%, about 0.01%, or about 0.005% of the average distance between the QCS. In some embodiments, the standard deviation of the distances between QCS is at most about 10%, at most about 5%, at most about 4%, at most about 3%, at most about 2%, at most about 1%, at most about 0.5%, at most about 0.1%, at most about 0.05%, at most about 0.01%, or at most about 0.005% of the average distance between the QCS.

In some embodiments, the QCS and matrix (e.g., doped and undoped semiconductor materials) have a low level of lattice mismatch (e.g., are intrinsically well matched layers). In some embodiments, the amount of lattice mismatch is less than about 10%, less than about 9%, less than about 8%, less than about 7%, less than about 6%, less than about 5%, less than about 4%, less than about 3%, less than about 2%, or less than about 1%. In some embodiments, the amount of lattice strain is less than about 10%, less than about 9%, less than about 8%, less than about 7%, less than about 6%, less than about 5%, less than about 4%, less than about 3%, less than about 2%, or less than about 1%.

In another aspect, described herein is a solid state energy storage device, comprising: (a) a first conductive electrode and second conductive electrode; and (b) an active layer between the first and second conductive electrodes, the active layer having one or more quantum confinement species (QCS) embedded in a matrix, wherein the QCS are substantially evenly dispersed in the matrix. In some instances, the QCS and the matrix comprise a substantially crystalline lattice.

Use of Graded Permittivity

In some instances, a high breakdown voltage is achieved for the device at least in part by using a matrix that comprises one or more materials having a permittivity gradient in the region surrounding the QCS. For example, a solid state energy storage device can comprise: (a) a first conductive electrode and second conductive electrode; and (b) an active layer between the first and second conductive electrodes, the active layer having one or more quantum confinement species (QCS) embedded in a matrix, wherein the matrix comprises one or more materials having a permittivity gradient in the region surrounding the QCS.

The strength of the field in a region of material may depend on the spatial rate of change of the dielectric constant in that region. Abrupt changes in dielectric constant may produce high fields. More gradual changes in dielectric constant may produce lower fields. Use of a permittivity gradient in the region surrounding the QDs may therefore help reduce the local fields and reduce the rate of breakdown. In addition a graded permittivity matrix in the high field regions may help minimize Fowler-Nordheim type soft breakdown.

Figure 18:
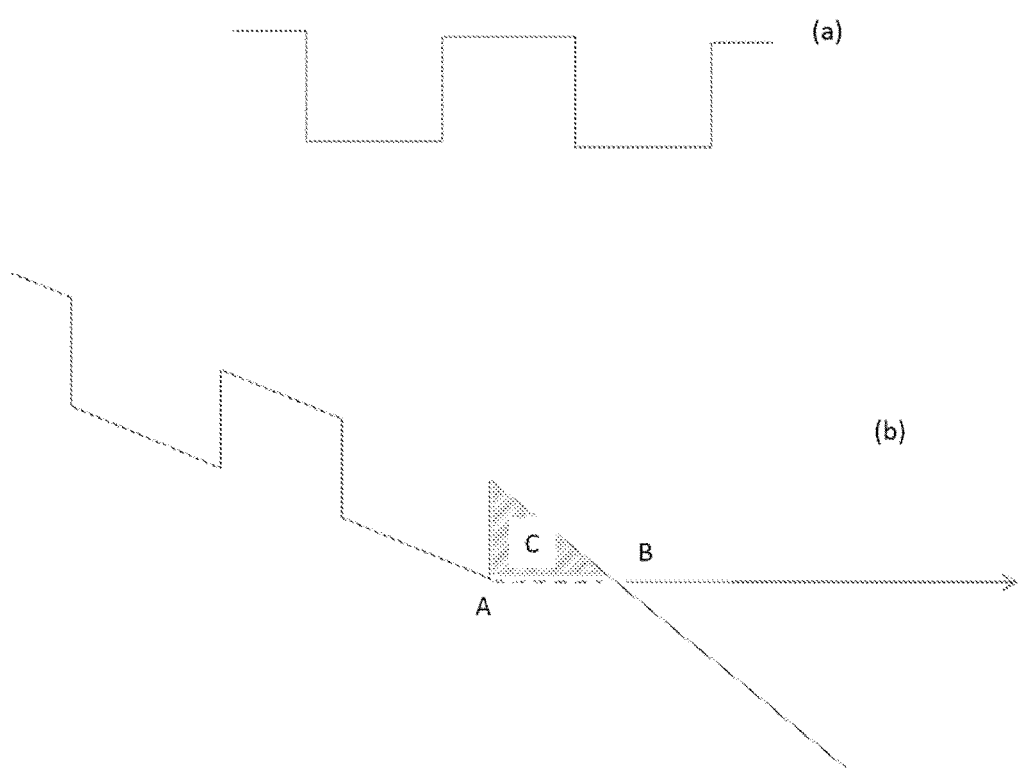
FIG. 18 schematically illustrates the Fermi energy of a QD pair embedded in a matrix with no applied field (a) and under an applied field (b), with a capping layer (A) in no applied field (c) and with an applied field (d). "C" denotes a tunneling barrier.
Figure 18:
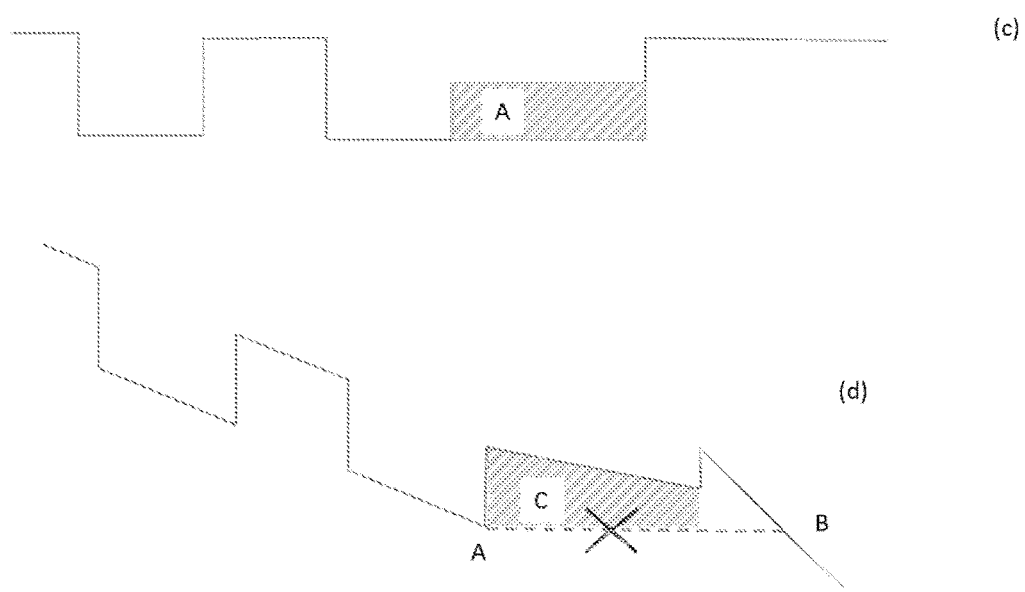
Figure 18:
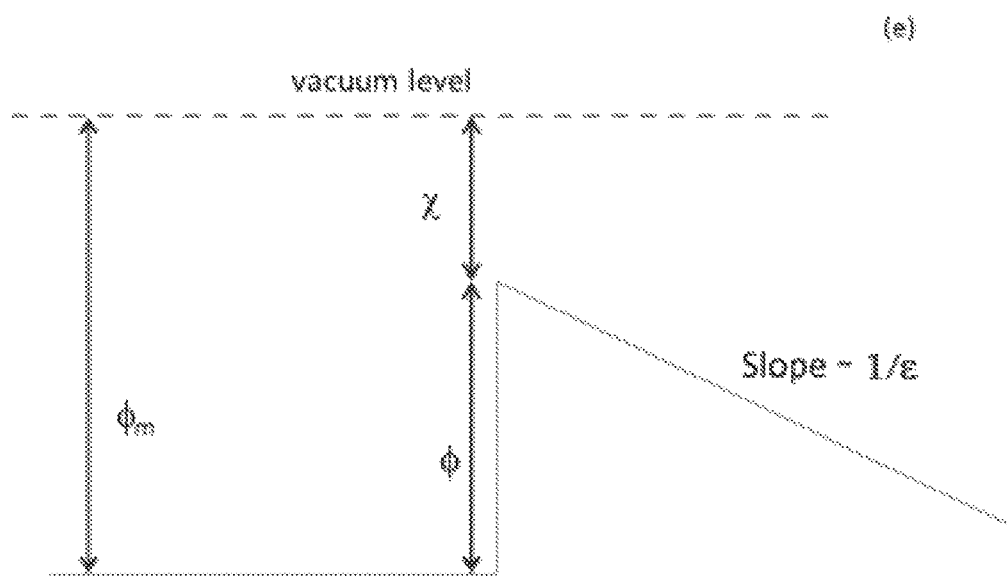

FIG. 18 shows the Fermi energy of a QD pair embedded in a matrix. FIG. 18(a) shows the energy levels in the absence of a field and FIG. 18(b) shows the energy levels in the presence of a field. In the presence of a high enough field tunneling may occur from point A in FIG. 18 to point B at which time the tunneled electron is free to propagate through the matrix. The rate of tunneling depends exponentially on the area of the tunneling barrier denoted as C in FIG. 18(b). FIG. 18(c) shows the QD pair with a capping layer at A with higher epsilon than the matrix and lower barrier than the matrix. FIG. 18(d) shows this system with an applied field. In this case the enhanced barrier at C due to the higher dielectric constant (and therefore a lower gradient in conduction band energy due to the applied field) can suppress tunneling from A to B.

The capping layer bandgap and permittivity can be chosen to provide a higher barrier to electron tunneling than the matrix. The capping layer may comprise a plurality of material layers having a permittivity that decreases as the distance from the QCS increases. In some embodiments, the capping layer has a higher permittivity than the matrix.

In some embodiments, the device further comprises a capping layer between the electrodes and the active layer. In some cases, the permittivity gradient reduces the amount of Fowler-Nordheim tunneling in the device.

Without limitation, there can be more than one capping layer. In some embodiments, a first capping layer lies between a first electrode and a first QCS, and a second capping layer lies between a second electrode and a second QCS.

Figure 25:
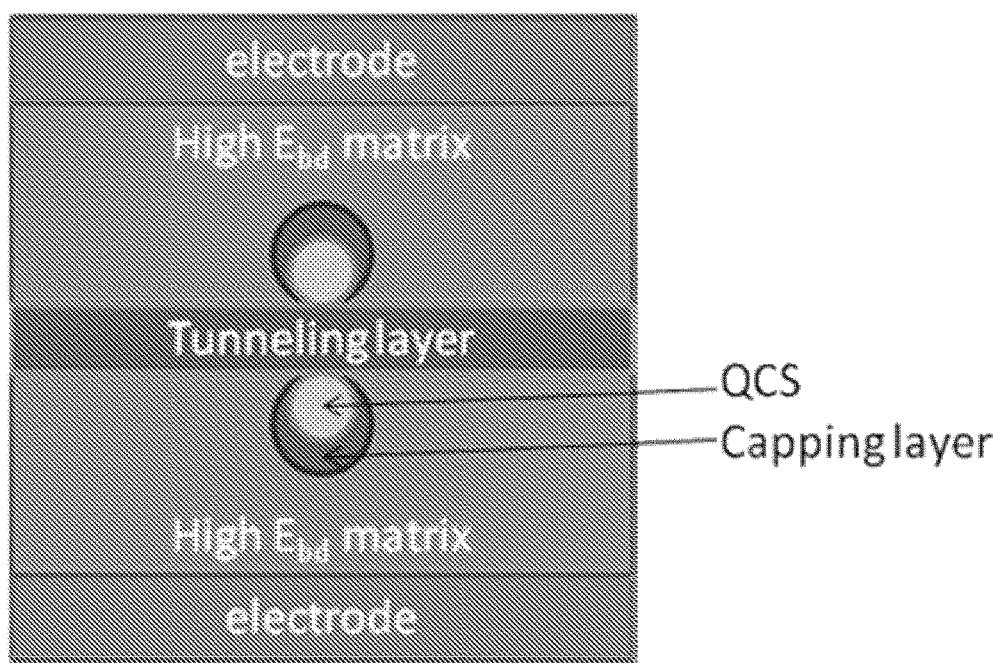
FIG. 25 schematically illustrates an exemplary device with a capping layer.
Figure 26:
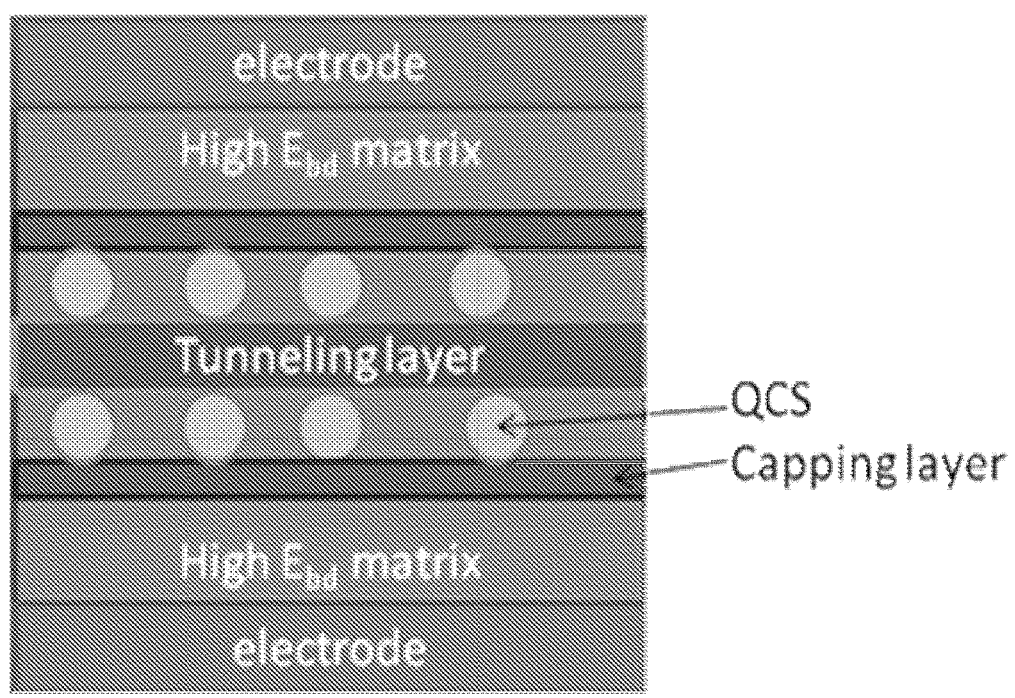
FIG. 26 schematically illustrates another exemplary device with a capping layer.

FIG. 25 and FIG. 26 schematically illustrate exemplary devices with capping layers. The device of FIG. 25 includes QCS having a core QCS material and a capping layer at least partially circumscribing the core QCS material. The QCS are in a matrix having a high breakdown voltage ($E_{bd}$). The device of FIG. 26 includes a plurality of QCS in a matrix, and a capping layer separating the matrix and another matrix having a high $E_{bd}$.

The energy level diagram for an exemplary capping layer is shown in FIG. 18(e). $\phi_m$ is the work function of the QD, $\chi$ is the electron affinity of the capping layer and $\varepsilon$ is the permittivity of the capping layer. The barrier height for the capping layer, $\phi$, can be approximately equal to $\phi_m-\chi$. In some materials combinations, the barrier height is much lower than $\phi_m-\chi$, which is disadvantageous since a high barrier height is desired. The barrier height may be closer to $E_g/2$, where $E_g$ is the bandgap of the capping layer. This effect is due to Fermi level pinning at the interface between metals and semiconductors or insulators.

Multiple capping layers can use used in which case capping layers are chosen so that the permittivity of the capping layer decreases as distance from the QD and barrier height increases.

Engineering the Fermi Level Pinning at the QD/Dielectric Interface to Increase the Effective Barrier Height.

The barrier height may be raised by de-pinning the Fermi level, for example, by including a very thin interfacial layer that does not create a pinned interface with the metal (e.g. $SiN_x$). Fermi level depinning is explained in "Fermi level depinning for the design of II-V FET source/drain contacts" by Hu et. al., International Symposium on VLSI Technology, Systems and Applications (2009), pgs 123-124, which is entirely incorporated by reference herein.

In some instances, a metal Fermi level may be pinned at an interface with a semiconductor or insulator. Pinning may set the barrier height for FN tunneling, as the barrier height is the difference between the metal Fermi level and the conduction band of the dielectric. Some techniques that may be used to modify the pinned level include introducing an interface modification layer, treating the interface chemically, removing or passivating defects at the interface, etc. As described herein, one may wish to attain a high barrier height, so could introduce modifications to lower the pinned Fermi level. One may use any suitable metal material, dielectric material, defect density, etc. One example is to anneal the dielectric in $O_2$ to reduce the vacancies at the interface, which increases the barrier height. A higher barrier may reduce FN tunneling, which increases the maximum field that can be applied across the device, which increases the energy density of the device.

In some instances, the device further comprises an interfacial layer between the QCS and the matrix that does not result in Fermi level pinning at the interfacial layer. In some embodiments, the device further comprises an interfacial layer between the QCS and the matrix that results in Fermi level pinning to increase the barrier height between the QCS and the matrix. The interface between the QCS and the matrix may be treated to unpin the QCS Fermi level relative to the matrix energy gap (e.g., heated, chemical treatments, and the like). In some cases, the interface between the QCS and the matrix is treated to pin the QCS Fermi level relative to the matrix energy gap so as to increase the effective barrier height between the QCS and the matrix.

A method for forming a solid state energy storage device, comprising providing a first conductive electrode and second conductive electrode, and an active layer between the first and second conductive electrodes, the active layer having one or more quantum confinement species (QCS) embedded in a matrix, wherein the matrix is annealed in an oxidizing environment. In some cases, the oxidizing environment comprises $O_2$ and/or $NO_x$. The annealing may reduce the defect concentration in the matrix. In some cases, annealing changes the effective barrier height for electron tunneling from the QCS to the matrix.

Creating Dipoles at the QD/Dielectric Interface to Increase the Effective Barrier Height.

Interfacial dipole layers may also be created to increase the effective barrier height—See, for example, R. T. Tung, Phys Rev B, 64 (2001) 205310, which is entirely incorporated herein by reference. In an example of the devices described herein, a first capping layer A may be used with a high areal density of oxygen (or high chemical potential of oxygen, or low enthalpy of formation of oxygen vacancies), and a second capping layer B with a lower areal density of oxygen (or low chemical potential of oxygen, or high enthalpy of formation of oxygen vacancies). Without being bound by theory we hypothesize that, at the interface oxygen can transfer from material A to B, creating an interfacial charge that is positive in A and negative in B, raising the conduction band in B to create a higher barrier.

In some cases, at least one interfacial layer between at least one QCS and at least one matrix layer comprise a dipole that increases the effective barrier height between the QCS and matrix layer. The dipole can be created in any suitable way. In some embodiments, the interfacial layer is created by contacting: (a) a first layer comprising at least one of (a) a high areal density of oxygen, (b) a high chemical potential of oxygen, and (c) a low enthalpy of formation of oxygen vacancies; and (b) a second layer comprising at least one of (a) a low areal density of oxygen, (b) a low chemical potential of oxygen, and (c) a high enthalpy of formation of oxygen vacancies. The second layer can be any one of the QCS, the matrix or the interfacial layer.

In another aspect, the invention provides a solid state energy storage device comprising: (a) a first conductive electrode and second conductive electrode; and (b) an active layer between the first and second conductive electrodes, the active layer having one or more quantum confinement species (QCS) embedded in a matrix, wherein the active layer comprises an interfacial dipole.

In some embodiments, the interfacial dipole is between an interfacial oxide layer and a matrix oxide. In some instances, the interfacial dipole increases the effective barrier height for electron tunneling from the QCS to the matrix.

Dipoles may be formed at the interface of two dissimilar materials. Dipoles may be intentionally engineered to increase the effective barrier height. See, e.g., K. Kita et al., Appl. Phys. Lett. 94, 132902 (2009); and M. Charbonnier et al., Microelectronic Engineering, vol. 86, issue 7-9, pp. 1740-1742 (2009), which are entirely incorporated herein by reference. A higher barrier reduces FN tunneling, which increases the maximum field that can be applied across the device, which increases the energy density of the device. One example of interfacial dipole formation is that of an oxide and a metal due to transfer of oxygen. Oxygen tends to be transferred from materials with relatively higher surface concentration of oxygen to those with relatively lower surface concentration of oxygen, or from materials with weak binding of oxygen to those with relatively stronger binding of oxygen. Oxygen transfer creates an effective dipole from the first material (with the excess oxygen concentration) towards the second material (with the oxygen vacancy); the first material with a higher oxygen concentration can have an increased conduction band level. Therefore, band engineering such as that shown below can be used to retard FN tunneling and therefore store more energy.

Use Architectures to Localize Breakdown

In some instances, a high breakdown voltage is achieved for the device at least in part by using a plurality of alternating dielectric layers and conductive layers between the electrodes.

In some instances, the absolute number of defects in the dielectric material decreases as the thickness of a film of the matrix decreases. It may therefore be advantageous to use thin films of the dielectric material between conducting layers as shown in FIG. 19.

Figure 19A:
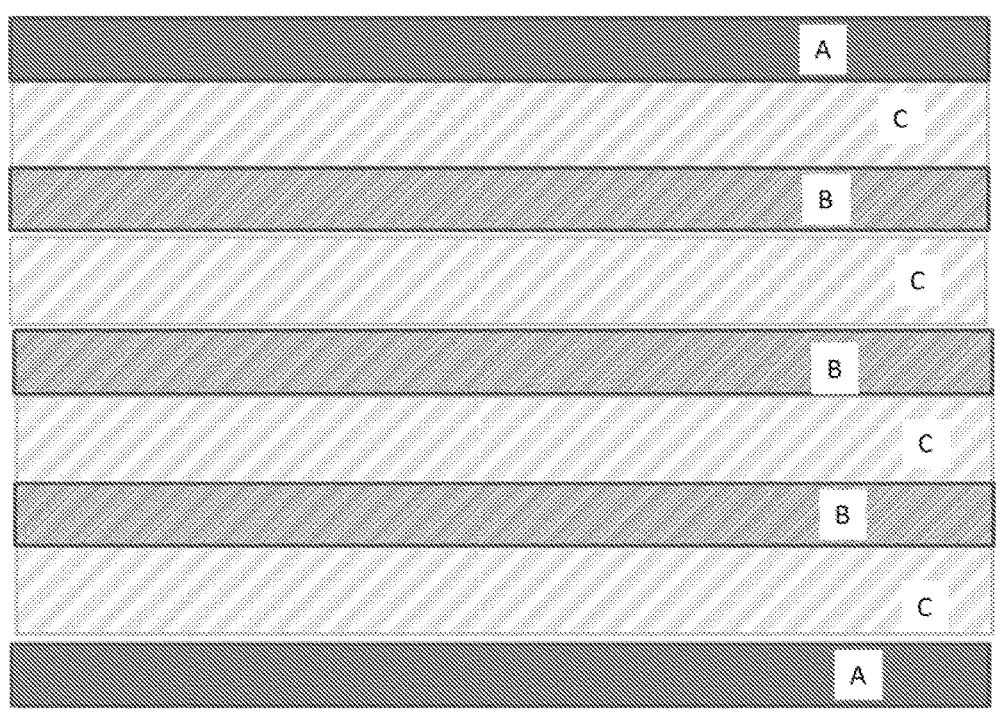
FIG. 19(a) shows a device comprising alternating layers of conducting material B and dielectric material C, between electrodes A.
Figure 19B:
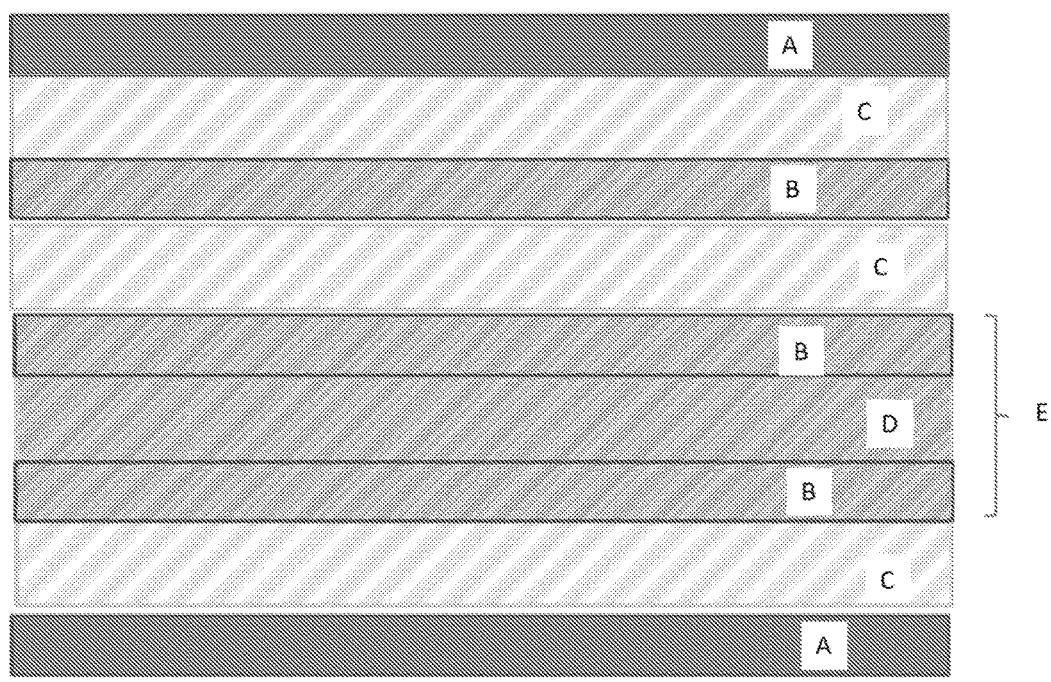
FIG. 19(b) shows a device comprising alternating layers of conducting material B and dielectric material C, between electrodes A in which layer D has broken down and forms new conducting layer E.

FIG. 19(a) shows a device comprising alternating layers of conducting material B and dielectric material C, between electrodes A. The layers of dielectric material C may be formed of the same dielectric material C or different dielectric materials. The layers of conducting material B may be formed of the same conducting material B or different conducting materials. In an example of such layered devices the dielectric material C comprises a dielectric matrix material and embedded QD species. In another example the dielectric material C comprises a dielectric matrix material. As shown in FIG. 19(a) the volume of each individual dielectric material layer is less than the full volume between the electrodes and the absolute number of defects in each layer is therefore reduced and the breakdown may be reduced. An additional advantage of such architecture is that if there is breakdown in one of the layers it may not propagate throughout the device but any electrons migrating through the matrix in the broken-down layer can be absorbed by the first conducting layer they encounter and cannot propagate further though the matrix. In this case the layer which has broken down can become conducting and the device can lose contribution from just one of the dielectric material layer. This situation is shown in FIG. 19(b) in which layer D has broken down and forms new conducting layer E. A further advantage of this structure is that it mitigates damage from hot carriers. Electrons in the conduction band or holes in the valence band may be accelerated by the applied electric field and gain energy. If the acceleration occurs over a large distance, they will gain a substantial amount of energy before they collide, and the damage of the collision will be greater than cases in which they collide with less energy. In the structures shown in FIG. 19, the dielectric layers are thin enough so as to aid in preventing the charges from gaining a substantial amount of energy.

In another aspect, described herein is a solid state energy storage device, comprising: (a) a first conductive electrode and second conductive electrode; and (b) a plurality of alternating dielectric layers and conductive layers between the electrodes. In some cases, the breakdown field ($E_{max}$) of the device is high. In some instances, at least one of the dielectric layers comprise QCS.

The breakdown field ($E_{max}$) of the device can be any suitably high value. In some embodiments, the breakdown field ($E_{max}$) of the device is about 0.1, about 0.2, about 0.3, about 0.4, about 0.5, about 0.6, about 0.7, about 0.8, about 0.9, about 1, about 2, about 4, about 6, about 8, or about 10 V/nm. In some embodiments, the breakdown field ($E_{max}$) of the device is at least about 0.1, at least about 0.2, at least about 0.3, at least about 0.4, at least about 0.5, at least about 0.6, at least about 0.7, at least about 0.8, at least about 0.9, at least about 1, at least about 2, at least about 4, at least about 6, at least about 8, or at least about 10 V/nm.

The dielectric layers can have any suitable thickness. In some embodiments, the dielectric layers are about 0.01 µm, about 0.05 µm, about 0.1 µm, about 0.5 µm, about 1 µm, about 5 µm, about 10 µm, or about 50 µm thick. In some embodiments, the dielectric layers are less than about 0.01 µm, less than about 0.05 µm, less than about 0.1 µm, less than about 0.5 µm, less than about 1 µm, less than about 5 µm, less than about 10 µm, or less than about 50 µm thick.

Increasing Energy Density by Increasing Permittivity in the "Tunneling" State

The energy density, ρ, is given by Equation (3):

$$\rho = a * \varepsilon_2 * E_{max}^2 \qquad (3)$$

where $\varepsilon_2$ is the permittivity of the material in the "tunneling" state. Increasing the permittivity in the tunneling state can make a linear contribution to the energy density. This may be significant, as dielectric constants are known to vary over at least five orders of magnitude.

Described herein are devices with the following material characteristics that may increase the permittivity in the tunneled state, i.e., increasing $\varepsilon_2$: (1) taking advantage of Clausius-Mossotti type collective coupling of the embedded tunneling species (2) designing geometries for the QD pairs (3) choice of materials for the QD pairs (4) using a matrix with non-linear permittivity, (5) having tunneling species with permanent dipole moments and (6) using high permittivity matrix in high field regions.

Clausius-Mossotti Type Coupling

In an embodiment, an energy storage device comprises a dielectric material that comprises a number of embedded species in a dielectric matrix, where the embedded species have a number density N (i.e., N species per unit volume). If an isolated embedded species has a linear electrical polarizability of α, in a local field of $E_{loc}$ the species can have a dipole moment, p, given by Equation (4):

$$p = \alpha E_{loc} \qquad (4)$$

At low values of Nα the overall permittivity of the material may be calculated by adding the contribution from the matrix and from each individual embedded species. At higher values of Nα, the local field felt by an embedded species generally depends not only on the externally applied field but also on the fields generated by the dipoles fields of the neighboring embedded species. As Nα approaches a critical value, the overall permittivity of the material can be enhanced by several orders of magnitude. Providing embedded species with a given Nα can allow large increases in $\varepsilon_2$.

Some structures generate high fields. Some modeling techniques were designed to investigate the interactions between coupled dipoles, also known as Clausius-Mossotti interactions, at nano-scales where continuum modeling assumptions break down. The effect of dimensionality of the coupled dipoles as well as the dipole strength and spacing can be understood using several different approaches.

Figure 20:
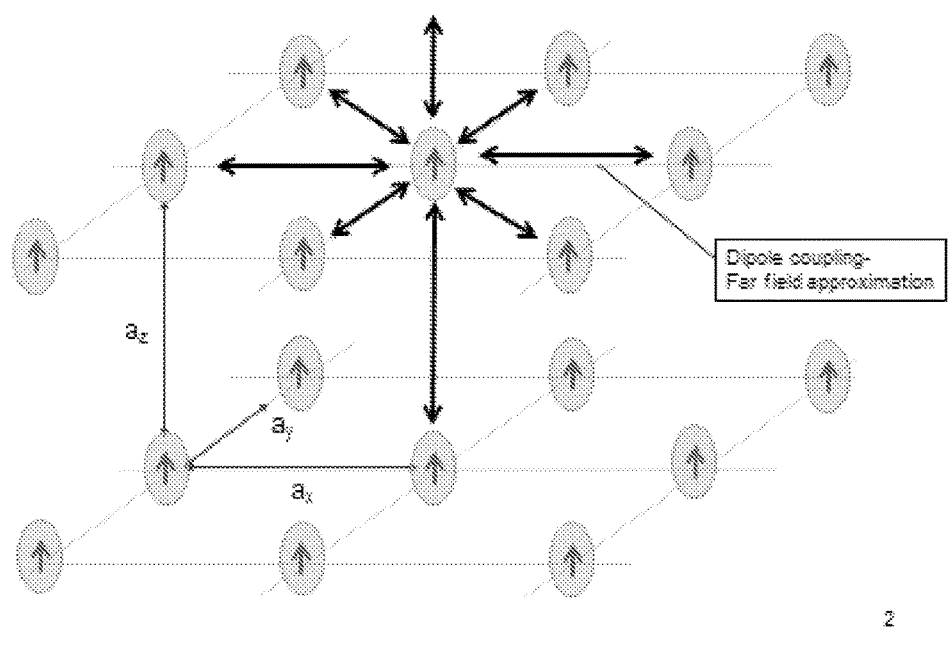
FIG. 20 shows a schematic geometry for extended Clausius-Mossotti model where the applied field and polarization is in the z direction.
Figure 21:
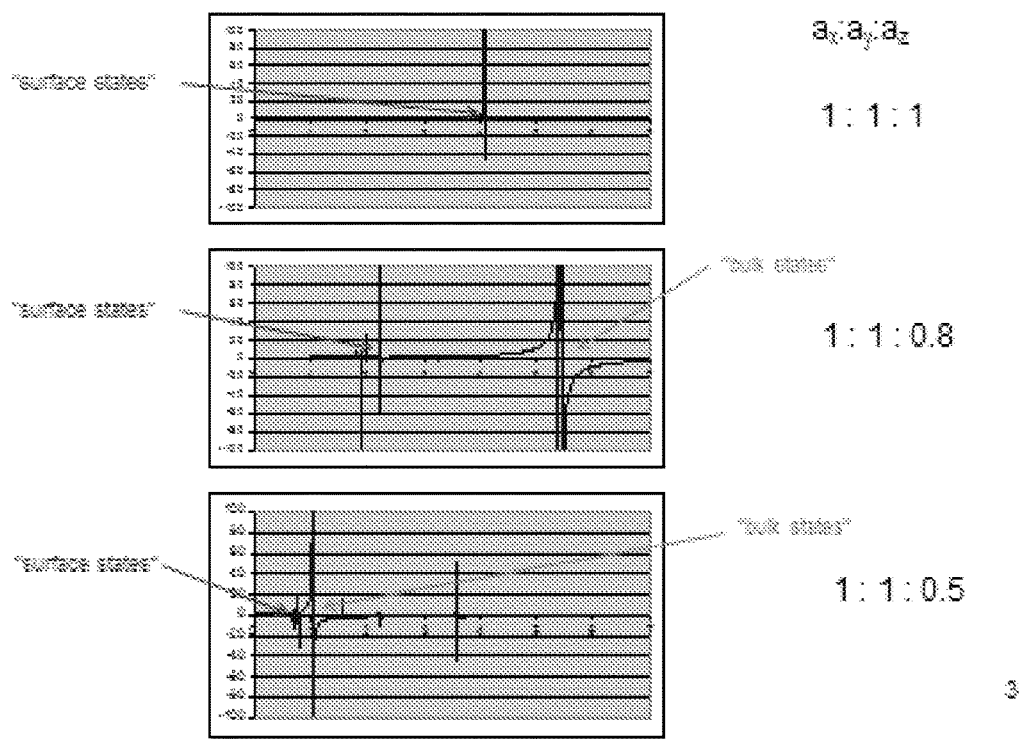
FIG. 21 shows the polarizability of the model system as a function of the dimensionless Clausius-Mossotti parameter.
Figure 22:
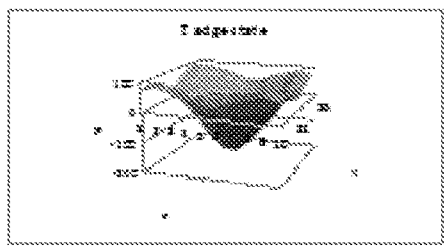
FIG. 22 shows the polarization of specific component dipoles as a function of position and the dimensionless Clausius-Mossotti parameter for cubic (1:1:1) and rectangular (1:1:0.5) geometries.
Figure 22:
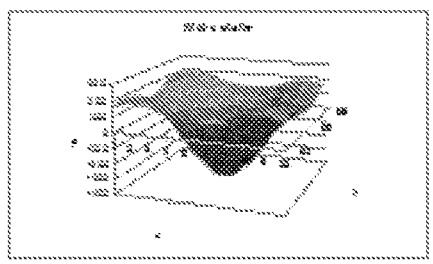
Figure 22:
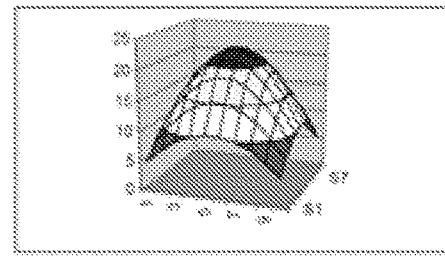
Figure 22:
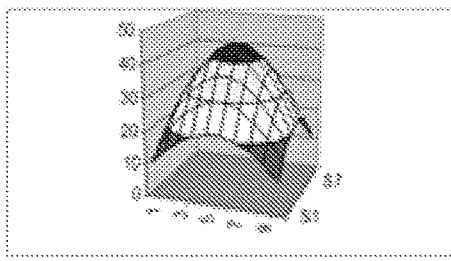

FIGS. 20-22 show results from the model developed as an extension to the classic Clausius-Mossotti (C-M) model. FIG. 20 shows the geometry of a system of interacting dipoles on a rectangular lattice and FIGS. 21 and 22 show results of specific calculations of the polarizability of the interacting system for various geometries as a function of the dimensionless parameter $N\alpha/\epsilon$. These results demonstrate that polarizability is enhanced in systems in which the interacting components are more densely packed in the direction of polarization and is diminished in systems in which the interacting components are more densely packed in the directions perpendicular to the direction of polarization.

Another aspect of the invention provides a solid state energy storage device comprising: (a) a first conductive electrode and a second conductive electrode; and (b) an active layer between the first and second conductive electrodes, the active layer having one or more quantum confinement species (QCS) arranged to at least partially cancel an applied electric field between the electrodes.

In some embodiments, the QCS are arranged such that they are electrically coupled together in a positive feedback. In some instances, the QCS act as electrical dipoles. Pairs of the QCS may act as electrical dipoles. In some embodiments, the coupled QCS are arranged on a substantially cubic lattice. In some embodiments, the coupled QCS are spaced closer together in the direction of the applied field than in directions perpendicular to the applied field so as to maximize positive C-M-type feedbacks and minimize negative C-M-type feedbacks.

In some cases, the number density of the QCS is chosen near a critical value of $3\epsilon_0/\alpha$. In some cases, the critical value is between 2.2 and 3.0. In some instances, the polarizability of the QCS is chosen near a critical value of $3\epsilon_0/N$. In some cases, the critical value is between 2.2 and 3.0. In some cases the number density and polarizability of the QCS is chosen near a critical value where the effective dielectric constant of the device is high. The effective dielectric constant is at least 100, at least 500, at least 1000, at least 5000, at least 10000, at least 50000, at least 100000, in various embodiments.

The QCS may be arranged such that electrical coupling in the direction of the applied field is much stronger than electrical coupling in the directions perpendicular to the applied field. In some cases, the number density and polarizability of the QCS is near a critical value where the effective dielectric constant of the device is high. The effective dielectric constant is at least 100, at least 500, at least 1000, at least 5000, at least 10000, at least 50000, at least 100000, in various embodiments.

QCS Geometries

The overall permittivity of the dielectric material when the embedded QCS (e.g., quantum dot, or QD) species are in the tunneling state can be calculated using the C-M equations that relate the polarizability of the individual tunneled QCS pairs, a, to the bulk permittivity, $\epsilon_2$. To allow access to the C-M type enhancements of $\epsilon_2$ it may be useful to produce QCS pairs with large values of $\alpha$. In the tunneled state the number of electrons transferred between the QCS pair can depend on the strength of the local field, which in turn may depend on the strength of the external field. The dipole induced in the tunneling QCS pair can scale as the number of electrons transferred times the distance over which they are transferred. The polarizability may therefore scale as the distance over which charges are separated in the tunneling state.

FIG. 23(a) shows a simple geometry of a pair of two spherical QCS's separated by a distance D. The polarizability of this system can be increased by increasing the distance between the QCS's, D. However, increasing this distance may suppress the rate of tunneling and there is a limit to how far the QCS's can be separated in this geometry and still tunnel charges.

To increase charge separation while not overly suppressing tunneling, QCS pairs with geometries shown in FIGS. 23(b), (c), (d) or (e) may be used. In these geometries the bulk of the QCS are separated by a distance D2 whereas tunneling can occur at the smaller distance D1. In the tunneled state the charge can preferentially reside in the regions of the QCS's separated by D2 whereas tunneling continues to occur over distance D1. In this way it is possible to enhance polarizability of the QCS pairs without overly suppressing tunneling.

In another aspect, described herein is a solid state energy storage device, comprising: (a) a first conductive electrode and second conductive electrode; and (b) an active layer between the first and second conductive electrodes, the active layer having one or more quantum confinement species (QCS) shaped to have a higher polarizability when compared to a spherical QCS.

In some embodiments, the QCS are elongated in the direction of the applied field. For example, the QCS have the shape of a tear drop, nanowire, rectangle, "T", tetrapod, or any combination thereof as shown in FIGS. 23(b-e).

In some cases, pairs of QCS are shaped to have a higher polarizability when compared to pairs of spherical QCS. The QCS can be shaped to promote charge transfer more effectively than spherical QCS. In some instances, the QCS are shaped to promote a longer distance charge separation when compared to spherical QCS.

Figure 23F:
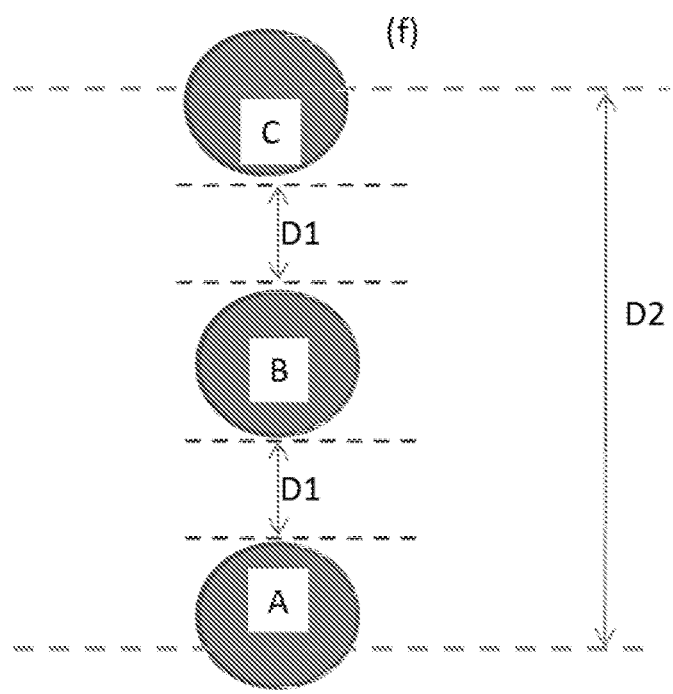
FIG. 23(f) shows another possible geometry that can be used to increase charge separation distance without substantially affecting tunneling FIG. 24(a-b) shows the tunneling distance, D1, is increased relative to the aligned pair tunneling distance D2 when the QDs are not aligned (a).

FIG. 23(f) shows a possible geometry that can be used to increase charge separation distance without substantially affecting tunneling. In the geometry in FIG. 23(f) three (or more) QDs are cascaded together. In such a case, charges can tunnel from a first QD into a second QD downstream from the first QD (along the direction of charge flow), and then into a third QD downstream from the second and third QD's. In the tunneling state electrons can tunnel from QD A to QD B over a tunneling distance D1 and electrons can tunnel from QD B to QD C over a tunneling distance D1. The charge separation in this geometry can be approximately D2.

Another aspect of the invention provides a solid state energy storage device comprising: (a) a first conductive electrode and second conductive electrode; and (b) an active layer between the first and second conductive electrodes, the active layer having one or more quantum confinement species (QCS) arranged in the active layer to increase charge separation without suppressing tunneling.

In some instances, at least about 3, 4, 5, 6, 7, 8, 9, 10, 50, 100, 200, 300, 400, 500, 1000, 10,000, 100,000, or 1,000,000 QCS are arranged in a cascade. In some embodiments, the QCS are off-set relative to each other. The distribution of QCS in the cascade can be such that the QCS's are nearly or substantially evenly spaced from one another.

In some cases, a conductive layer is disposed between at least two of the QCS. In general, the thickness of the conductive layer increases the charge separation without increasing the tunneling distance between the QCS.

The QCS can be manufactured and/or aligned in any suitable way. In some embodiments, the QCS are aligned relative to each other in the direction of an applied field by fabricating the QCS in a template with vertical pores. In some instances, the template is a lithographically defined membrane, a track etched polycarbonate membrane or an anodic alumina membrane.

Figure 24C:
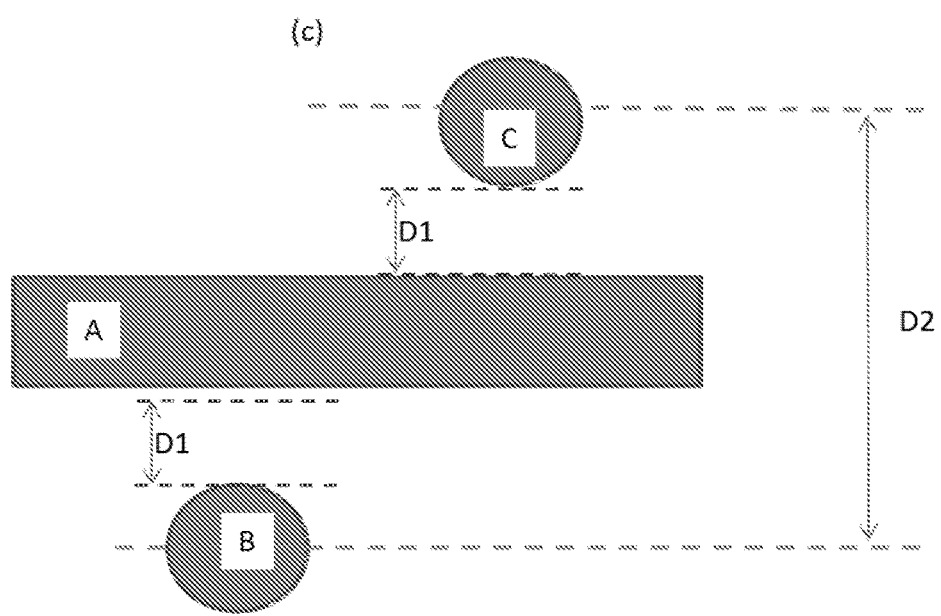
FIG. 24(c) shows a conducting layer, A, disposed between the QDs.

As shown in FIG. 24, if the QDs are not aligned (FIG. 24(a)) the tunneling distance, D1, is increased relative to the aligned pair tunneling distance D2 (FIG. 24(b)). In an example of the devices described herein, as shown in FIG. 24(c), a conducting layer, A, is disposed between the QDs. In this configuration in the tunneling state QD B may lose electrons to the conducting layer A (tunneling through distance D1) and QD C may gain electrons from the conducting layer (tunneling through distance D1). In this geometry the charge separation, D2, in the tunneled state can be increased by increasing the thickness of the conducting layer, A, without affecting the tunneling distance, D1. In addition, this geometry may help in minimizing breakdown. This geometry may aid in reducing manufacturing cost by obviating the requirement to vertically align QCS, enabling a random or self-assembled array of QCS.

Alignment of the QDs may also be achieved by fabricating the QDs in a template material with vertical pores such as anodic alumina or a polycarbonate track-etched membrane.

QD Materials

Various materials may be used for the QC's to enhance the polarizability of the tunneled electron pair species, including, without limitation, the materials described in published U.S. Patent Publication No. 2010/0183919, which is entirely incorporated herein by reference. Such materials may be used with devices and methods provided herein, alone or in combination.

Matrix Non-Linear Permittivity

In an example of the devices described herein, in the tunneling regime the overall permittivity of the dielectric material may have contributions from both the embedded species (tunneling QDs) and the matrix. In the tunneling regime, the QDs may be charged and generate high local fields, which can be experienced by the matrix in the vicinity of the QDs. In the non-tunneling regime (i.e., below $V_c$ in FIG. 3) it may be best to use a low ε matrix whereas in the tunneling regime (i.e., above $V_c+\delta$ in FIG. 3) use of a high ε matrix may add to the overall $\varepsilon_2$. Using a matrix material that has low ε at the low fields present in the non-tunneling regime and has high ε at the high fields present in the tunneling regime may help decrease $\varepsilon_1$ and increase $\varepsilon_2$.

Another aspect of the invention provides a solid state energy storage device comprising: (a) a first conductive electrode and second conductive electrode; and (b) an active layer between the first and second conductive electrodes, the active layer having one or more quantum confinement species (QCS) embedded in a matrix, wherein the matrix has a low permittivity in low electric fields and high permittivity in high electric fields.

In various embodiments, the matrix material is antiferroelectric or capable of being antiferroelectric. In some cases, the matrix material comprises $PbZrO_3$.

The applied electrical field at or near the critical voltage can be any suitable field. In some embodiments, the applied field is at least about 0.1 V/nm, about 0.3 V/nm, about 0.5 V/nm, about 0.7 V/nm, or about 1 V/nm.

In some cases, the permittivity of the matrix is low (e.g., $\varepsilon_1$) when the applied field is below $V_c$ (e.g., when less than 0.5 V/nm). In some embodiments, the permittivity is less than about 1000, less than about 500, less than about 100, less than about 50, less than about 20, less than about 10, less than about 5, or less than about 2 when the applied field is less than about 0.5 V/nm. As one skilled in the art will appreciate, $V_c$ will depend upon a number of factors including the tunneling barrier height, tunneling barrier permittivity and distance between the QDs. A straightforward calculation can determine $V_c$ for a given arrangement and materials choice.

In some cases, the permittivity of the matrix is high (e.g., $\varepsilon_2$) when the applied field is above Vc (e.g., when at least 0.5 V/nm). In some embodiments, the permittivity at least about 50, at least about 100, at least about 500, at least about 1000, at least about 5000, at least about 10000, at least about 50000, or at least about 100000, when the applied field is at least about 0.5 V/nm.

Permanent Dipole Moments

In some cases, using embedded species with permanent dipole moments may increase the value of $\varepsilon_2$. Another aspect of the invention provides a solid state energy storage device comprising: (a) a first conductive electrode and second conductive electrode; and (b) an active layer between the first and second conductive electrodes, the active layer having one or more quantum confinement species (QCS) embedded in a matrix, wherein the matrix further comprises inclusions which have a permanent dipole moment.

In some embodiments, the inclusions comprise ferroelectric material. In some cases, the QCS and/or inclusions comprise barium titanate, lead titanate, bismuth titanate, strontium bismuth tantalate, barium strontium titanate, zirconium titanate, lead zirconium titanate, or combinations thereof. These inclusions may be viewed as dopants used to provide a built-in permittivity. Especially in situations of C-M feedback between QCS or combinations of QCS, the inclusions may encourage C-M feedback at lower QCS density or polarizability.

Matrix with High Electron Effective Mass

Using a dielectric with high electron effective mass may improve the resistance of the dielectric to Fowler Nordheim (FN) tunneling, increase the maximum permissible electric field, and/or increase the energy density of the device.

The relative electron effective mass in the QD versus the dielectric may enter the equations for FN tunneling. The FN tunneling current J may have the form of Equation (5) as described in Lenzilinger and Snow, J. Appl. Phys. 40 (1969) 278, which is hereby incorporated by reference in its entirety.

$$J=(q^3E^2m/8\pi h\Phi m^*)[1/t^2(y)][\pi ckT/\sin(\pi ckT)]\exp\{-[4(2m^*)^{1/2}\Phi^{3/2}/3\hbar qE]v(y)\} \quad (5)$$

where m* is the effective mass of the electron in the dielectric.

Increasing the effective mass of the electron in the dielectric may reduce the tunneling current. In some embodiments, the dielectric material adjacent to the QD is one with a high electron effective mass. Examples of a material with a high effective mass (e.g., m*>0.1$m_0$ wherein '$m_0$' is the free electron mass) are available in the art (e.g., hafnia).

Another aspect of the invention provides a solid state energy storage device comprising: (a) a first conductive electrode and second conductive electrode; and (b) an active layer between the first and second conductive electrodes, the active layer having one or more quantum confinement species (QCS) embedded in a matrix, wherein the matrix comprises a material having a high electron effective mass. In some embodiments, the active layer of high electron effective mass is adjacent to at least one QCS.

The electron effective mass can be any suitably high value. In some embodiments, the electron effective mass is about 0.01 times, about 0.05 times, about 0.1 times, about 0.5 times, about 1 times, or about 5 times the free electron mass. In some embodiments, the electron effective mass is greater than about 0.01 times, greater than about 0.05 times, greater than about 0.1 times, greater than about 0.5 times, greater than about 1 times, or greater than about 5 times the free electron mass.

Another aspect of the invention provides a solid state energy storage device comprising: a first electrode and a second electrode, and an active layer between the first and second electrodes. The active layer comprises one or more quantum confinement species (QCS). In some cases, the device further comprises a tunnel barrier layer between the active layer and the first electrode or the second electrode.

In some embodiments, the device includes one or more intermediate layers between the tunnel barrier layer and the first electrode or the second electrode. The permittivity of the tunnel barrier layer is lower than the permittivity of an individual intermediate layer of the one or more intermediate layers, and the breakdown voltage of the tunnel barrier layer is higher than the breakdown voltage of the individual intermediate layer.

In some embodiments, the device includes a plurality of intermediate layers between the active layer and the first electrode or second electrode. Leading from the first or second electrode to the active layer, the intermediate layers are ordered in order of increasing permittivity and decreasing breakdown voltage.

In some embodiments, the tunnel barrier comprises $SiO_2$. The intermediate layers may comprise lead zirconate titanate (PZT), barium strontium titanate (BST), $BaTiO_3$, $TiO_2$, $Pr_2O_3$, $HfO_2$, $Al_2O_3$, $Si_3N_4$, or any combination thereof, which may be arranged with the layers having a permittivity that decreases as the distance from the QCS increases.

In some embodiments, at least one conductive layer is disposed between at least two QCS. At least one layer of low bandgap can be disposed between at least two QCS to promote tunneling.

In some cases, the QCS comprise a conducting material with a low work function (e.g., Al, Si, Ti, or combinations thereof). In some cases, the QCS comprise at least one donor QCS. The donor QCS may comprise a conducting material with a high work function (e.g., Pt, InSb, Pb, Bi, or any combination thereof). In some cases, the conducting material has a work function of at least about 4 eV, 4.5 eV, 5 eV, 6 eV, or 7 eV.

In some cases, the device comprises at least two repeat units, where each repeat unit comprises at least one active layer, at least one tunnel barrier layer and at least one intermediate layer.

Figure 27:
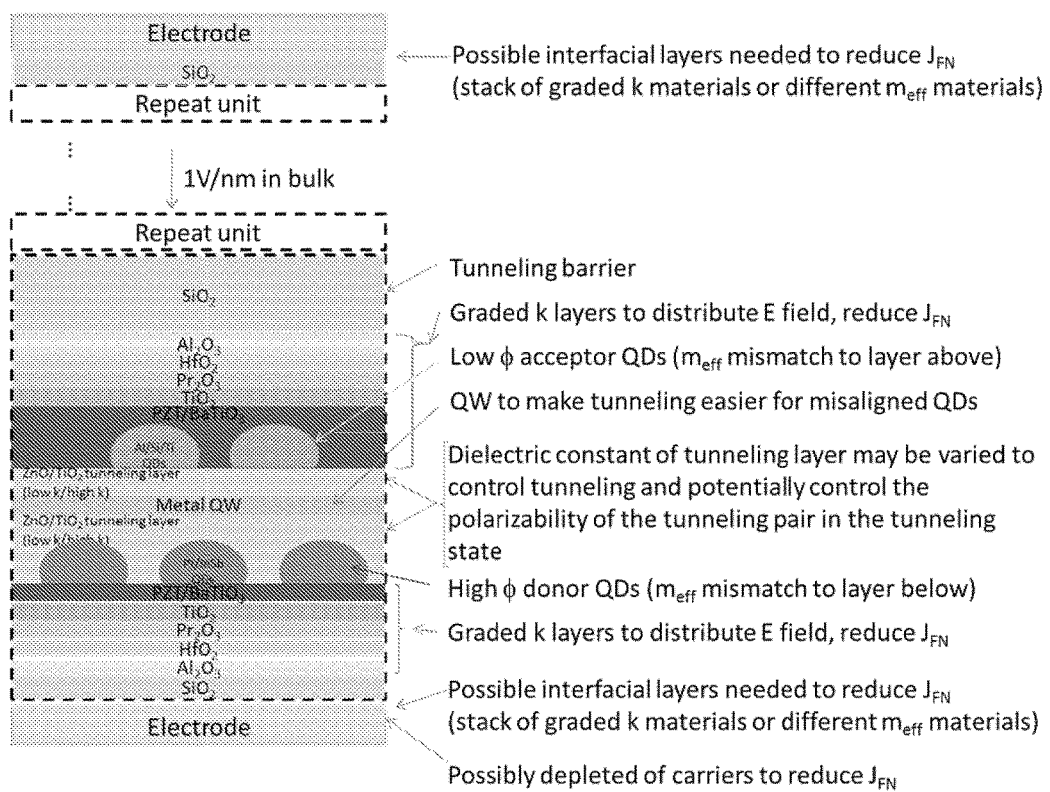
FIG. 27 schematically illustrates an exemplary solid state energy storage device.

An exemplary device is shown in FIG. 27. The device includes, in sequence, a first electrode, optional repeat units, and a stack having an $SiO_2$ tunneling barrier layer, $Al_2O_3$ layer, $HfO_2$ layer, $Pr_2O_3$ layer, $TiO_2$ layer, $PZT/BaTiO_3$ layer, first $ZnO/TiO_2$ tunneling layer, metal quantum well layer, second $ZnO/TiO_2$ tunneling layer, $PZT/BaTiO_3$ layer, $TiO_2$ layer, $Pr_2O_3$ layer, $HfO_2$ layer, $Al_2O_3$ layer, $SiO_2$ layer, and a second electrode. The optional repeat units may include additional stacks. The first $ZnO/TiO_2$ tunneling layer includes QCS having Al/Si/Ti quantum dots. The second $ZnO/TiO_2$ tunneling layer includes QCS having Pt/InSb quantum dots. The device may include one or more additional layers between each of the layers shown in the figure.

The device of FIG. 27 has QCS that comprise quantum dots (tunneling species), and the quantum well layer between the quantum dots may be optional. The device includes donor and acceptor quantum dots. The donor and acceptor quantum dots may have different work functions, $\phi$, and different carrier effective mass, $m_{eff}$, than the adjacent layers. The QCS are disposed in active layers of the device. The active layers comprise a matrix having PZT and $BaTiO_3$. The active layers are separated by a metal QW layer. The device includes a dielectric matrix of $SiO_2$ (labeled as "tunneling barrier) and a tunneling layer between the quantum dots, the dielectric constant of which may be varied to control the tunneling and potentially control the polarizability of the QD pair in the tunneling state. In some cases, the tunneling barrier (or tunnel barrier) minimizes or prevents tunneling through the barrier. A non-limiting example of a material that may be used for a low dielectric constant tunneling layer is ZnO and a non-limiting example of a material that may be used for a high dielectric constant tunneling layer is $TiO_2$. Other materials may also be used. The device of FIG. 27 also shows a non-limiting example of a graded permittivity capping layer, varying between higher permittivity $PZT/BaTiO_3$ and lower permittivity $Al_2O_3$. Different combinations of capping layer materials may also be used. In FIG. 27, $J_{FN}$ refers to Fowler-Norheim tunneling.

In the device of FIG. 27, the tunnel barrier layer ($SiO_2$) has a higher breakdown voltage that each individual intermediate layer that is disposed between the tunnel barrier layer and an active layer comprising acceptor or donor QD's. The tunnel barrier layer may have a lower permittivity than the individual intermediate layers. The intermediate layers (i.e., $Al_2O_3$, $HfO_2$, $Pr_2O_3$, $TiO_2$) are provided (or ordered) in order of increasing permittivity and decreasing breakdown voltage leading from the tunneling barrier layer to the active layer comprising donor or acceptor QD's. For example, the $TiO_2$ layer has a lower breakdown voltage but higher permittivity than the $Al_2O_3$ layer.

The device of FIG. 27 includes a device structure comprising the illustrated layers. In some instances, the structure can be repeated several times to provide an energy storage device having a stack of repeat units. For instance, the stack of FIG. 27 (tunneling barrier layer, intermediate layers, active layers, etc.) can be repeated at least 2, 3, 4, 5, 6, 7, 8, 9, 10, 20, 30, 40, 50, 100, 200, 300, 400, 500, 1000, or 10,000 times.

The device may include one or more active layers. In some cases the device includes a plurality of active layers, each having one or more QCS. In some implementations, the device includes a first active layer having donor QCS and a second active layer having acceptor QCS. The first active layer can be adjacent to the second active layer, or separated from the active layer by one or more intermediate layers, such as, for example, a tunneling layer and/or quantum well layer.

Methods for Using Solid State Energy Storage Devices

Solid state energy storage devices of embodiments of the invention can be used in various applications. In an embodiment, applications of devices provided herein include energy storage for electric vehicles or hybrid vehicles, portable electronics devices (e.g., laptop, cell phone), troop gear and weapons. In another embodiment, solid state energy storage devices can be employed for use in electric vehicle or plug-in hybrid electric vehicles. Advantages of solid state energy storage devices of embodiments of the invention include, without limitation, high energy storage density, high power storage density, fast charge/discharge rate, and low degradation over time because there are no chemical reactions. Further advantages include no moving atoms/ions, and no risk of catastrophic, unsafe failure.

In an embodiment, solid state energy storage devices are provided for use in electric vehicles. In an embodiment, solid state energy storage devices are provided for use in gas-electric vehicles. In another embodiment, solid state energy storage devices are provided for use in hybrid electric vehicles, such as plug-in hybrid electric vehicles. In another embodiment, solid state energy storage devices are provided for use in electric or hybrid electric boats. In another embodiment, solid state energy storage devices are provided for use in electric or hybrid electric planes. In another embodiment, solid state energy storage devices are provided for use in electric or hybrid electric scooters. In another embodiment, solid state energy storage devices are provided for use in electric or hybrid electric motorcycles. In another embodiment, solid state energy storage devices are provided for use in electric or hybrid electric buses. In another embodiment, solid state energy storage devices are provided for use in electric or hybrid electric tractors. In another embodiment, solid state energy storage devices are provided for use in electric or hybrid electric taxicabs or town cars. In another embodiment, solid state energy storage devices are provided for use in electric or hybrid electric robots.

In an embodiment, a grid system for energy storage and distribution is provided, the grid system comprising one or more energy storage devices, such as any of the devices described herein. In another embodiment, a grid system for energy storage and distribution comprises an array of energy storage devices, such as any of the devices described herein. The array can comprises a plurality of solid state energy storage devices connected in parallel or series. In an embodiment, the array includes a plurality of solid state energy storage devices connected in series. In another embodiment, the array includes a plurality of solid state energy storage devices connected in parallel.

In an embodiment, a grid system for energy distribution is provided, the grid system comprising one or more energy storage devices, each of the one or more energy storage devices comprises an active layer having one or more quantum confinement species (QCS), the active layer formed of a material configured to permit the flow of charge to and from the QCS. In another embodiment, a grid system for energy distribution can comprise an array of energy storage devices, each of the energy storage devices in the array comprising an active layer having one or more QCS.

In an embodiment, an automotive vehicle is provided having an engine powered by one or more solid state energy storage devices as described herein. In another embodiment, an electric vehicle is provided having an engine powered by one or more solid state energy storage devices. In another embodiment, a hybrid electric (also "hybrid" herein) vehicle is provided having an engine powered by one or more solid state energy storage devices. In another embodiment, an electric or hybrid motorcycle or scooter is provided having an engine powered by one or more solid state energy storage devices. In another embodiment, an electric or hybrid plane (e.g., commercial passenger plane, cargo plane, jet) is provided having an engine powered by one or more solid state energy storage devices. In another embodiment, an electric or hybrid boat is provided having an engine powered by one or more solid state energy storage devices. In another embodiment, an electric or hybrid robot is provided having one or more of a motor and actuator powered by one or more solid state energy storage devices.

In an embodiment, a vehicle having an engine powered by one or more energy storage devices is provided, each of the one or more energy storage devices comprising an active layer having one or more quantum confinement species (QCS). The active layer can be formed of a material configured to permit the flow of charge to and from the QCS. In another embodiment, a vehicle having an engine powered by an array of energy storage devices is provided, each of the energy storage devices in the array comprising an active layer having one or more QCS.

In an embodiment, a power supply is provided having one or more solid state energy storage devices, such as solid state energy storage devices provided herein. In another embodiment, a portable power supply (e.g., uninterruptable power supply) is provided having one or more solid state energy storage devices. In another embodiment, a permanent, semi-permanent or substantially permanent power supply is provided having one or more solid state energy storage devices.

In another embodiment, a hybrid electric vehicle is provided having an engine powered by one or more energy storage devices. In another embodiment, a hybrid electric vehicle is provided having an engine powered by one or more energy storage devices.

In an embodiment, an automotive device is provided having an engine that is exclusively powered by one or more energy storage devices as described herein. In another embodiment, an automotive device is provided having an engine that is exclusively powered by a solid state energy storage device having an active material comprising one or more quantum confinement species (QCS).

In an embodiment, an automotive device or vehicle is provided having a solid state energy storage device, wherein the automotive device has a range (per single charge) of 25 miles or more, or 50 miles or more, or 75 miles or more, or 100 miles or more, or 150 miles or more, or 200 miles or more, or 250 miles or more, or 300 miles or more, or 350 miles or more, or 400 miles or more, or 450 miles or more, or 500 miles or more. In another embodiment, a vehicle is provided having a solid state energy storage device, wherein the vehicle has a range of 25 miles or more, or 50 miles or more, or 75 miles or more, or 100 miles or more, or 150 miles or more, or 200 miles or more, or 250 miles or more, or 300 miles or more, or 350 miles or more, or 400 miles or more, or 450 miles or more, or 500 miles or more. In another embodiment, a bus is provided having a solid state energy storage device, wherein the bus has a range of 25 miles or more, or 50 miles or more, or 75 miles or more, or 100 miles or more, or 150 miles or more, or 200 miles or more, or 250 miles or more, or 300 miles or more, or 350 miles or more, or 400 miles or more, or 450 miles or more, or 500 miles or more. In another embodiment, an airplane is provided having a solid state energy storage device, wherein the airplane has a range of 25 miles or more, or 50 miles or more, or 75 miles or more, or 100 miles or more, or 150 miles or more, or 200 miles or more, or 250 miles or more, or 300 miles or more, or 350 miles or more, or 400 miles or more, or 450 miles or more, or 500 miles or more. In another embodiment, a motorcycle or scooter is provided having a solid state energy storage device, wherein the motorcycle or scooter has a range of 25 miles or more, or 50 miles or more, or 75 miles or more, or 100 miles or more, or 150 miles or more, or 200 miles or more, or 250 miles or more, or 300 miles or more, or 350 miles or more, or 400 miles or more, or 450 miles or more, or 500 miles or more.

In an embodiment, a portable device (e.g., portable electronic device, portable hybrid electric device) is provided comprising a solid state energy storage device. In another embodiment, a portable device is provided comprising a solid state energy storage device having an active material comprising one or more QCS. In another embodiment, a portable telephone (also "phone" herein) includes a solid state energy storage device, such as a solid state energy storage devices provided herein. In another embodiment, a portable computer (also "laptop" herein) includes a solid state energy storage device, such as a solid state energy storage device provided herein. In another embodiment, a tablet personal computer (PC) or slate includes a solid state energy storage device, such as a solid state energy storage device provided herein. In another embodiment, a portable electronic device, such as a portable phone, portable computer or tablet PC, or slate, includes a solid state energy storage device having an active material comprising one or more QCS.

Solid state energy storage devices for use with portable electronic devices can be configured to provide power to various electronics components of such portable electronic devices. For example, solid state energy storage devices can provide exclusive power (i.e., excluding other sources of electricity) to power portable electronic devices.

In an embodiment, a portable device having a solid state energy storage device, such as a QCS-containing solid state energy storage device provided herein, is provided, the portable device selected from a portable phone, a handheld television, a portable DVD player, a portable computer, a portable personal computer (PC) (e.g., MacBook Air), a tablet (e.g., Apple iPad) or reading tablet (e.g., Amazon Kindle), a slate, a handheld camera, a handheld game console (e.g., Sony PSP), a portable music player, a handheld electronic game and a netbook.

In an embodiment, a medical or biomedical device is provided comprising one or more solid state energy storage devices, as described herein. In another embodiment, a medical device is provided comprising a solid state energy storage device, as described herein. A medical device can include an anesthesia unit, anesthesia ventilator, apnea monitor, argon enhanced coagulation unit, aspirator, auto transfusion units, cardiac defibrillator (external or internal), electrosurgical unit, external pacemaker, fetal monitor, heart-lung machine, incubator, infusion pump, invasive blood pressure unit, pulse oximeter, radiation-therapy machine ventilator, ECG, EEG, treadmill, ultrasound sensor, phototherapy unit, endoscope, human-implantable RFID chip, Surgical drill and saw, laparoscopic insufflator, Phonocardiograph, radiant warmer (adult), electronic thermometer, breast pump, Surgical microscope, ultrasonic nebulizer, sphygmomanometer, surgical table, surgical light, temperature monitor, aspirator, X-ray diagnostic equipment, lensometer, keratometer, or lifeGuard30. In another embodiment, a biomedical device is provided comprising a solid state energy storage device, as provided herein.

Charging Devices

In another aspect of the invention, charging devices are provided for charging (or providing energy to) solid state energy storage devices. In an embodiment, charging devices can be charging stations.

In an embodiment, a charging station is provided for charging solid state energy devices. In another embodiment, a charging station is provided for charging solid state energy devices via inductively-coupled charging of the devices.

In an embodiment, a charging station for charging a solid state energy storage device is provided. The charging station can include an inductive coupling member for inductively coupling to a circuit element, the circuit element connected to the solid state energy storage device, the solid state energy storage device comprising one or more quantum confinement species (QCS).

In an embodiment, a charging station is provided for charging a solid state energy storage device at a charge rate of at least about 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s. In another embodiment, a charging station is provided for charging a solid state energy storage device having quantum confinement species (QCS) at a charge rate of at least about 10 V/s, or 20 V/s, or 30 V/s, or 40 V/s, or 50 V/s, or 60 V/s, or 70 V/s, or 80 V/s, or 90 V/s, or 100 V/s, or 200 V/s, or 300 V/s, or 400 V/s, or 500 V/s, or 1000 V/s. In another embodiment, the charging station can include an algorithm to charge the solid state energy device based on a series of voltage pulses. In another embodiment, the charging station can include an algorithm to charge the solid state energy device with a series of current pulses. In another embodiment, the charging station can include an algorithm to charge the solid state energy device with a series of voltage and current pulses.

In an embodiment, the solid state energy storage device can act as a charging station for charging electric vehicles, gas-electric vehicles, hybrid electric vehicles, portable electronics, computers, energy storage devices, electricity grids, medical devices and biomedical devices.

In an embodiment, a solid state energy storage device is provided configured to be charged with the aid of a charging device. In another embodiment, a solid state energy storage device is provided configured to be charged with the aid of an inductive-coupled charging device.

In an embodiment, a charging station for a solid state energy storage device is provided in which the charging station is aboard a vehicle having the solid state energy storage device, wherein the solid state energy storage device is charged by driving the vehicle over an inductive coupling mat or pad. In another embodiment, a charging station is provided aboard a vehicle having a solid state energy storage device, and the solid state energy storage device is charged by positioning the vehicle atop one or more of a mat, pad, disk, and plate configured to inductively couple to the charging station. Inductive coupling can be achieved with the aid of a magnetic field (i.e., electromagnetic induction).

In various embodiments, a charging station is provided for charging a solid state energy storage device. In an embodiment, the solid state energy storage device is charged without the use of a cable. In another embodiment, the solid state energy storage device is charged by inductive coupling to a charging station in electrical communication (e.g., through one or more wires or electrical contacts) with the solid state energy storage device. In another embodiment, the solid state energy storage device is charged with the aid of a battery in electrical communication with the solid state energy storage device, the battery comprising one or more of a solid state energy storage device and an electrochemical battery (e.g., lithium ion battery, NiCd battery). In another embodiment, the solid state energy storage device is charged with the aid of a gas motor (and alternator) in electrical communication with the solid state energy storage device.

In an embodiment, a charging station for charging a solid state energy storage device aboard a vehicle is provided. The charging station can include an inductive coupling mat or pad that is configured to provide energy to the solid state energy storage device when the vehicle passes over or near the pad or mat.

In an embodiment, a charging station is provided, comprising a solid state energy storage device having one or more quantum confinement species (QCS). The charging station is configured to charge an energy storage device having an active layer comprising one or more QCS.

In an embodiment, a battery comprising a solid state energy storage device is provided, the battery comprising an active layer having one or more quantum confinement species. The active layer can be formed of a non-dielectric material. The battery can have a discharge rate of at least about 100 V/s.

Encapsulated Solid State Energy Storage Devices

In another aspect of the invention, an encapsulated solid state energy storage device is provided, comprising one or more solid state energy storage devices that are encapsulated by (or enclosed in) a chamber. The one or more solid state energy storage devices can include any solid state energy storage device provided herein. In an embodiment, the one or more solid state energy storage devices each include a solid state energy storage device including an active layer having one or more quantum confinement species (QCS). Such encapsulated energy storage devices can have various applications, such as energy storage in vehicles, grid systems and portable electronics devices.

In an embodiment, the chamber can be formed of a metallic material, such as stainless steel, aluminum, titanium, or other structural materials. In another embodiment, the chamber can be formed of a polymeric material.

In some embodiments, a solid state energy storage device is provided, the solid state energy storage device comprising an energy storage component (also "solid state energy storage component" here), the energy storage component including an active layer having one or more QCS. The solid state energy storage component can be selected from solid state energy storage devices discussed in the context of other embodiments of the invention. The solid state energy storage device further includes a chamber encapsulating the energy storage component, wherein the chamber comprises a medium that reduces energy dissipation. Energy dissipation can be due to short circuits in the energy storage component, for example.

In an embodiment, the medium forms a vacuum around the energy storage component. In another embodiment, the medium comprises a fluid around the energy storage component. In another embodiment, the medium comprises an oil, such as a silicone oil. In another embodiment, the medium comprises a dielectric material. In another embodiment, the medium reduces current on the surface of the energy storage component.

In an embodiment, the energy storage device further comprises a controller to stabilize the rate of charging the energy storage component. In another embodiment, the solid state energy storage device further comprises a controller to stabilize the rate of charging the energy storage component and a transformer linked to the controller.

In an embodiment, the energy storage component has an energy storage density of at least about 150 Whr/kg, or 200 Whr/kg, or 250 Whr/kg, or 300 Whr/kg, or 500 Whr/kg, or 1000 Whr/kg. In another embodiment, the energy storage component has a power storage density of at least about 150 W/kg, or 200 W/kg, or 250 W/kg, or 300 W/kg, or 500 W/kg, or 1000 W/kg.

In an embodiment, charge transfer in the solid state energy storage component involves built-in polarization, wherein a charge is displaced by at least the length of a lattice constant of the active layer. In another embodiment, charge transfer in the solid state energy storage component involves quantum mechanical tunneling to and from the one or more QCS.

In an embodiment, the energy storage component comprises electrical circuitry for inductively-coupled charging of the energy storage component. In another embodiment, the solid state energy storage device further comprises a cable-free charging member for charging the energy storage component. Such cable-free charging member can provide for charging via inductive coupling, for example.

In an embodiment, an encapsulated energy storage device is provided for use in a grid system. In another embodiment, an encapsulated energy storage device having an array of energy storage devices is provided. In another embodiment, an automotive vehicle is provided having an engine powered by one or more encapsulated energy storage devices. The engine can be exclusively powered by the one or more encapsulated energy storage devices.

In an embodiment, a vehicle having one or more encapsulated energy storage devices can have a range of about 200 miles or more, or 250 miles or more, or 300 miles or more, or 350 miles or more, or 400 miles or more, or 450 miles or more, or 500 miles or more. In another embodiment, a vehicle having one or more encapsulated energy storage devices can have a range of about 200 miles or more, or 250 miles or more, or 300 miles or more, the encapsulated energy storage device having a mass of about 100 kg or less, or 150 kg or less, or 200 kg or less, or 250 kg or less, or 300 kg or less, or 350 kg or less, or 400 kg or less, or 450 kg or less, or 500 kg or less, or 550 kg or less, or 600 kg or less, or 650 kg or less, or 700 kg or less, or 750 kg or less, or 800 kg or less, or 850 kg or less, or 900 kg or less, or 950 kg or less, or 1000 kg or less. In another embodiment, an encapsulated solid state energy storage device can have a mass of at most about 100 kg, or 150 kg, or 200 kg, or 250 kg, or 300 kg, or 350 kg, or 400 kg, or 450 kg, or 500 kg, or 550 kg, or 600 kg, or 650 kg, or 700 kg, or 750 kg, or 800 kg, or 850 kg, or 900 kg, or 950 kg, or 1000 kg.

In an embodiment, a portable electronic device is provided having an encapsulated solid state energy storage device. In another embodiment, a portable computer is provided having an encapsulated solid state energy storage device. In another embodiment, a portable electronic device is provided having an encapsulated solid state energy storage device. In another embodiment, a portable telephone is provided having an encapsulated solid state energy storage device. In another embodiment, a motorcycle is provided having an encapsulated solid state energy storage device. In another embodiment, a robot is provided having an encapsulated solid state energy storage device. In another embodiment, an airplane is provided having an encapsulated solid state energy storage device. In another embodiment, a helicopter is provided having an encapsulated solid state energy storage device. In another embodiment, a Smartphone is provided having an encapsulated solid state energy storage device. In another embodiment, a portable personal computer ("PC"), such as a laptop or tablet PC, is provided having an encapsulated solid state energy storage device. In another embodiment, a medical device is provided having an encapsulated solid state energy storage device. In another embodiment, a biomedical device is provided having an encapsulated solid state energy storage device.

In an embodiment, an encapsulated solid state energy storage device is provided having an energy storage capacity, after 5,000 charge/discharge cycles, of at least about 75% of the maximum energy storage capacity. In another embodiment, an encapsulated solid state energy storage device is provided having an energy storage capacity, after 10,000 charge/discharge cycles, of at least about 75% of the maximum energy storage capacity. In another embodiment, an encapsulated solid state energy storage device is provided having an energy storage capacity, after 5,000 charge/discharge cycles, of at least about 75%, or 80%, or 85%, or 90%, or 95%, or 99% of maximum energy storage capacity.

In another embodiment, an encapsulated solid state energy storage device is provided having an energy storage capacity, after 10,000 charge/discharge cycles, of at least about 75%, or 80%, or 85%, or 90%, or 95%, or 99% of maximum energy storage capacity.

Solid state energy storage devices, systems, apparatuses and methods provided herein may be combined with or modified by other devices, systems, apparatuses and methods, such as, for example, one or more devices disclosed in U.S. Patent Publication No. 2010/0183919 to Holme et al. ("QUANTUM DOT ULTRACAPACITOR AND ELECTRON BATTERY"), U.S. Patent Publication No. 2010/0190323 to Holme et al. ("MODIFYING CATALYTIC BEHAVIOR OF NANOCRYSTALS"), U.S. patent application Ser. No. 12/798,102 to Holme et al. ("ALL-ELECTRON BATTERY HAVING AREA-ENHANCED ELECTRODES"), U.S. patent application Ser. No. 12/657,198 to Holme et al. ("QUANTUM DOT ULTRACAPACITOR AND ELECTRON BATTERY"), U.S. patent application Ser. No. 12/657,580 to Holme et al. ("MODIFYING CATALYTIC BEHAVIOR OF NANOCRYSTALS"), WO/2010/083055 to Holme et al. ("QUANTUM DOT ULTRACAPACITOR AND ELECTRON BATTERY") and WO/2010/085356 to Holme et al. ("MODIFYING CATALYTIC BEHAVIOR OF NANOCRYSTALS"), which are entirely incorporated herein by reference.

While preferable embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention. It is intended that the following claims define the scope of the invention and that methods and structures within the scope of these claims and their equivalents be covered thereby.

What is claimed is:

1. A solid state energy storage device, comprising:
    a first conductive electrode and second conductive electrode; and
        a first active layer between the first and second conductive electrodes, a second active layer between the first and second conductive electrodes,
        wherein the active layers each have a permittivity that varies non-linearly with voltage, wherein the active layers each comprise one or more quantum confinement species (QCS);
        an insulating layer about 1 nm to 25 nm in thickness between and in contact with the first and second active layers;
        an insulating layer having a graded permittivity between and in contact with the first conductive electrode and the first active layer; and
        an insulating layer having a graded permittivity between and in contact with the second conductive electrode and the second active layer.

2. The device of claim 1, wherein the QCS comprise quantum dots, quantum particles, quantum wells, quantum wires, nanocrystals, nanoparticles, nanostructures, nanowires, nanofibers, bulk material, or any combination thereof.

3. The device of claim 1, wherein the QCS have a diameter less than about 20 nanometers.

4. The device of claim 1, wherein the device has an effective breakdown strength of at least about 0.9 V/nm, and wherein said QCS are embedded in said active layers.

5. The device of claim 4, wherein the active layers comprise titanium oxide, lithium oxide, lithium fluoride, silicon oxide, silicon nitride, silicon oxynitride, magnesium oxide, praseodymium oxide, aluminum oxide, diamond, hafnium oxide, or any combination thereof.

6. The device of claim 1, wherein the active layers have a first permittivity ($\varepsilon_1$) which changes to a second permittivity ($\varepsilon_2$) at the critical voltage.

7. The device of claim 6, wherein ($\varepsilon_1$) is less than about 20 and wherein ($\varepsilon_2$) is greater than about 50.

8. A solid state energy storage device, comprising:
    a first conductive electrode and second conductive electrode; and
    a first active layer between the first and second conductive electrodes,
    a second active layer between the first and second conductive electrodes,
    wherein the active layers each comprise one or more quantum confinement species (QCS) in a matrix, wherein the breakdown field ($E_{max}$) of the device is at least about 0.9 V/nm, wherein the active layers each have a permittivity that varies non-linearly with voltage;
    an insulating layer about 1 nm to 25 nm in thickness between and in contact with the first and second active layers;
    an insulating layer having a graded permittivity between and in contact with the first conductive electrode and the first active layer; and
    an insulating layer having a graded permittivity between and in contact with the second conductive electrode and the second active layer.

9. A solid state energy storage device, comprising:
    a first conductive electrode and second conductive electrode; and
    a first active layer between the first and second conductive electrodes,
    a second active layer between the first and second conductive electrodes,
    wherein the active layers each comprise one or more quantum confinement species (QCS) in a matrix;
    an insulating layer about 1 nm to 25 nm in thickness between and in contact with the first and second active layers;
    an insulating layer having a graded permittivity between and in contact with the first conductive electrode and the first active layer; and
    an insulating layer having a graded permittivity between and in contact with the second conductive electrode and the second active layer;
    wherein said solid state energy storage device has an electric field strength greater than about 0.5 V/nm in an area less than about 1 $\mu m^2$.

10. The device of claim 9, wherein the device has a field strength greater than about 2 V/nm only in areas less than about 100 $nm^2$.

11. The device of claim 9, wherein the QCS are shaped so as to have a high separation of the tunneled charges and a low distance between QCS.

* * * * *